(12) United States Patent
Choi et al.

(10) Patent No.: US 12,286,446 B2
(45) Date of Patent: *Apr. 29, 2025

(54) ORGANOMETALLIC COMPOUND, ORGANIC LIGHT- EMITTING DEVICE INCLUDING THE SAME, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Jongwon Choi, Yongin-si (KR); Yongsuk Cho, Hwaseong-si (KR); Yoonhyun Kwak, Seoul (KR); Hyun Koo, Seongnam-si (KR); Ohyun Kwon, Seoul (KR); Soyeon Kim, Seoul (KR); Sukekazu Aratani, Hwaseong-si (KR); Jiyoun Lee, Anyang-si (KR); Kyuhyun Im, Seongnam-si (KR); Dmitry Kravchuk, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 849 days.

This patent is subject to a terminal disclaimer.

(21) Appl. No.: 16/559,056

(22) Filed: Sep. 3, 2019

(65) Prior Publication Data
US 2020/0071346 A1   Mar. 5, 2020

(30) Foreign Application Priority Data

Sep. 5, 2018 (KR) .................. 10-2018-0106188
Sep. 3, 2019 (KR) .................. 10-2019-0108601

(51) Int. Cl.
*C07F 15/00* (2006.01)
*H10K 50/11* (2023.01)
(Continued)

(52) U.S. Cl.
CPC .......... *C07F 15/0033* (2013.01); *H10K 50/11* (2023.02); *H10K 50/15* (2023.02);
(Continued)

(58) Field of Classification Search
None
See application file for complete search history.

(56) References Cited

U.S. PATENT DOCUMENTS 6,465,115 B2  10/2002  Shi et al.
6,596,415 B2   7/2003  Shi et al.
(Continued)

FOREIGN PATENT DOCUMENTS

CN   101076902 A   11/2007
CN   103159798 A    6/2013
(Continued)

OTHER PUBLICATIONS

Cheuk-Lam Ho et al. "Red to near-infrared organometallic phosphorescent dyes for OLED applications" J. Organometallic Chem. 2014, vol. 751, p. 261-285 (Year: 2014).*

(Continued)

*Primary Examiner* — Seokmin Jeon
(74) *Attorney, Agent, or Firm* — CANTOR COLBURN LLP

(57) ABSTRACT

An organometallic compound represented by Formula 1, an organic light-emitting device including the same, and a
(Continued)

diagnostic composition including the organometallic compound:

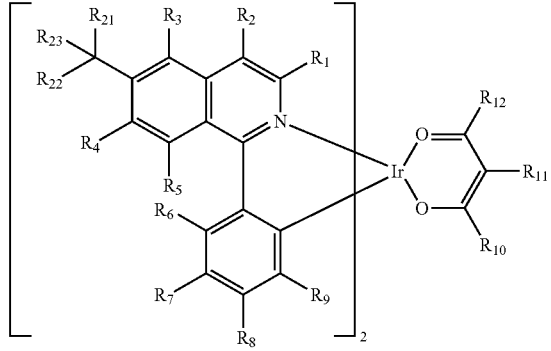

Formula 1 wherein, Formula 1, $R_1$ to $R_{12}$ and $R_{21}$ to $R_{23}$ are each independently the same as described in the detailed description of the specification.

17 Claims, 1 Drawing Sheet

(51) Int. Cl.
| | |
|---|---|
| *H10K 50/15* | (2023.01) |
| *H10K 50/16* | (2023.01) |
| *H10K 50/17* | (2023.01) |
| *H10K 50/81* | (2023.01) |
| *H10K 50/82* | (2023.01) |
| *H10K 85/30* | (2023.01) |
| *H10K 85/60* | (2023.01) |

(52) U.S. Cl.
CPC ........... *H10K 50/16* (2023.02); *H10K 50/171* (2023.02); *H10K 50/81* (2023.02); *H10K 50/82* (2023.02); *H10K 85/342* (2023.02); *H10K 85/649* (2023.02)

(56) References Cited

U.S. PATENT DOCUMENTS

| | | | |
|---|---|---|---|
| 8,330,153 B2 | 12/2012 | Ooishi et al. | |
| 8,431,243 B2 | 4/2013 | Kwong et al. | |
| 8,481,175 B2 | 7/2013 | Ooishi et al. | |
| 8,603,645 B2 | 12/2013 | Kwong et al. | |
| 9,034,483 B2 | 5/2015 | Alleyne et al. | |
| 9,130,177 B2 | 9/2015 | Ma et al. | |
| 9,512,355 B2 | 12/2016 | Ma et al. | |
| 11,459,348 B2 * | 10/2022 | Kwak ................. | C07F 15/0033 |
| 11,827,648 B2 * | 11/2023 | Kwak ................. | C07F 15/0033 |
| 12,101,994 B2 * | 9/2024 | Lee ..................... | H10K 85/342 |
| 2001/0019782 A1 | 9/2001 | Igarashi et al. | |
| 2006/0008671 A1 * | 1/2006 | Kwong ......................... | 428/690 |
| 2007/0034863 A1 * | 2/2007 | Fortte ........................... | 257/40 |
| 2008/0194853 A1 | 8/2008 | Kim et al. | |
| 2008/0261076 A1 * | 10/2008 | Kwong ......................... | 428/690 |
| 2009/0115323 A1 | 5/2009 | Ooishi et al. | |
| 2010/0090591 A1 | 4/2010 | Alleyne et al. | |
| 2011/0175072 A1 | 7/2011 | Ooishi et al. | |
| 2013/0146848 A1 * | 6/2013 | Ma ................................ | 257/40 |
| 2015/0001472 A1 | 1/2015 | Boudreault et al. | |
| 2015/0115250 A1 * | 4/2015 | Ma .................... | H01L 51/5024 |
| 2015/0171348 A1 * | 6/2015 | Stoessel ............. | H01L 51/0085 |
| 2017/0047532 A1 | 2/2017 | Lee et al. | |
| 2017/0054095 A1 | 2/2017 | Choi et al. | |
| 2017/0229663 A1 | 8/2017 | Tsai et al. | |
| 2018/0198079 A1 | 7/2018 | Boudreault et al. | |
| 2019/0157576 A1 | 5/2019 | Kwong et al. | |
| 2019/0300557 A1 | 10/2019 | Kwak et al. | |
| 2019/0312218 A1 * | 10/2019 | Kim .................... | H01L 51/0085 |
| 2019/0326525 A1 * | 10/2019 | Kim .................... | H01L 51/0085 |
| 2020/0006675 A1 | 1/2020 | Ma et al. | |
| 2020/0259107 A1 | 8/2020 | Xia et al. | |
| 2020/0325393 A1 * | 10/2020 | Leung ................. | C09K 11/06 |
| 2022/0029112 A1 | 1/2022 | Kwak et al. | |
| 2022/0165969 A1 | 5/2022 | Kim et al. | |

FOREIGN PATENT DOCUMENTS

| | | |
|---|---|---|
| EP | 2465912 A1 | 6/2012 |
| JP | 2000003782 A | 1/2000 |
| JP | 2010520882 A | 6/2010 |
| JP | 2013121957 A | 6/2013 |
| JP | 2017039713 A | 2/2017 |
| JP | 2019182850 A | 10/2019 |
| KR | 1020060097320 A | 9/2006 |
| KR | 1020070030778 A | 3/2007 |
| KR | 20110077350 A | 7/2011 |
| KR | 1020130065595 A | 6/2013 |
| KR | 101468065 B1 | 11/2014 |
| KR | 1020180065353 A | 6/2018 |
| KR | 1020180076332 A | 7/2018 |
| KR | 1020180082339 A | 7/2018 |
| WO | 2018105986 A1 | 6/2018 |
| WO | 2018124697 A1 | 7/2018 |

OTHER PUBLICATIONS

Yang Li et al. "Ultra-high general and special color rendering index white organic light-emitting device based on a deep red phosphorescent dye", Org. Electronics 2013, vol. 14, p. 3201-3205 (Year: 2013).*
English Translation of Office Action issued in corresponding JP Patent Application No. 2019-160713, dated Mar. 8, 2022, 6 pp.
Office Action issued in corresponding JP Patent Application No. 2019-160713, dated Mar. 8, 2022, 3 pp.
Extended European search report issued by the European Patent Office on Jan. 23, 2020 in the examination of the European Patent Application No. 19195090.6.
Julianne M. Thomsen, et al., Iridium-based complexes for water oxidation, Dalton Trans., 2015, 44, 12452-12472.
Jun Ohata, et al., Luminogenic iridium azide complexes, Chem. Commun., 2015, 51, 15192, 5 pp.
M. A. Baldo, et al., Highly efficient phosphorescent emission fromorganic electroluminescent devices, Nature, 1998, 395, 151-154.
M. A. BaldoS, et al., Very high-efficiency green organic light-emitting devices based on electrophosphorescenceAppl. Phys. Lett. 1999, 75(3), 4 pp.
Qin Wang, et al., Effects of charged self-assembled quantum dots on two-dimensional quantum transport, Appl. Phys. Lett., 2000, 78, 1704-1706.
Raymond C. Kwong, et al., High operational stability of electrophosphorescent devices, Appl. Phys. Lett.,2000, 81, 162-164.
Sergey Lamansky, et al., Highly Phosphorescent Bis-Cyclometalated Iridium Complexes:Synthesis, Photophysical Characterization, and Use in Organic LightEmitting Diodes, J. Am. Chem. Soc. 2001, 123, 4304-4312.
Sergey Lamansky, et al., Synthesis and Characterization of Phosphorescent Cyclometalated Iridium Complexes, Inorganic Chemistry, 2001, 40, 1704-1711.
Toshitada Yoshihara, et al., Mitochondria-targeted oxygen probes based on cationic iridiumcomplexes with a 5-amino-1, 10-phenanthroline ligand, J. Photochem. Photobiol., 2015, 299, 172-182.
English Translation of Office Action dated Mar. 22, 2023, issued in corresponding CN Patent Application No. 201910835923.1, 8 pp.
English translation of Office Action issued on May 15, 2023 in corresponding Korean Patent Application No. KR 10-2019-0108601, 8 pgs.

(56) References Cited

OTHER PUBLICATIONS

Office Action dated Mar. 22, 2023, issued in corresponding CN Patent Application No. 201910835923.1, 6 pp.
Office action issued on May 15, 2023 in corresponding Korean Patent Application No. KR 10-2019-0108601, 7 pgs.
English AbstractorKR 1020070031778, Mar. 16, 2007.

\* cited by examiner

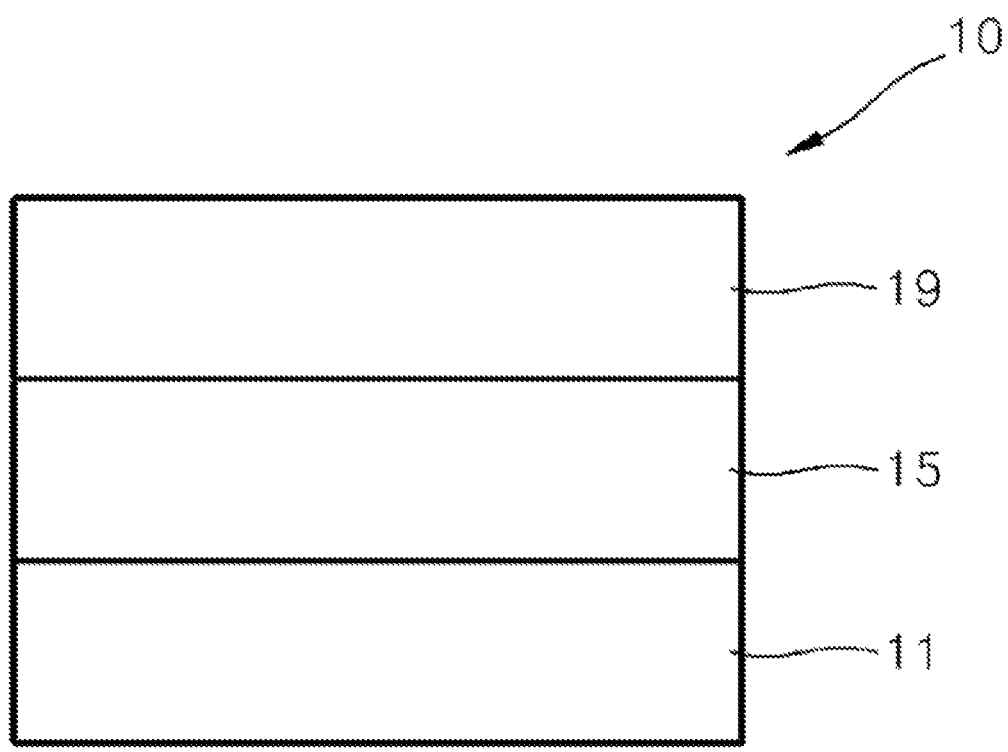

ORGANOMETALLIC COMPOUND, ORGANIC LIGHT- EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This application claims priority to and the benefit of Korean Patent Applications Nos. 10-2018-0106188, filed on Sep. 5, 2018, and 10-2019-0108601, filed on Sep. 3, 2019, in the Korean Intellectual Property Office, and all the benefits accruing therefrom under 35 U.S.C. § 119, the content of which is incorporated herein in its entirety by reference.

BACKGROUND

1. Field

An embodiment relates to an organometallic compound, an organic light-emitting device including the organometallic compound, and a diagnostic composition including the organometallic compound.

2. Description of the Related Art

Organic light-emitting devices are self-emission devices, which have better characteristics in terms of a viewing angle, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of a luminescent compound is a phosphorescent luminescent compound.

SUMMARY

An embodiment relates to a novel organometallic compound and an organic light-emitting device and a diagnostic composition including the same.

Additional aspects will be set forth in part in the description which follows and, in part, will be apparent from the description, or may be learned by practice of the presented embodiments.

An aspect of the present disclosure provides an organometallic compound represented by Formula 1 below:

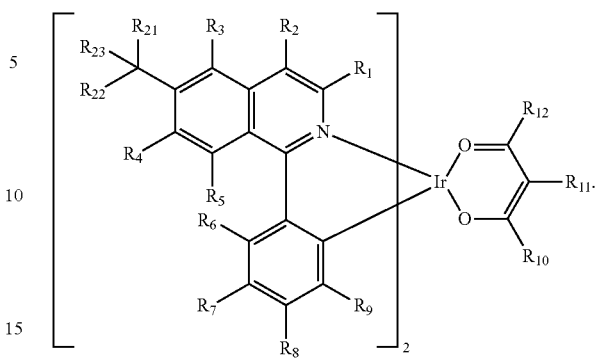

Formula 1

In Formula 1, $R_1$ to $R_{12}$ and $R_{23}$ may each independently be hydrogen, deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), at least one of $R_1$ to $R_5$ may each independently be deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), $R_{21}$ may be a $C_2$-$C_{20}$ alkyl group, a deuterium-containing $C_2$-$C_{20}$ alkyl group, a $C_3$-$C_{10}$ cycloalkyl group, or a deuterium-containing $C_3$-$C_{10}$ cycloalkyl group, $R_{22}$ may be a $C_1$-$C_{20}$ alkyl group, a deuterium-containing $C_1$-$C_{20}$ alkyl group, a $C_3$-$C_{10}$ cycloalkyl group, or a deuterium-containing $C_3$-$C_{10}$ cycloalkyl group, two or more of $R_1$ to $R_9$ may optionally be linked to each other to form a $C_5$-$C_{30}$ carbocyclic group unsubstituted or substituted with at least one $R_{1a}$ group or a $C_2$-$C_{30}$ heterocyclic group unsubstituted or substituted with at least one $R_{1a}$ group, two or more of $R_{10}$ to $R_{12}$ may optionally be linked to each other to form a $C_5$-$C_{30}$ carbocyclic group unsubstituted or substituted with at least one $R_{1a}$ group or a $C_2$-$C_{30}$ heterocyclic group unsubstituted or substituted with at least one $R_{1a}$ group, $R_{1a}$ is the same as defined in connection with $R_1$, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ arylalkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ heteroarylalkyl group, the substituted monovalent non-aromatic condensed polycyclic group, and the substituted monovalent non-aromatic condensed heteropolycyclic group may be each independently:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl group, a $C_6$-$C_{60}$ aryloxy group, a $C_6$-$C_{60}$ arylthio group, a $C_1$-$C_{60}$ heteroaryl group, a $C_2$-$C_{60}$ heteroarylalkyl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —Ge(Q$_{13}$)(Q$_{14}$)(Q$_{15}$), —B(Q$_{16}$)(Q$_{17}$), —P(=O)(Q$_{18}$)(Q$_{19}$), —P(Q$_{18}$)(Q$_{19}$), or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —Ge(Q$_{23}$)(Q$_{24}$)(Q$_{25}$), —B(Q$_{26}$)(Q$_{27}$), P(=O)(Q$_{28}$)(Q$_{29}$), —P(Q$_{28}$)(Q$_{29}$), or any combination thereof;

—N(Q$_{31}$)(Q$_{32}$), —Si(Q$_{33}$)(Q$_{34}$)(Q$_{35}$), —Ge(Q$_{33}$)(Q$_{34}$)(Q$_{35}$), —B(Q$_{36}$)(Q$_{37}$), P(=O)(Q$_{38}$)(Q$_{39}$) or —P(Q$_{38}$)(Q$_{39}$); or any combination thereof; and $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Another aspect of the present disclosure provides an organic light-emitting device including: a first electrode, a second electrode, and an organic layer disposed between the first electrode and the second electrode and including an emission layer, wherein the organic layer includes at least one the organometallic compound represented by Formula 1.

The organometallic compound represented by Formula 1 included in the emission layer in the organic layer may act as a dopant.

BRIEF DESCRIPTION OF THE DRAWING

These and/or other aspects will become apparent and more readily appreciated from the following description of the embodiments, taken in conjunction with FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1 below:

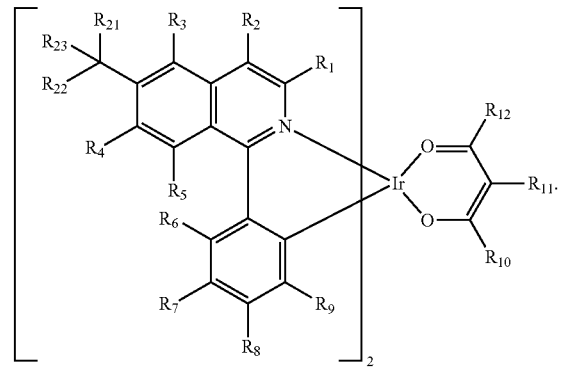

Formula 1

In Formula 1, $R_1$ to $R_{12}$ and $R_{23}$ may each independently be hydrogen, deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), wherein Q$_1$ to Q$_9$ will be each understood by referring to a detailed description thereof provided below.

In Formula 1, at least one of $R_1$ to $R_5$ (for example, one, two, three, four, or five of $R_1$ to $R_5$) may not be hydrogen. For example, at least one of $R_1$ to $R_5$ in Formula 1 (for example, one, two, three, four, or five of $R_1$ to $R_5$) may each independently be deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$).

In an embodiment, in Formula 1, $R_1$ may not be hydrogen and $R_2$, $R_3$, $R_4$ and $R_5$ may each be independently be hydrogen or deuterium;

$R_2$ may not be hydrogen and $R_1$, $R_2$, $R_4$ and $R_5$ may each be independently hydrogen or deuterium;

$R_3$ may not be hydrogen and $R_1$, $R_2$, $R_4$ and $R_5$ may each be independently hydrogen or deuterium;

$R_4$ may not be hydrogen and $R_1$, $R_2$, $R_3$ and $R_5$ may each independently be hydrogen or deuterium; or $R_5$ may not be hydrogen and $R_1$, $R_2$, $R_3$ and $R_4$ may each independently be hydrogen or deuterium.

For example, in Formula 1, $R_1$ to $R_{12}$ and $R_{23}$ may each independently be: hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{20}$ alkoxy group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{20}$ alkoxy group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or —N($Q_1$)($Q_2$), —Si($Q_3$)($Q_4$)($Q_5$), —Ge($Q_3$)($Q_4$)($Q_5$), —B($Q_6$)($Q_7$), or —P(=O)($Q_8$)($Q_9$);

at least one of $R_1$ to $R_5$ may not be hydrogen, and $Q_1$ to $Q_9$ may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In an embodiment, in Formula 1, $R_1$ to $R_{12}$ and $R_{23}$ may each independently be:

hydrogen, deuterium, —F, a cyano group, or a $C_1$-$C_{20}$ alkyl group;

a $C_1$-$C_{20}$ alkyl group substituted with deuterium, —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, or any combination thereof;

a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, or a terphenyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, or any combination thereof; or —Si($Q_3$)($Q_4$)($Q_5$), or —Ge($Q_3$)($Q_4$)($Q_5$); and/or at least one of $R_1$ to $R_5$ may each independently be:

deuterium, —F, a cyano group, or a $C_1$-$C_{20}$ alkyl group;

a $C_1$-$C_{20}$ alkyl group substituted with deuterium, —F, —$CD_3$, —$CD_2H$, —$CDH_2$, —$CF_3$, —$CF_2H$, —$CFH_2$, a cyano group, a $C_{1-10}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, or any combination thereof;

a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, or a terphenyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, or any combination thereof; or —Si($Q_3$)($Q_4$)($Q_5$), or —Ge($Q_3$)($Q_4$)($Q_5$), wherein $Q_3$ to $Q_5$ may be each understood by referring to the detailed description.

In Formula 1, $R_{21}$ may be a $C_2$-$C_{20}$ alkyl group, a deuterium-containing $C_2$-$C_{20}$ alkyl group, a $C_3$-$C_{10}$ cycloalkyl group, or a deuterium-containing $C_3$-$C_{10}$ cycloalkyl group, and $R_{22}$ may be a $C_1$-$C_{20}$ alkyl group, a deuterium-containing $C_1$-$C_{20}$ alkyl group, a $C_3$-$C_{10}$ cycloalkyl group, or a deuterium-containing $C_3$-$C_{10}$ cycloalkyl group.

In an exemplary embodiment, $R_{21}$ in Formula 1 may be an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a cyclopentyl group, a cyclohexyl group, a cycloheptyl group, a cyclooctyl group, a bicyclo[1.1.1]pentyl group, a bicyclo[2.1.1]hexyl group, a bicyclo[2.2.1]heptyl group, or a bicyclo[2.2.2]octyl group, each unsubstituted or substituted with at least one deuterium.

In an exemplary embodiment, $R_{22}$ in Formula 1 may be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a cyclopentyl group, a cyclohexyl group, a cycloheptyl group, a cyclooctyl group, a bicyclo[1.1.1]pentyl group, a bicyclo[2.1.1]hexyl group, a bicyclo[2.2.1]heptyl group, or a bicyclo[2.2.2]octyl group, each unsubstituted or substituted with at least one deuterium.

In an embodiment, one of $R_1$ to $R_5$ in Formula 1 may be a substituted or unsubstituted $C_1$-$C_{60}$ alkyl group, a substituted or unsubstituted $C_3$-$C_{10}$ cycloalkyl group, —Si($Q_3$)($Q_4$)($Q_5$), or —Ge($Q_3$)($Q_4$)($Q_5$).

In an embodiment, in Formula 1, $R_6$ and $R_8$ may each independently be hydrogen or deuterium, $R_7$ and $R_9$ may each independently be a substituted or unsubstituted $C_1$-$C_{60}$ alkyl group, a substituted or unsubstituted $C_3$-$C_{10}$ cycloalkyl group, —Si($Q_3$)($Q_4$)($Q_5$), or —Ge($Q_3$)($Q_4$)($Q_5$).

In an embodiment, in Formula 1, $R_7$ and $R_9$ may each independently be a substituted or unsubstituted $C_1$-$C_{60}$ alkyl group, and $R_7$ and $R_9$ may be identical to each other.

In an embodiment, in Formula 1, $R_7$ and $R_9$ may each independently be a substituted or unsubstituted $C_1$-$C_{60}$ alkyl group, and $R_7$ and $R_9$ may be different from each other.

In an embodiment, in Formula 1, $R_7$ and $R_9$ may each independently be a substituted or unsubstituted $C_1$-$C_{60}$ alkyl group, $R_7$ and $R_9$ may be different from each other, and the number of carbon atoms included in $R_7$ may be greater than that of carbon atoms included in $R_9$.

In an embodiment, in Formula 1, $R_{21}$ may be a $C_3$-$C_{10}$ cycloalkyl group or a deuterium-containing $C_3$-$C_{10}$ cycloalkyl group.

In an embodiment, in Formula 1, $R_{21}$ may be a $C_3$-$C_{20}$ alkyl group, a deuterium-containing $C_3$-$C_{20}$ alkyl group, a $C_3$-$C_{10}$ cycloalkyl group, or a deuterium-containing $C_3$-$C_{10}$ cycloalkyl group.

In an embodiment, in Formula 1, $R_{21}$ may be a branched $C_3$-$C_{20}$ alkyl group, a deuterium-containing branched $C_3$-$C_{20}$ alkyl group, a $C_3$-$C_{10}$ cycloalkyl group, or a deuterium-containing $C_3$-$C_{10}$ cycloalkyl group.

In an embodiment, in Formula 1, $R_{22}$ may be a methyl group.

In an embodiment, in Formula 1, $R_{22}$ may be a $C_2$-$C_{20}$ alkyl group, a deuterium-containing $C_2$-$C_{20}$ alkyl group, a $C_3$-$C_{10}$ cycloalkyl group, or a deuterium-containing $C_3$-$C_{10}$ cycloalkyl group.

In an embodiment, in Formula 1, $R_{21}$ and $R_{22}$ may be identical to each other.

In an embodiment, in Formula 1, $R_{21}$ and $R_{22}$ may be different from each other.

In an embodiment, in Formula 1, $R_{23}$ may be hydrogen or deuterium.

In an embodiment, the organometallic compound represented by Formula 1 may satisfy Condition 3, Condition 4, or any combination thereof:

Condition 3
$R_{10}$ in Formula 1 is represented by Formula 3.

Condition 4
$R_{12}$ in Formula 1 is represented by Formula 4.

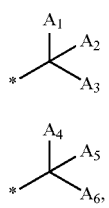

Formula 3

Formula 4

In Formulae 3 and 4,
$A_1$ to $A_6$ may each independently be:
hydrogen or deuterium; or
a $C_1$-$C_{20}$ alkyl group, a $C_3$-$C_{10}$ cycloalkyl group, a $C_6$-$C_{60}$ aryl group, or a $C_1$-$C_{60}$ heteroaryl group, each unsubstituted or substituted with deuterium, a $C_1$-$C_{20}$ alkyl group, a $C_3$-$C_{10}$ cycloalkyl group, or any combination thereof; and
* indicates a binding site to a neighboring atom.

In an exemplary embodiment, Formula 3 may satisfy one of Condition 3-1 to Condition 3-5 and/or Formula 4 may satisfy one of Condition 4-1 to Condition 4-5:

Condition 3-1
$A_1$ to $A_3$ are not all hydrogen, simultaneously.

Condition 3-2
$A_1$ to $A_3$ are each independently a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof.

Condition 3-3
$A_1$ and $A_2$ are each independently a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and $A_3$ is a $C_2$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof.

Condition 3-4
$A_1$ is a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and $A_2$ and $A_3$ are each independently a $C_2$-$C_{20}$ alkyl group or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof.

Condition 3-5
$A_1$ is hydrogen or deuterium,
$A_2$ is a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and
$A_3$ is a $C_2$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof.

Condition 4-1
$A_4$ to $A_6$ are not all hydrogen, simultaneously.

Condition 4-2
$A_4$ to $A_6$ are each independently a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof.

Condition 4-3
$A_4$ and $A_5$ are each independently a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and $A_6$ is a $C_2$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof.

Condition 4-4
$A_4$ is a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and
$A_5$ and $A_6$ are each independently a $C_2$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof.

Condition 4-5
$A_4$ is hydrogen or deuterium,
$A_5$ is a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and
$A_6$ is a $C_2$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof.

In an embodiment, $R_{10}$, $R_{12}$, or a combination thereof (for example, both $R_{10}$ and $R_{12}$) in Formula 1 may be a substituted or unsubstituted $C_3$-$C_{10}$ cycloalkyl group.

In an embodiment, $R_{10}$, $R_{12}$, or a combination thereof (for example, both $R_{10}$ and $R_{12}$) in Formula 1 may each independently be a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, or a bicyclo[2.2.2]octyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{10}$ alkyl group, or any combination thereof.

In an embodiment, $R_{10}$ and $R_{12}$ in Formula 1 may be identical to each other.

In an embodiment, $R_{10}$ and $R_{12}$ in Formula 1 may be different from each other.

In an embodiment, $R_{11}$ in Formula 1 may be hydrogen, deuterium, or a methyl group.

In an embodiment, a case in which $R_{10}$ and $R_{12}$ in Formula 1 are each a methyl group and $R_{11}$ in Formula 1 is hydrogen is excluded from the scope of this disclosure.

In an embodiment, in Formulae 1, 3 and 4, $R_1$ to $R_{12}$ and $R_{23}$ may each independently be hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by one of Formulae 9-1 to 9-66, a group represented by one of Formulae 9-1 to 9-66 in which at least one hydrogen is substituted with deuterium, a group represented by one of Formulae 10-1 to 10-249, a group represented by one of Formulae 10-1 to 10-249 in which at least one hydrogen is substituted with deuterium, —Si(Q$_3$)(Q$_4$)(Q$_5$), or —Ge(Q$_3$)(Q$_4$)(Q$_5$) (wherein Q$_3$ to Q$_5$ are the same as described herein); and/or at least one of $R_1$ to $R_5$ may each independently be deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by one of Formulae 9-1 to 9-66, a group represented by one of Formulae 9-1 to 9-66 in which at least one hydrogen is substituted with deuterium, a group represented by one of Formulae 10-1 to 10-249, a group represented by one of Formulae 10-1 to 10-249 in which at least one hydrogen is substituted with deuterium, —Si(Q$_3$)(Q$_4$)(Q$_5$), or —Ge(Q$_3$)(Q$_4$)(Q$_5$) (wherein Q$_3$ to Q$_5$ are the same as described herein); and/or $R_{21}$ may be a group represented by one of Formulae 9-1 to 9-33, a group represented by one of Formulae 9-1 to 9-33 in which at least one hydrogen is substituted with deuterium, a group represented by one of Formulae 10-1 to 10-10, or a group represented by one of Formulae 10-1 to 10-10 in which at least one hydrogen is substituted with deuterium; and/or $R_{22}$ may be —CH$_3$, —CD$_3$, —CD$_2$H, —CDH$_2$, a group represented by one of Formulae 9-1 to 9-33, a group represented by one of Formulae 9-1 to 9-33 in which at least one hydrogen is substituted with deuterium, a group represented by one of Formulae 10-1 to 10-10, or a group represented by one of Formulae 10-1 to 10-10 in which at least one hydrogen is substituted with deuterium; and/or $A_1$ to $A_6$ may each independently be hydrogen, deuterium, —CH$_3$, —CD$_3$, —CD$_2$H, —CDH$_2$, a group represented by one of Formulae 9-1 to 9-63, a group represented by one of Formulae 9-1 to 9-63 in which at least one hydrogen is substituted with deuterium, a group represented by one of Formulae 10-1 to 10-10, or a group represented by one of Formulae 10-1 to 10-10 in which at least one hydrogen is substituted with deuterium:

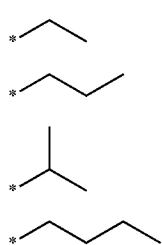

9-1

9-2

9-3

9-4

-continued

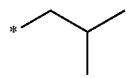
9-5

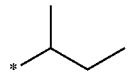
9-6

9-7

9-8

9-9

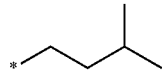
9-10

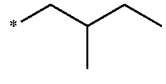
9-11

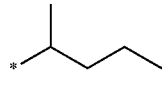
9-12

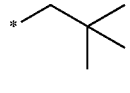
9-13

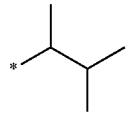
9-14

9-15

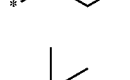
9-16

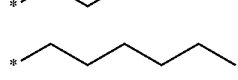
9-17

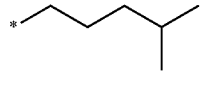
9-18

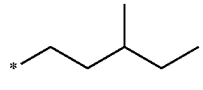
9-19

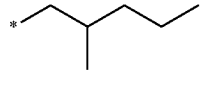
9-20

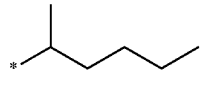
9-21

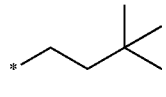

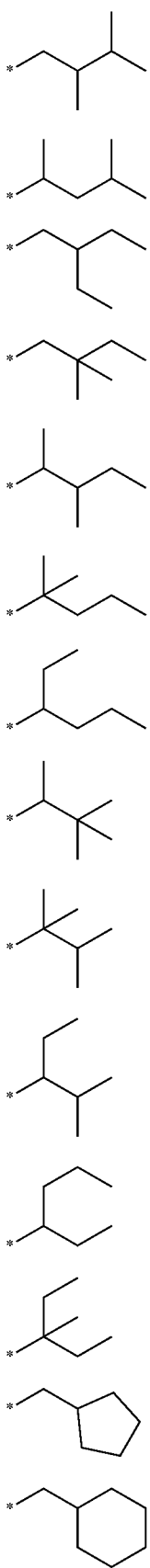
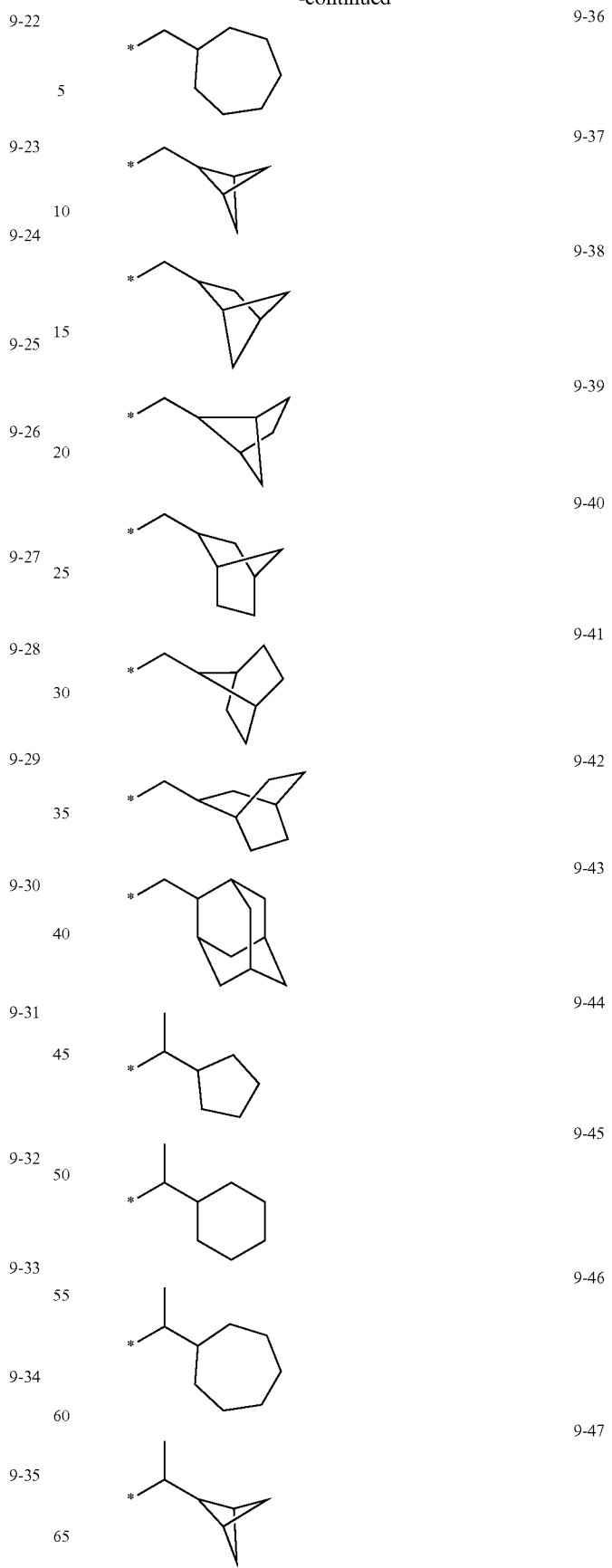

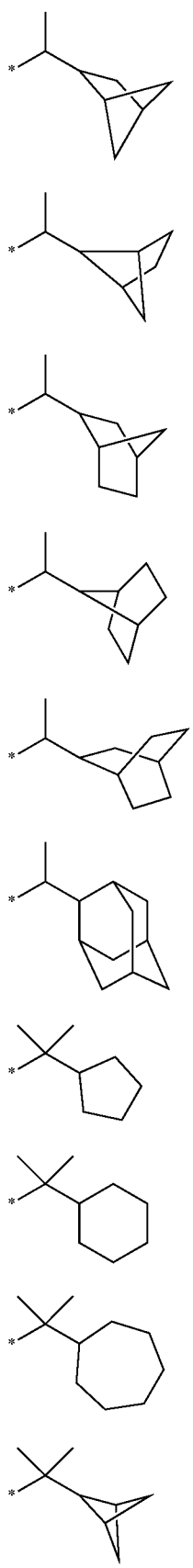
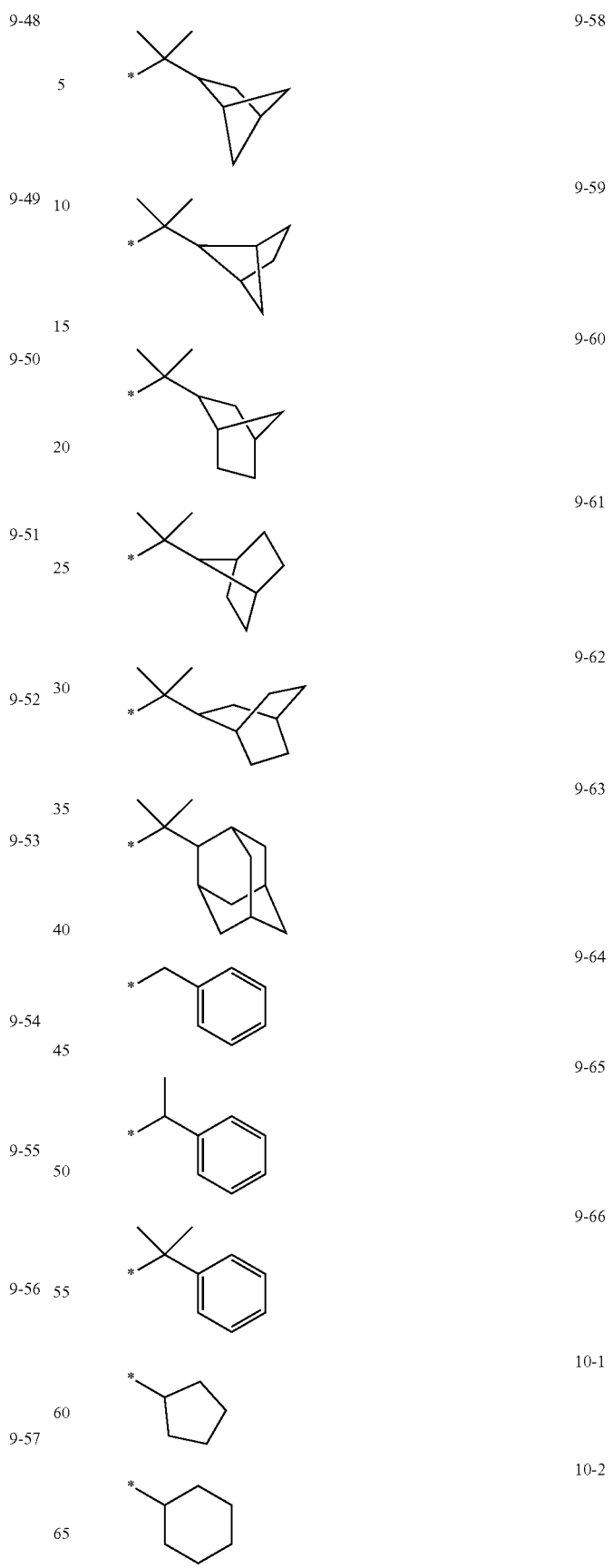

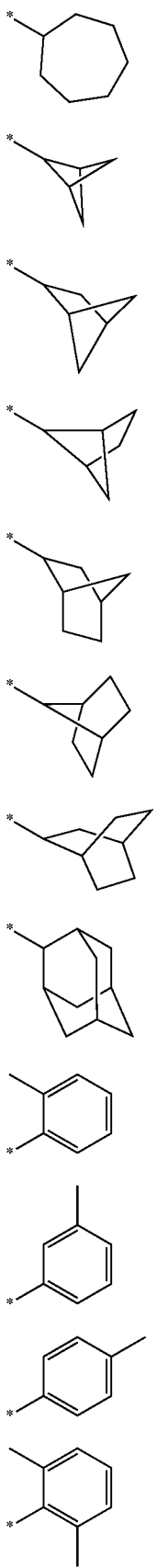
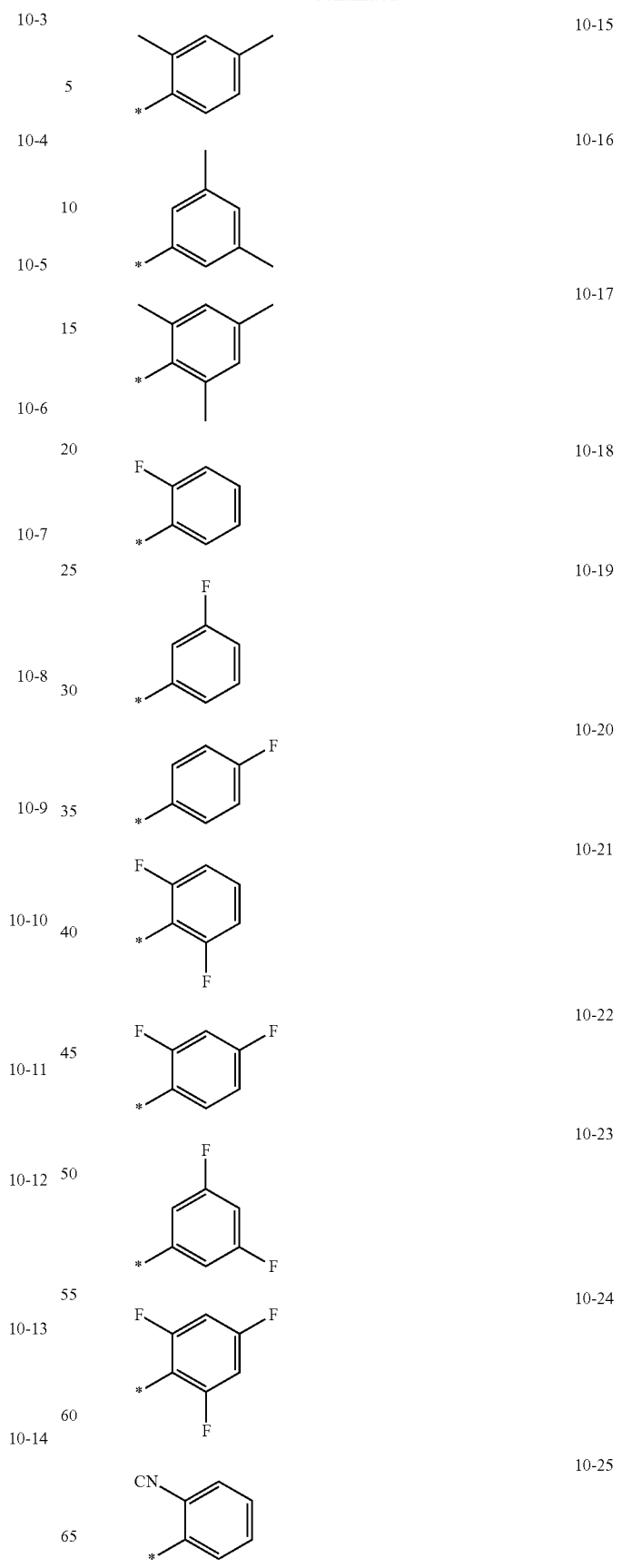

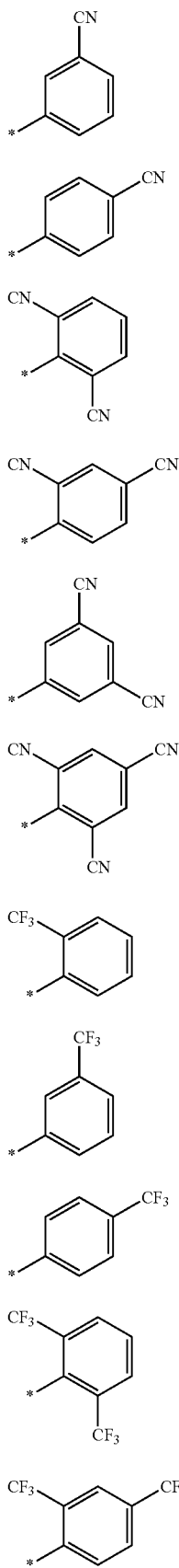
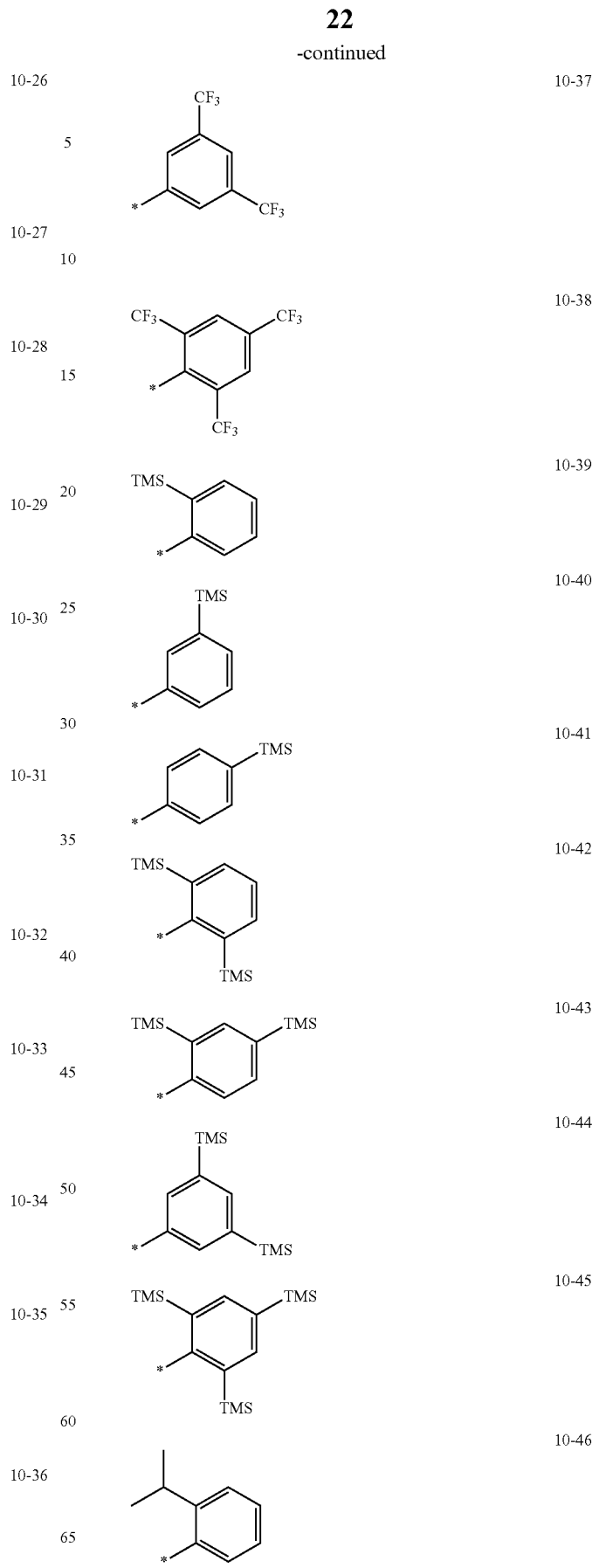

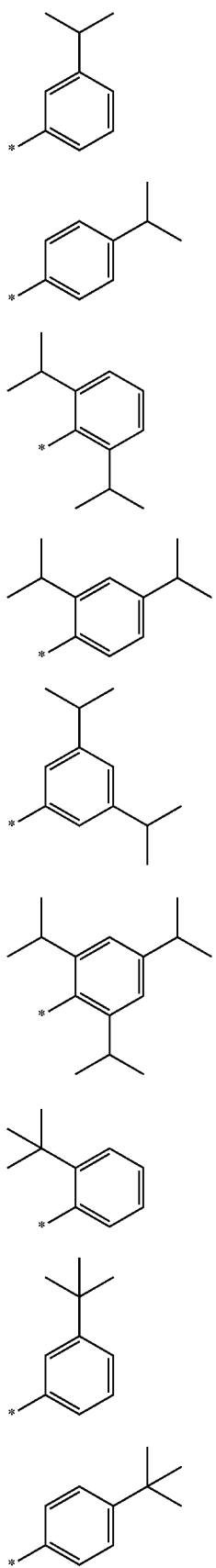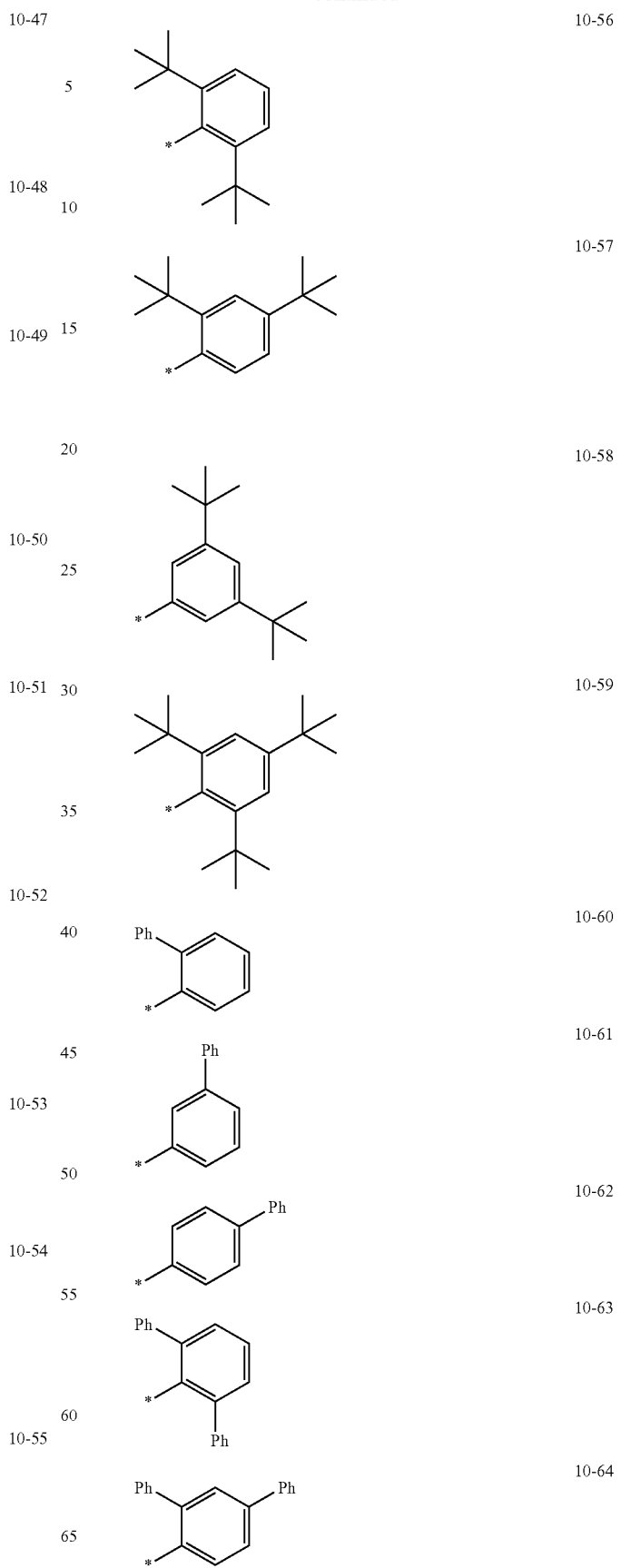

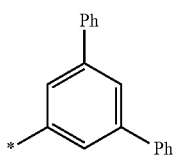
10-65
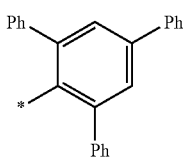
10-66
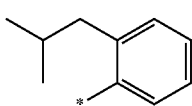
10-67
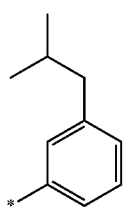
10-68
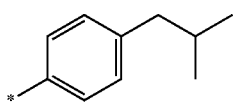
10-69
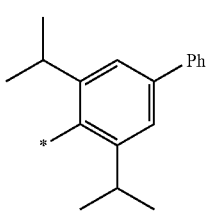
10-70
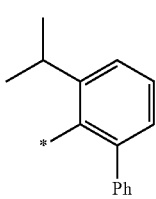
10-71
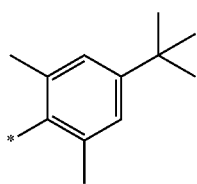
10-72
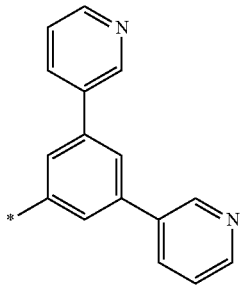
10-73
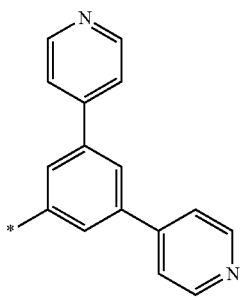
10-74
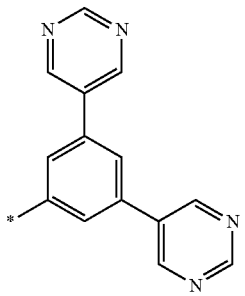
10-75
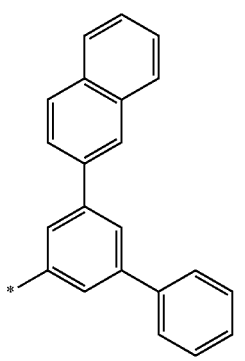
10-76
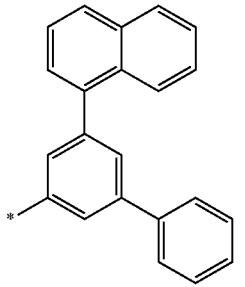
10-77

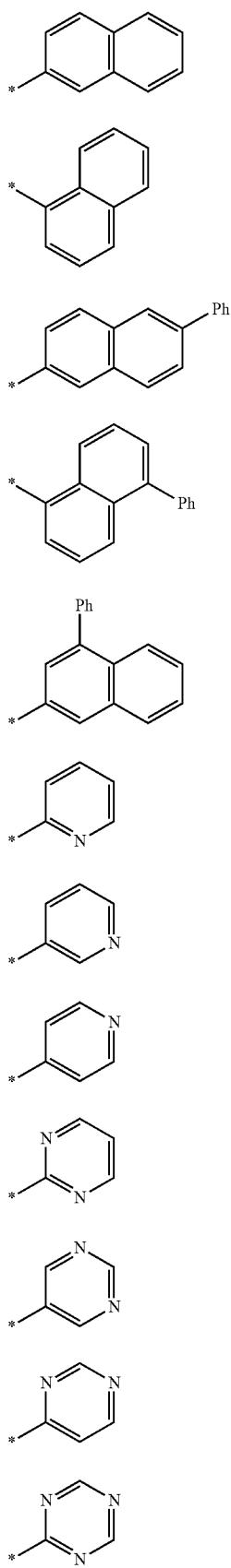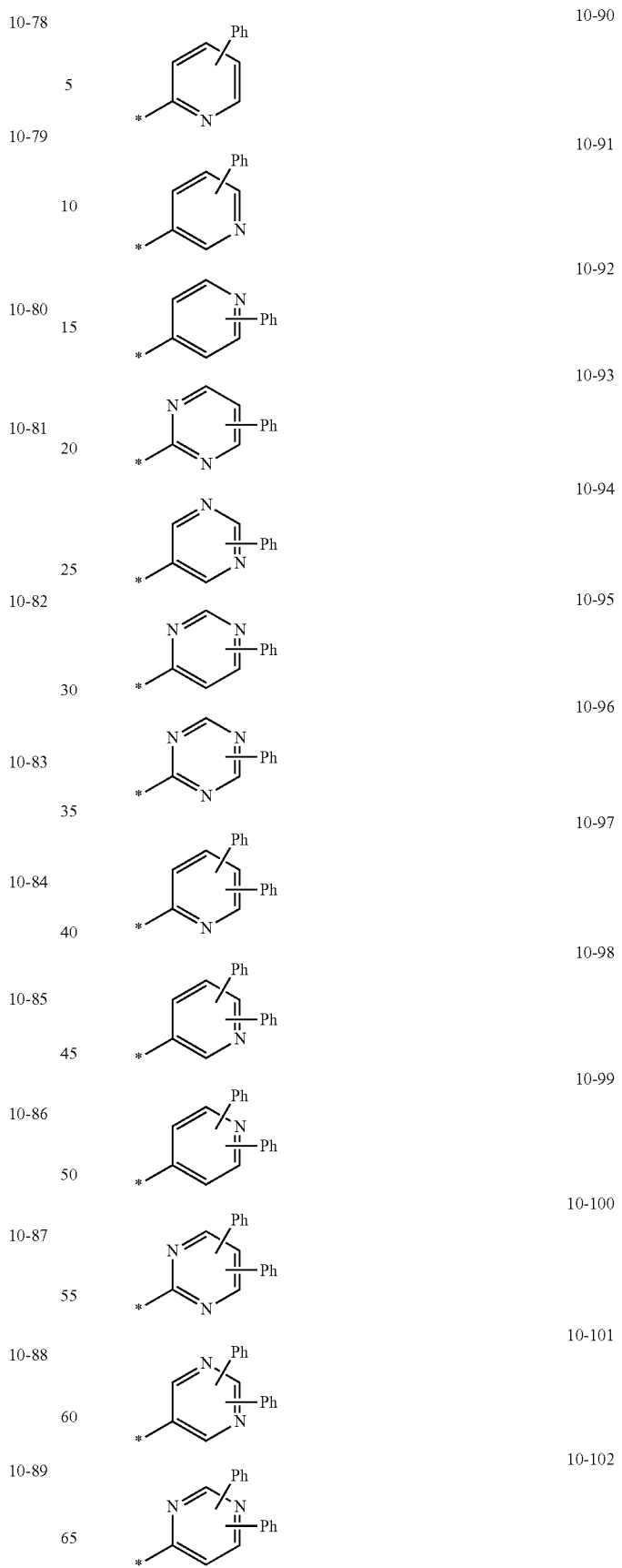

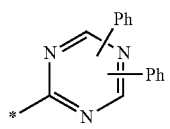
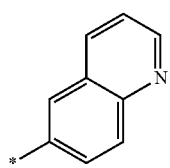
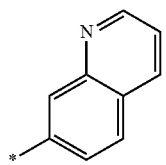
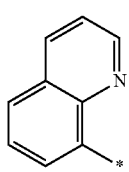
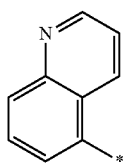
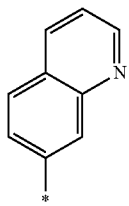
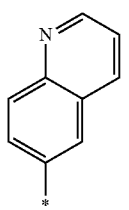
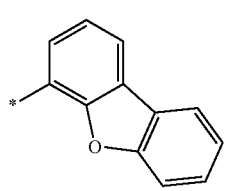
10-103
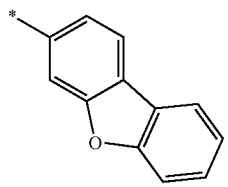
10-104
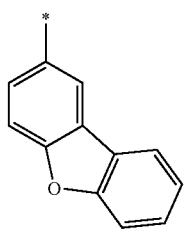
10-105
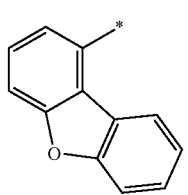
10-106
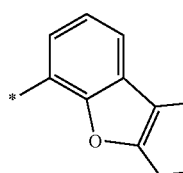
10-107
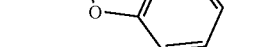
10-108
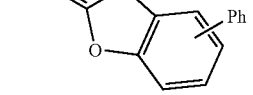
10-109
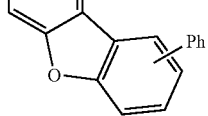
10-110
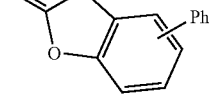
10-111
10-112
10-113
10-114
10-115
10-116
10-117
10-118
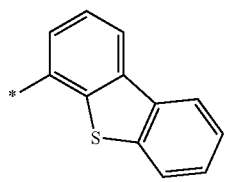

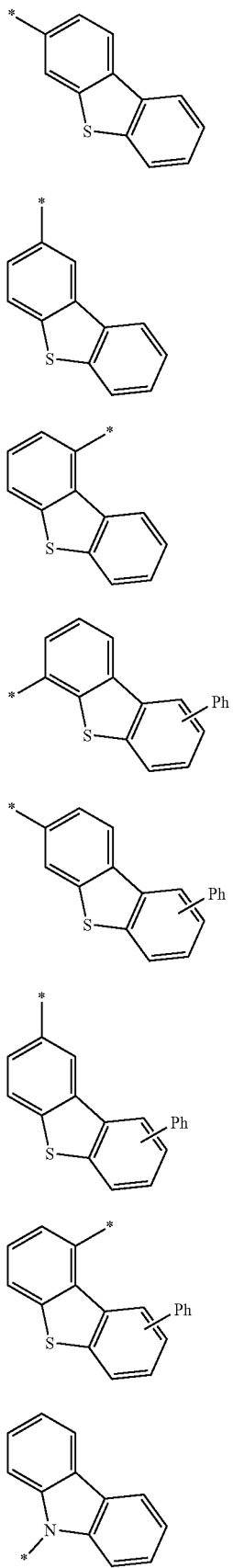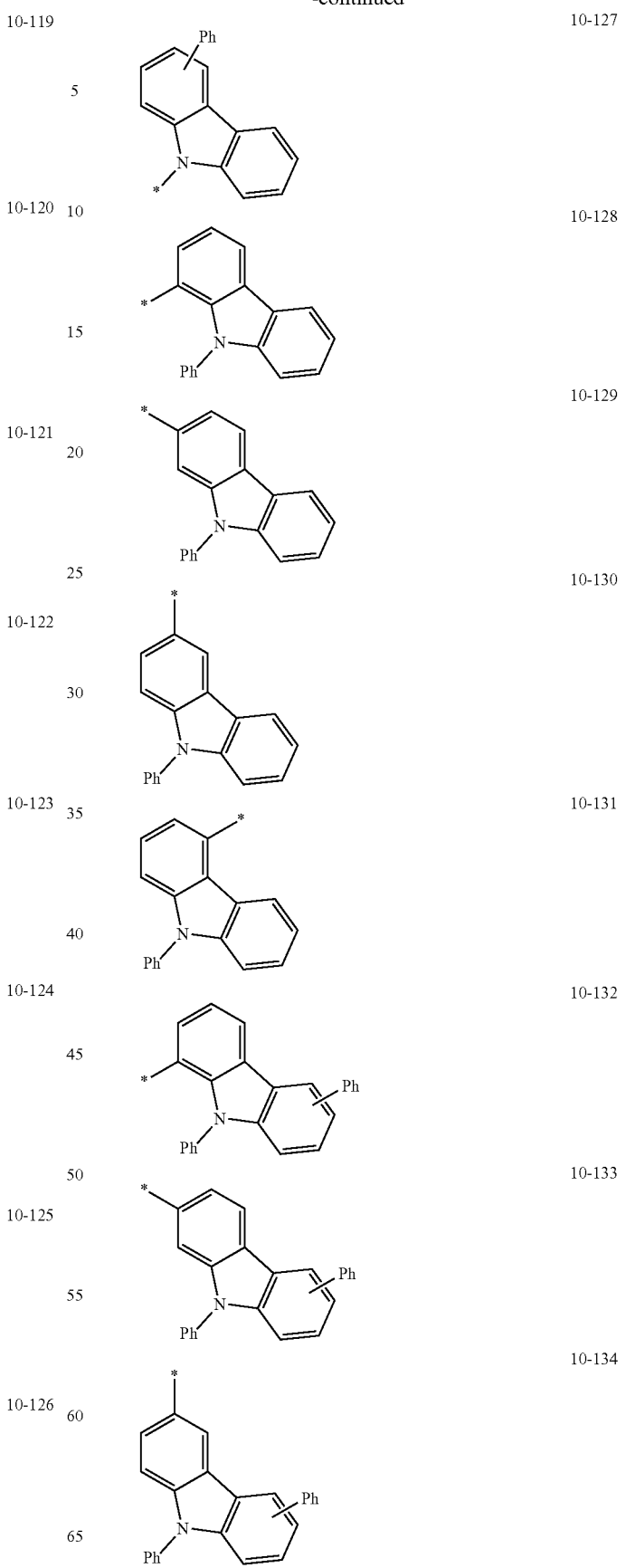

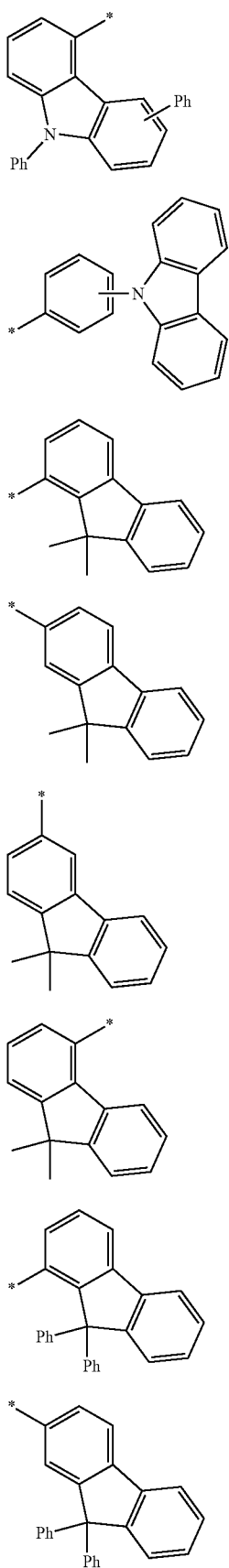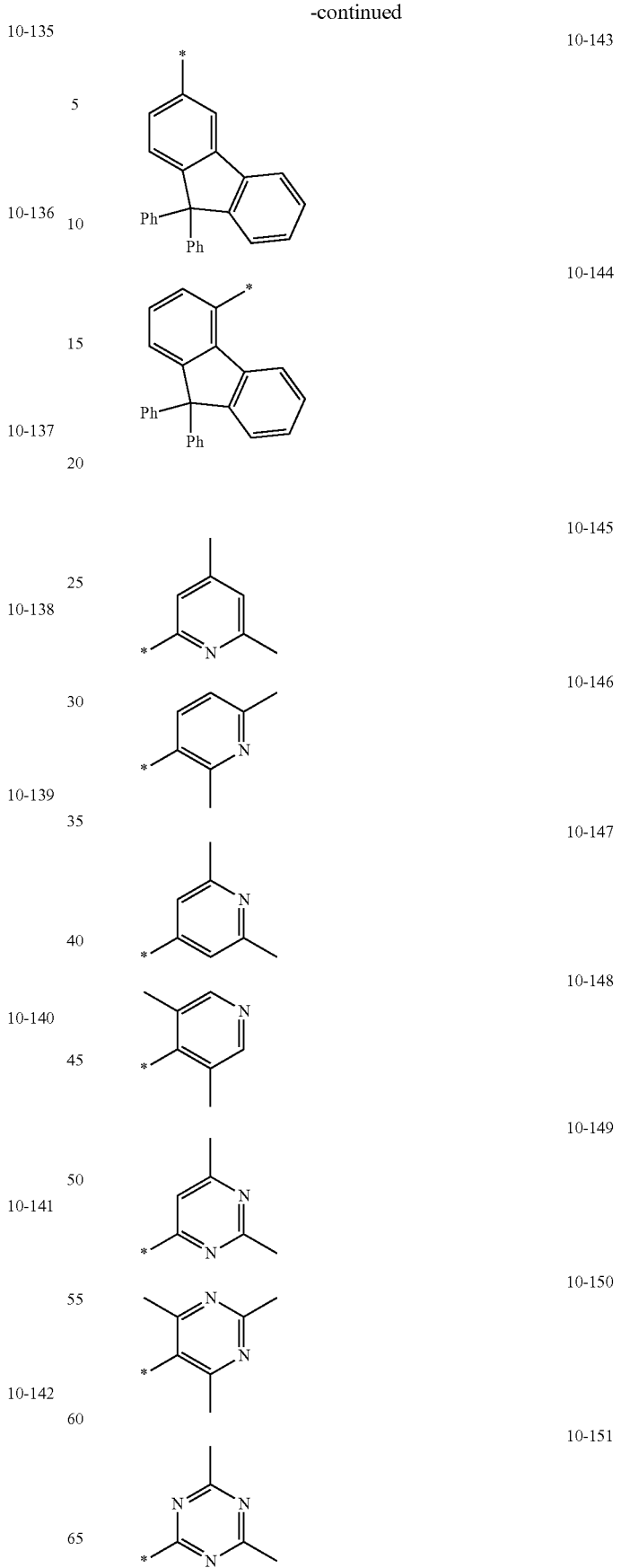

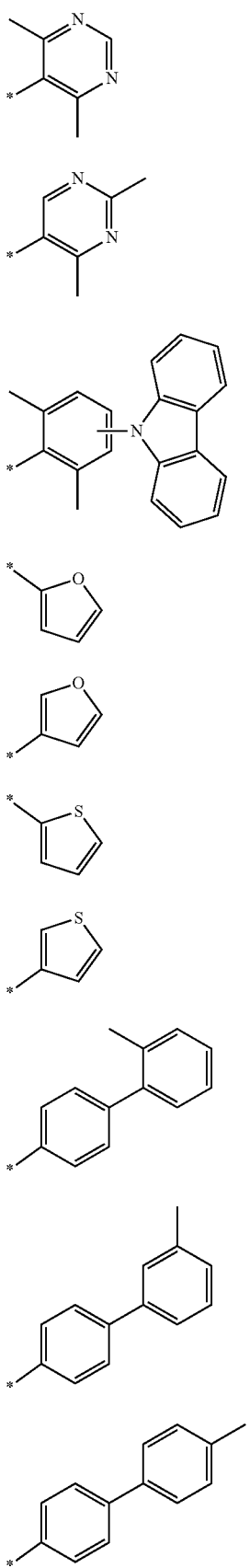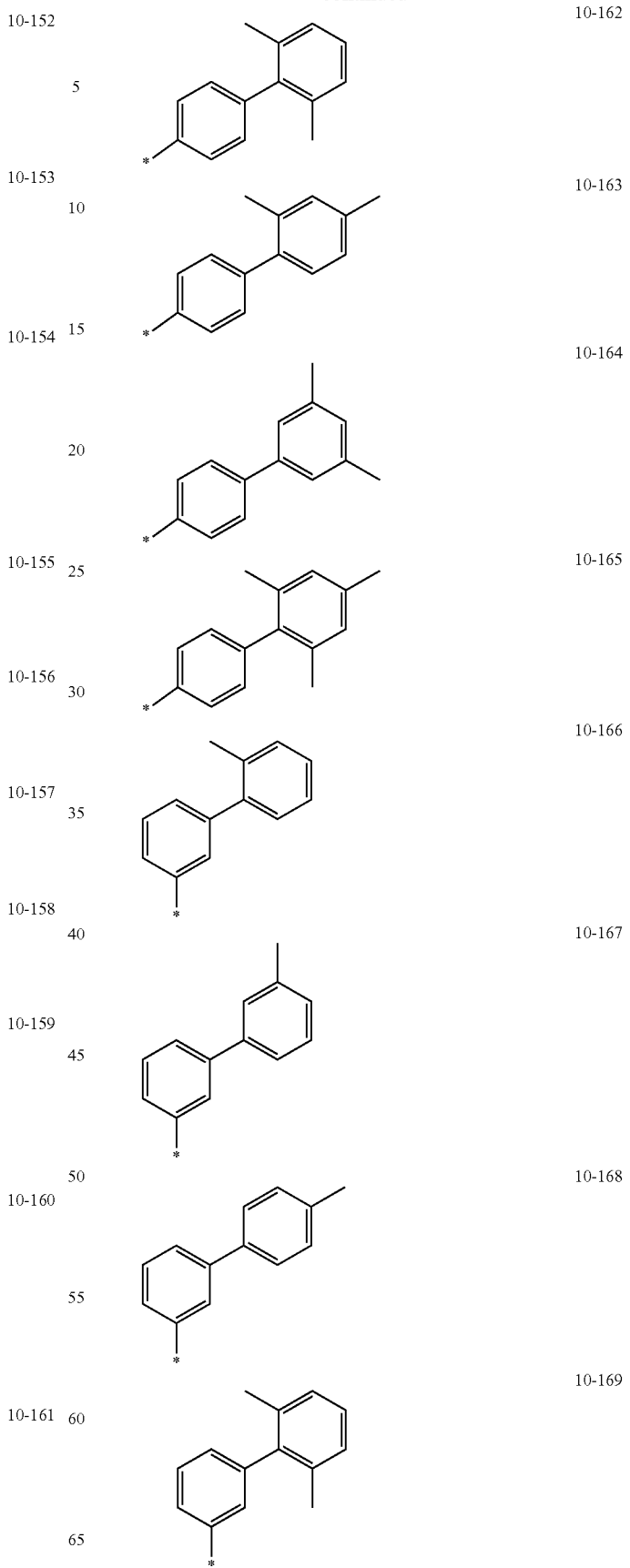

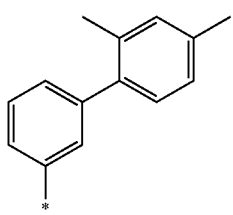
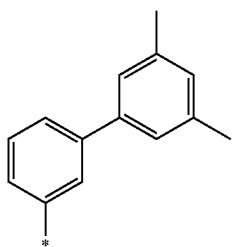
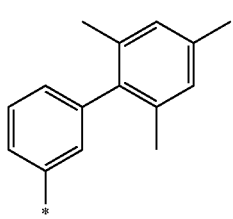
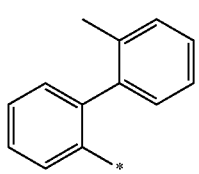
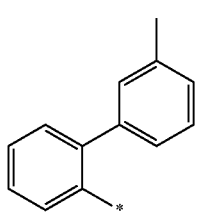
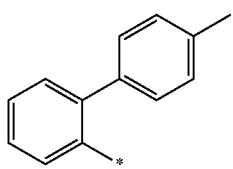
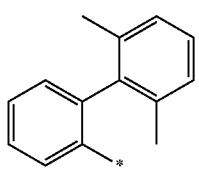
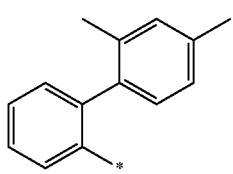
10-170
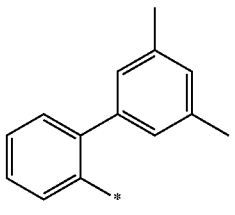
10-171
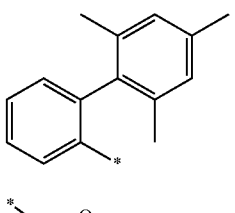
10-172
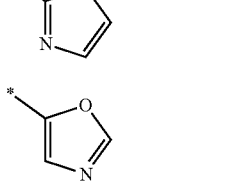
10-173
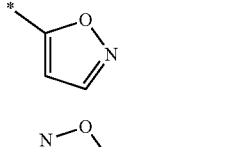
10-174
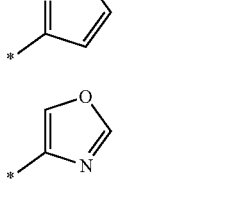
10-175
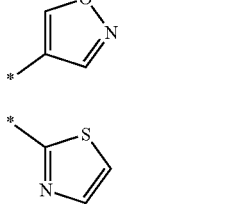
10-176
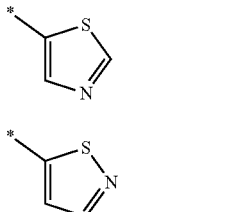
10-177
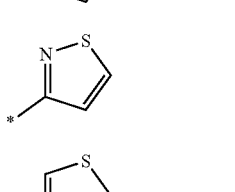
10-178
10-179
10-180
10-181
10-182
10-183
10-184
10-185
10-186
10-187
10-188
10-189
10-190

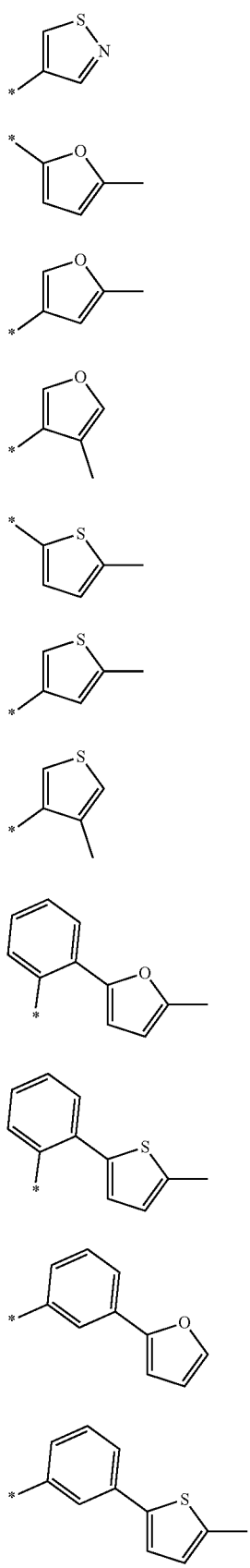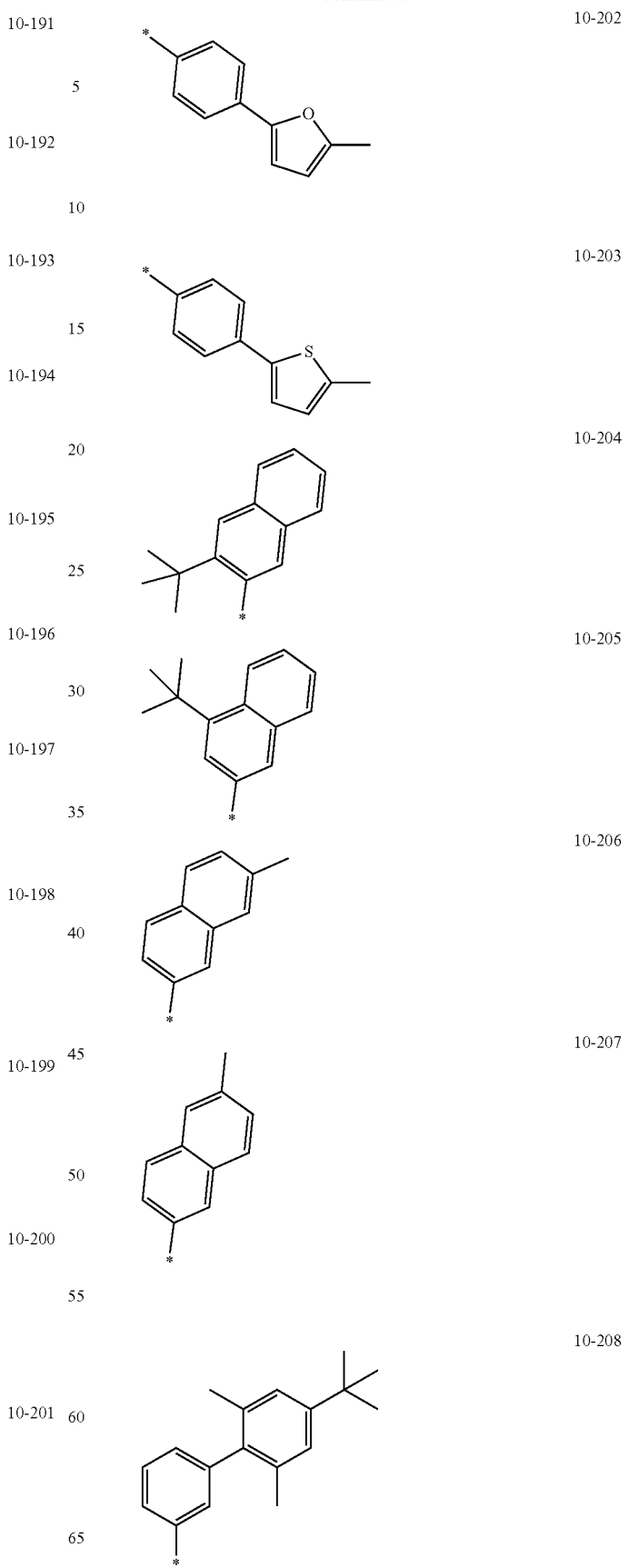

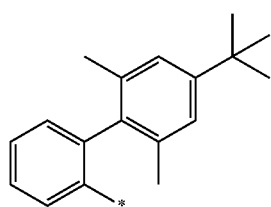
10-209
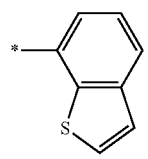
10-210
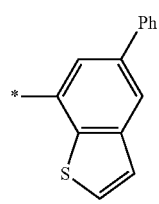
10-211
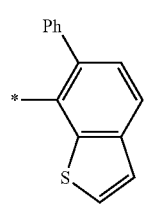
10-212
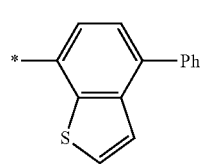
10-213
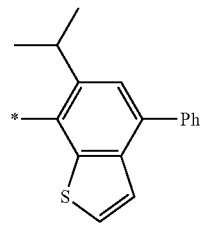
10-214
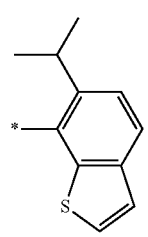
10-215
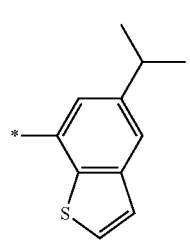
10-216
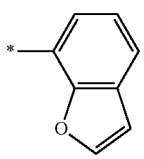
10-217
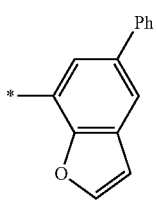
10-218
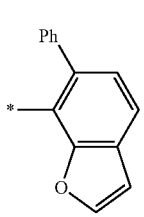
10-219
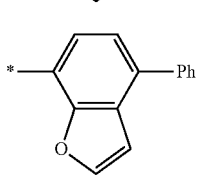
10-220
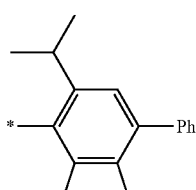
10-221
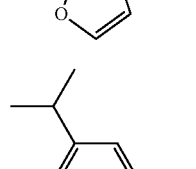
10-222
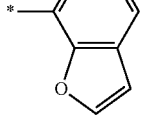
10-223
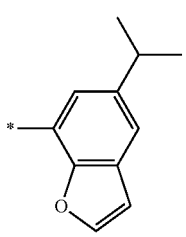
10-224
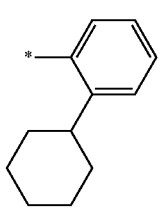

-continued
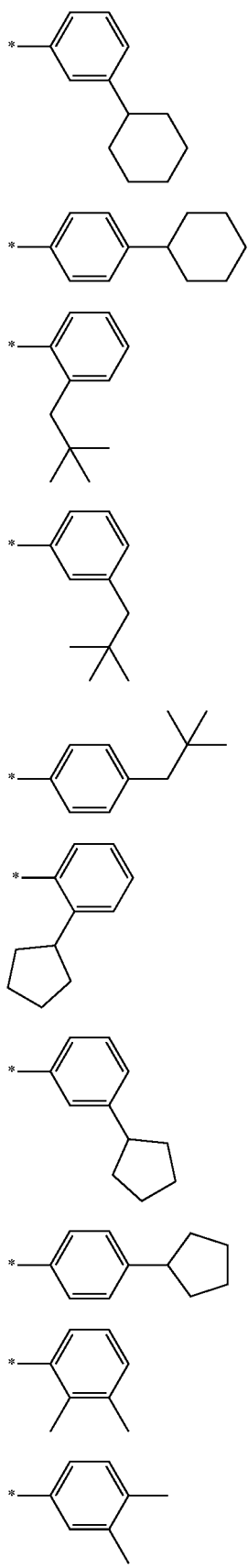
-continued
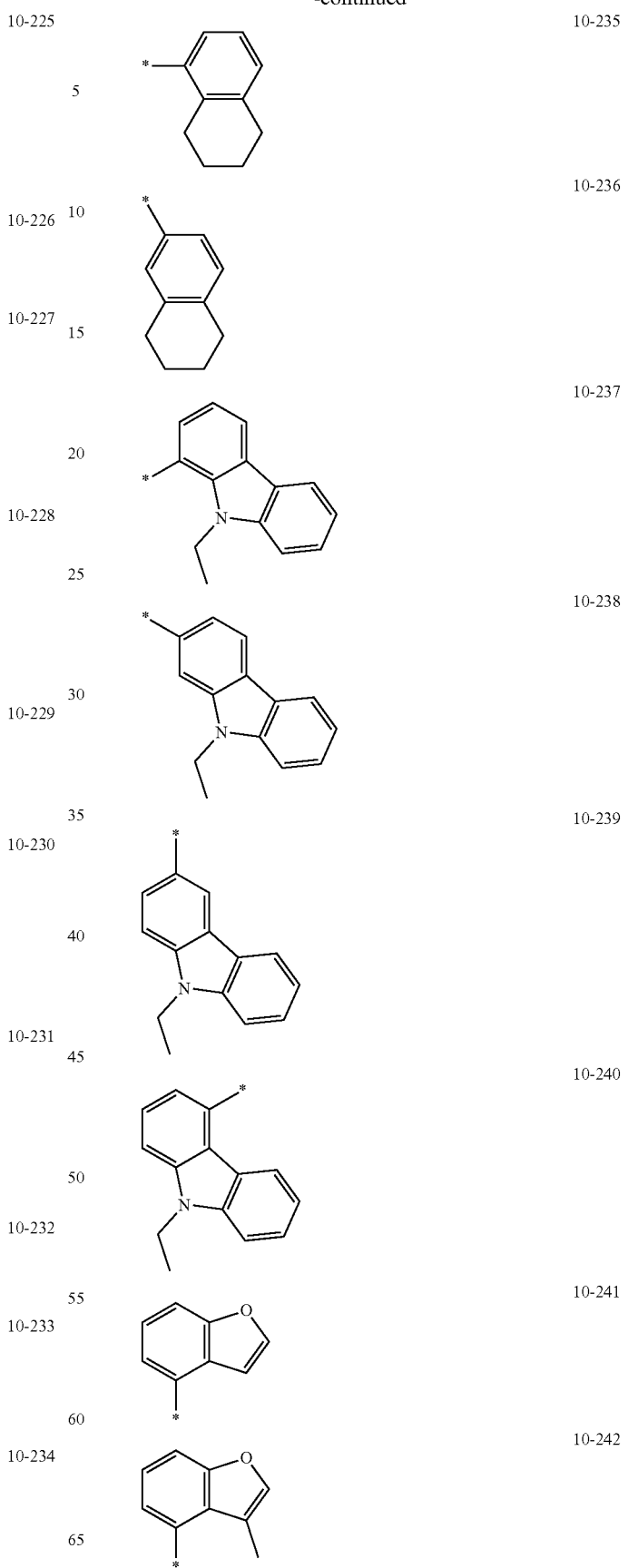

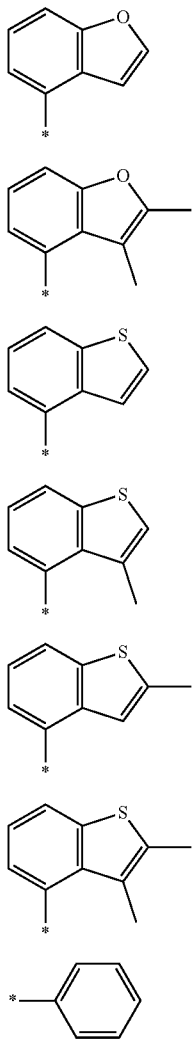
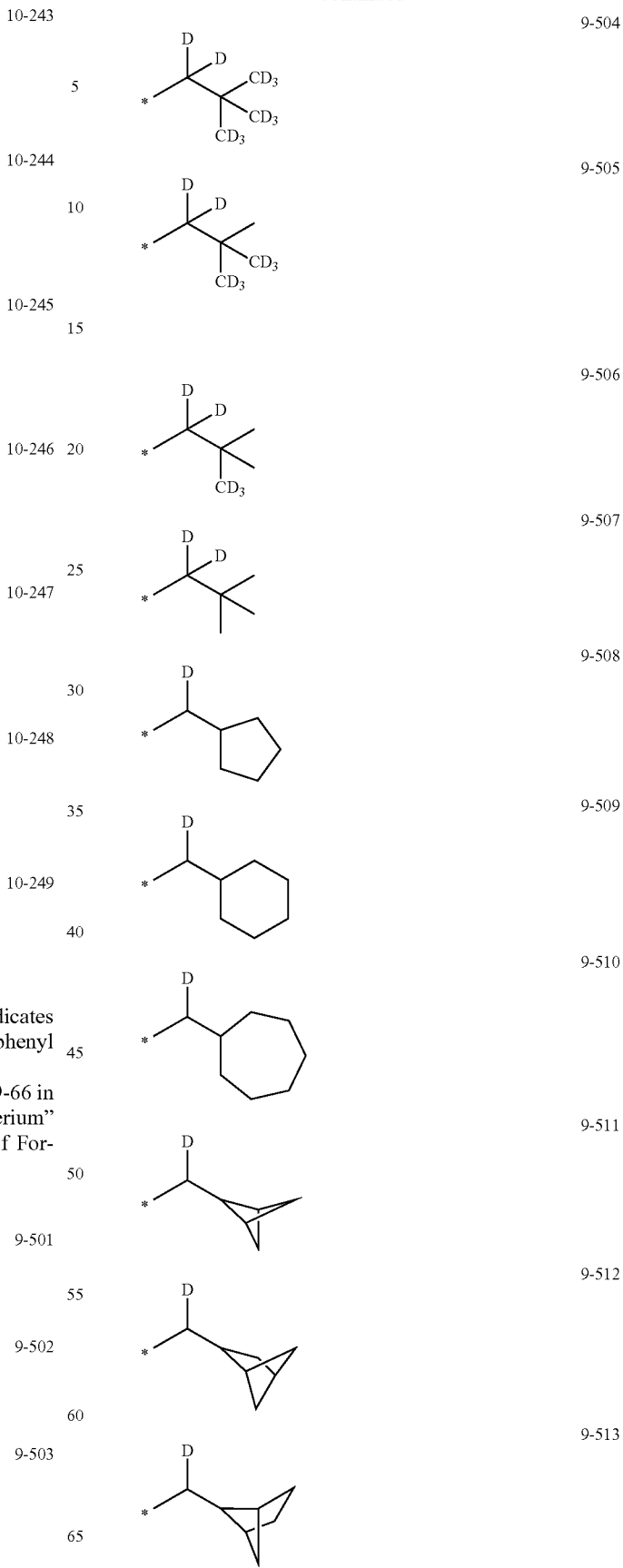
In Formulae 9-1 to 9-66 and 10-1 to 10-249, * indicates a binding site to a neighboring atom, Ph indicates a phenyl group, and TMS indicates a trimethylsilyl group.
The "group represented by one of Formulae 9-1 to 9-66 in which at least one hydrogen is substituted with deuterium" may be, for example, a group represented by one of Formulae 9-501 to 9-552:
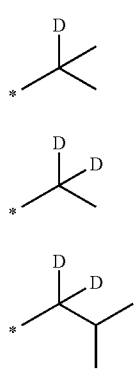

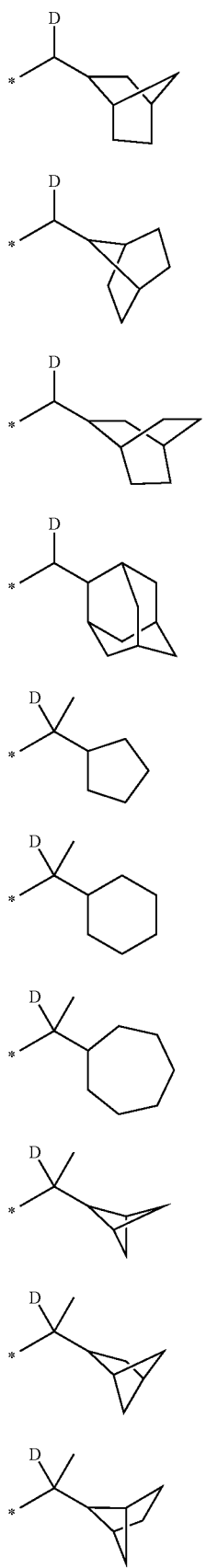
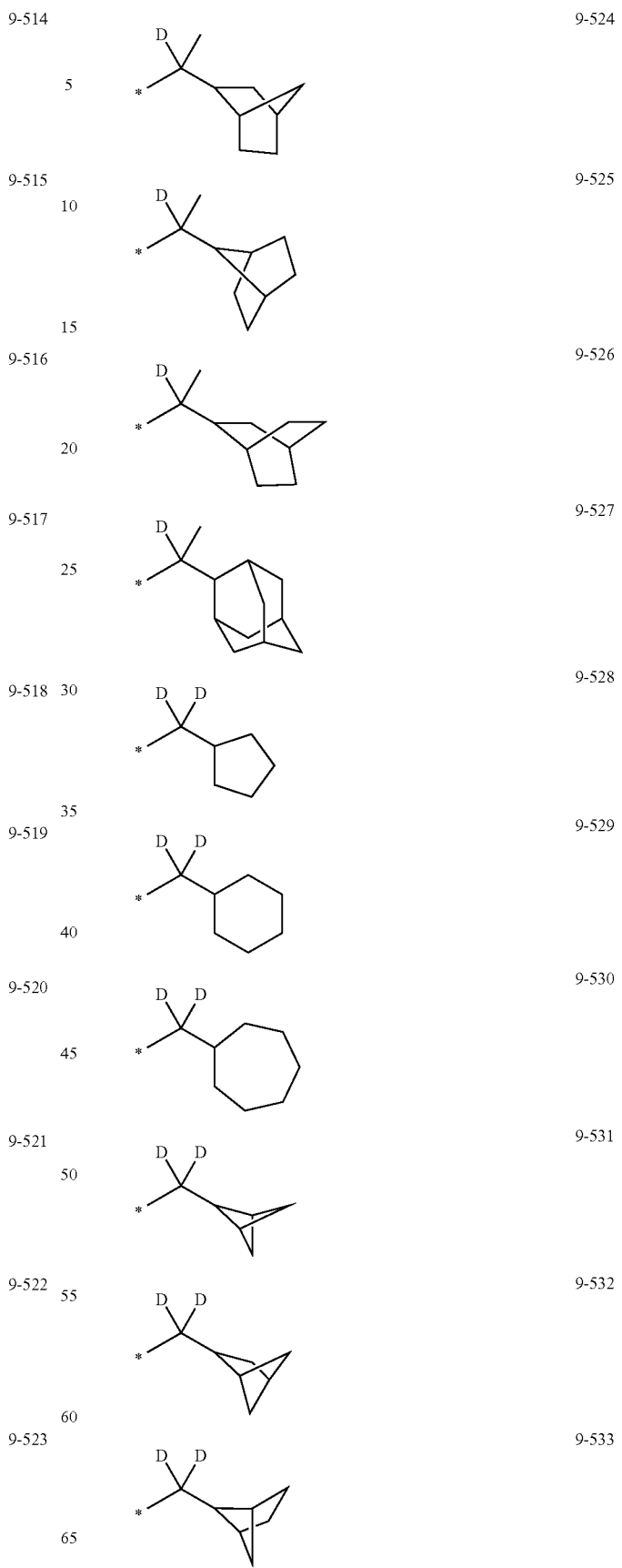

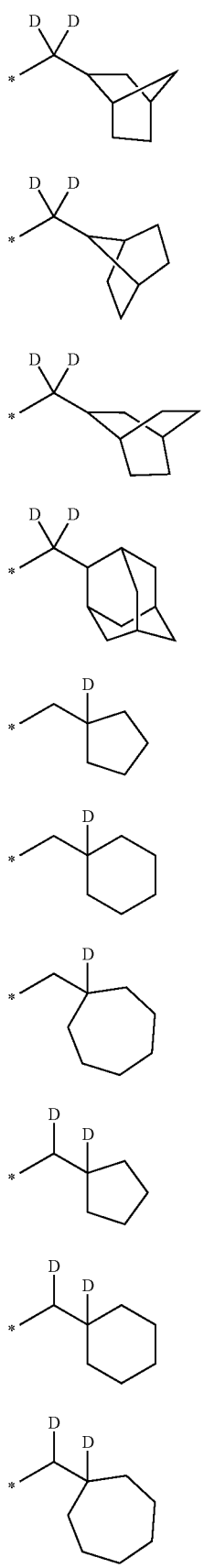
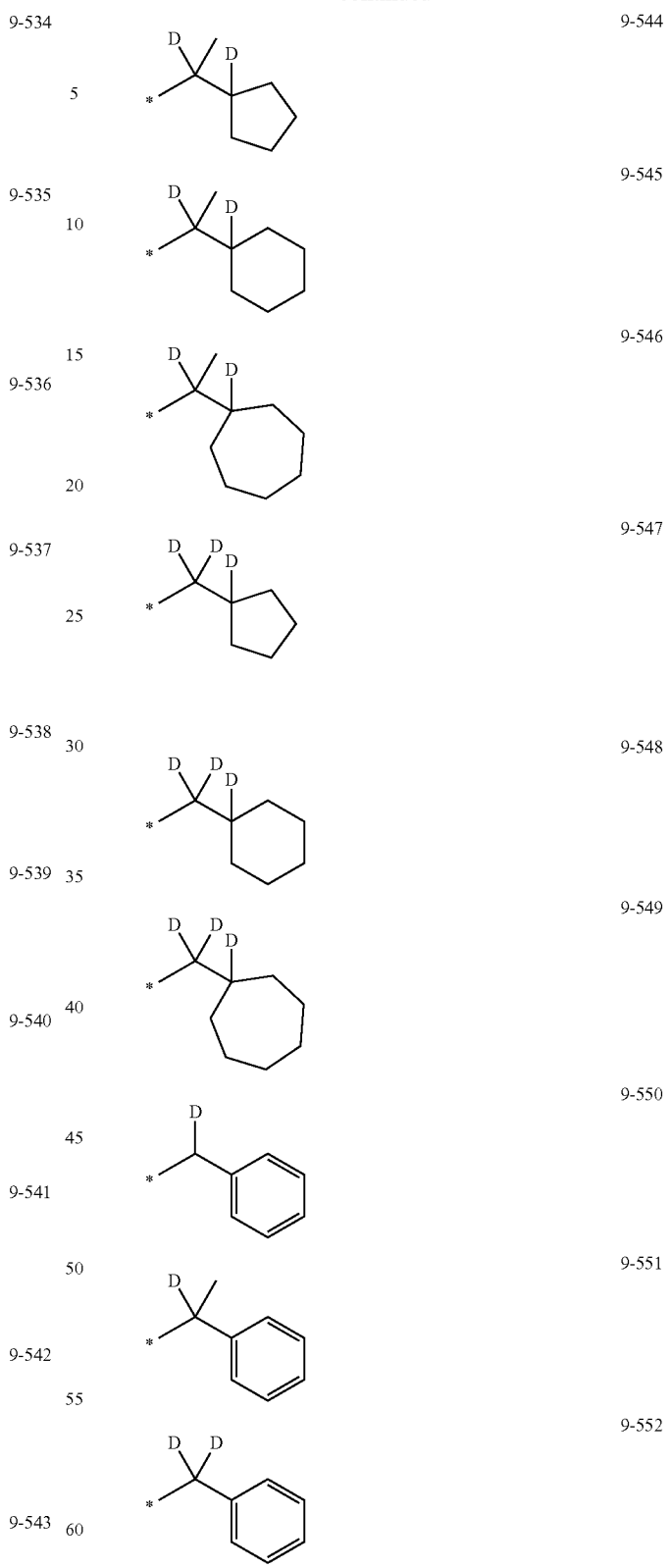
The "group represented by one of Formulae 10-1 to 10-249 in which at least one hydrogen is substituted with deuterium" may be, for example, a group represented by one of Formulae 10-501 to 10-510:

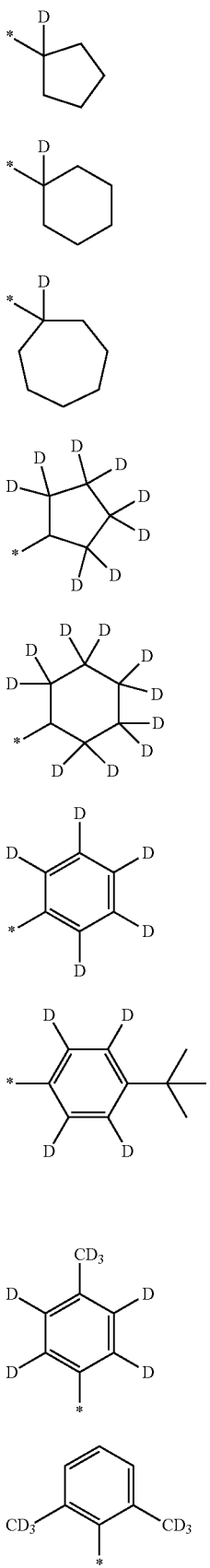

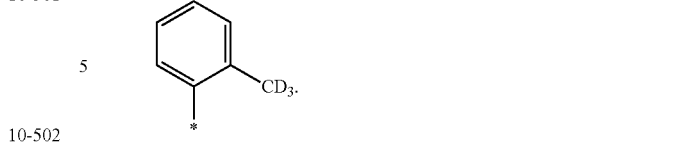

10-501
10-502
10-503
10-504
10-505
10-506
10-507
10-508
10-509
10-510

The terms "a deuterium-containing $C_1$-$C_{60}$ alkyl group (for example, a deuterium-containing $C_1$-$C_{20}$ alkyl group)" and "a deuterium-containing $C_3$-$C_{10}$ cycloalkyl group" as used herein each refer to a $C_1$-$C_{60}$ alkyl group substituted with at least one deuterium (for example, a $C_1$-$C_{20}$ alkyl group substituted with at least one deuterium) and a $C_3$-$C_{10}$ cycloalkyl group substituted with at least one deuterium, respectively. For example, a deuterium-containing methyl group may be —$CDH_2$, —$CD_2H$, or —$CD_3$.

Non-limiting examples of the "$C_1$-$C_{60}$ alkyl group (for example, a $C_1$-$C_{20}$ alkyl group)" include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, and the like, but embodiments of the present disclosure are not limited thereto.

Non-limiting examples of the "$C_2$-$C_{60}$ alkyl group (for example, $C_2$-$C_{20}$ alkyl group)" include groups in which "a methyl group" is excluded from above examples for the "$C_1$-$C_{60}$ alkyl group (for example, $C_1$-$C_{20}$ alkyl group)".

Non-limiting of the "$C_3$-$C_{10}$ cycloalkyl group" include a cyclopentyl group, a cyclohexyl group, a cycloheptyl group, a cyclooctyl group, an adamantyl group, a bicyclo[1.1.1]pentyl group, a bicyclo[2.1.1]hexyl group, a bicyclo[2.2.1]heptyl group, a bicyclo[2.2.2]octyl group, and the like, but embodiments of the present disclosure are not limited thereto.

In Formula 1, two or more of $R_1$ to $R_9$ may optionally be linked to each other to form a $C_5$-$C_{30}$ carbocyclic group unsubstituted or substituted with at least one $R_{1a}$ group or a $C_2$-$C_{30}$ heterocyclic group unsubstituted or substituted with at least one $R_{1a}$ group, and two or more of $R_{10}$ to $R_{12}$ may optionally be linked to each other to form a $C_5$-$C_{30}$ carbocyclic group unsubstituted or substituted with at least one $R_{1a}$ group or a $C_2$-$C_{30}$ heterocyclic group unsubstituted or substituted with at least one $R_{1a}$ group.

For example, the $C_5$-$C_{30}$ carbocyclic group unsubstituted or substituted with at least one $R_{1a}$ group and the $C_2$-$C_{30}$ heterocyclic group unsubstituted or substituted with at least one $R_{1a}$ group may be a cyclopentane group, a cyclohexane group, a cycloheptane group, a cyclooctane group, an adamantane group, a norbornene group, a cyclopentene group, a cyclohexene group, a cycloheptene group, a bicyclo[1.1.1]pentane group, a bicyclo[2.1.1]hexane group, a bicyclo[2.2.1]heptane group, a bicyclo[2.2.2]octane group, a benzene group, a naphthalene group, a fluorene group, a phenanthrene group, an anthracene group, a fluoranthene group, a triphenylene group, a pyrene group, a chrysene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, an isoindole group, an indole group, an indazole group, a purine group, a quinoline group, an isoquinoline group, a benzoquinoline group, a quinoxaline group, a quinazoline group, a cinnoline group, a carbazole group, a phenanthroline group, a benzimidazole group, a benzofuran group, a benzothiophene group, an isobenzothiophene group, a benzoxazole group, an isobenzoxazole group, a triazole group, a tetrazole group, an oxadiazole group, a triazine group, a tetrazine group, a dibenzofuran group, a dibenzothiophene group, a benzocarbazole group, a dibenzocarbazole group, an imidazopyridine group, or an imidazopyrimidine group, each unsubstituted or substituted with at least one $R_{1a}$ group.

$R_{1a}$ may be the same as defined in connection with $R_1$.

For example, the organometallic compound may be one of Compounds 1 to 22, but embodiments of the present disclosure are not limited thereto:

1

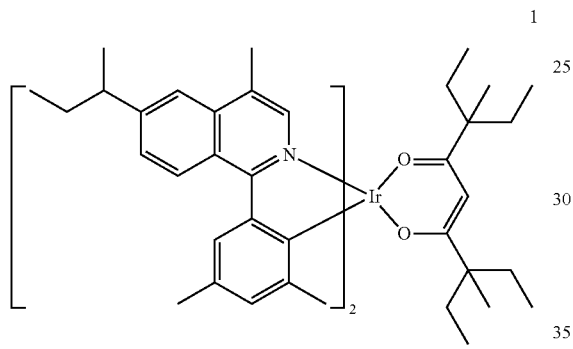

2

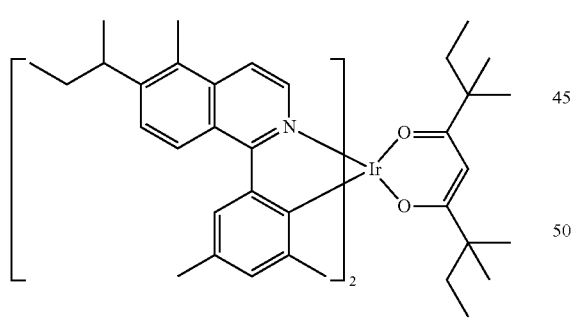

3

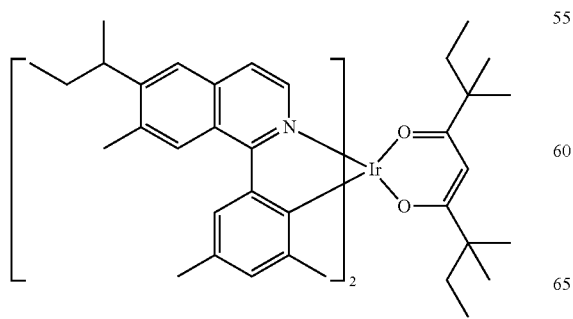

4

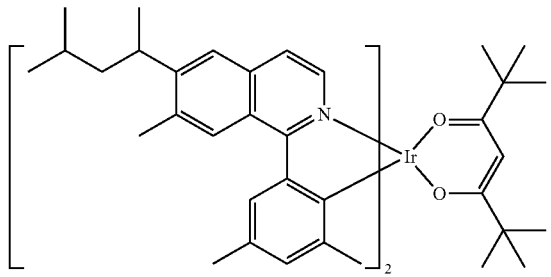

5

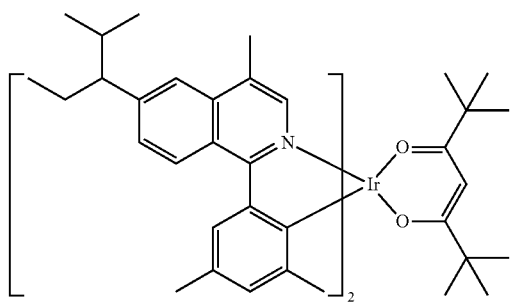

6

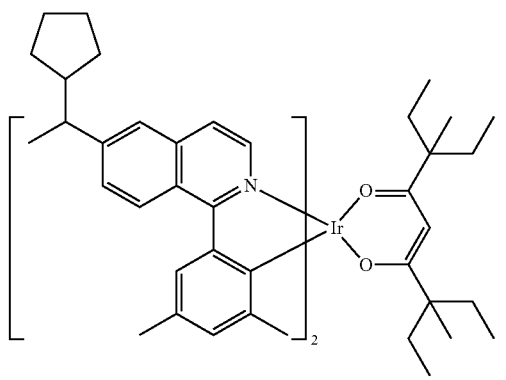

7

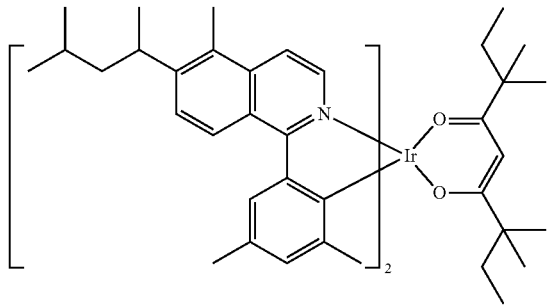

8
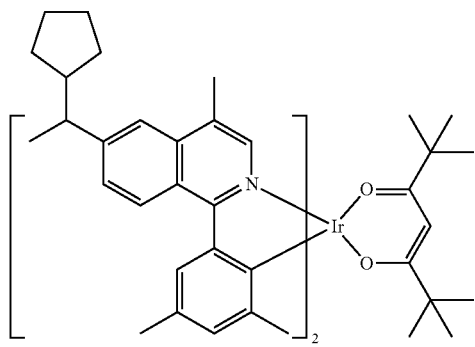
9
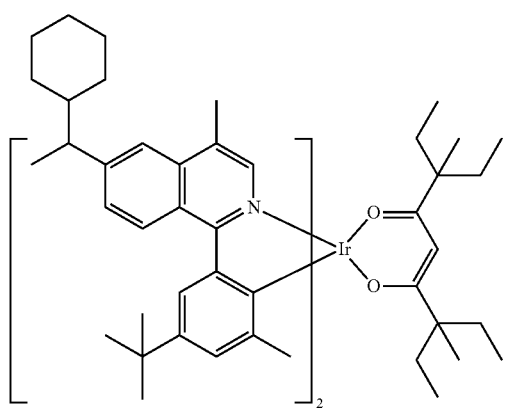
10
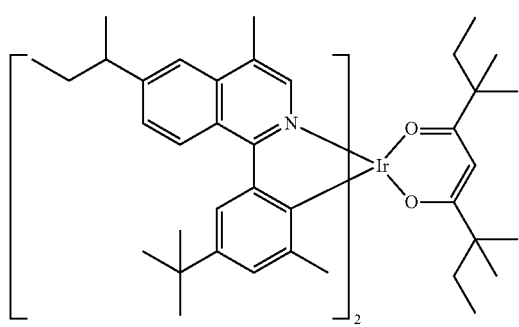
11
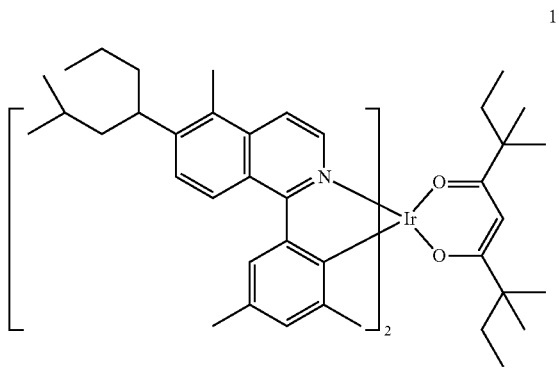
12
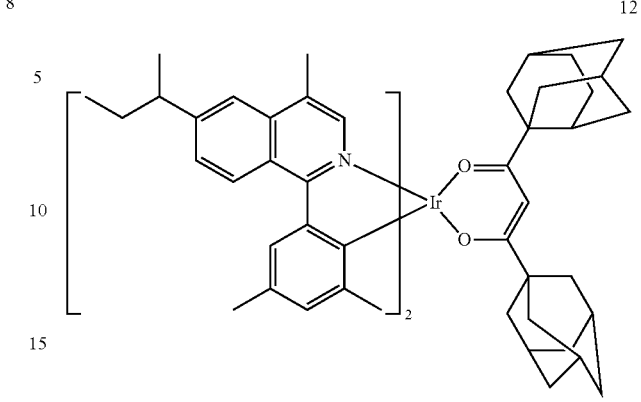
13
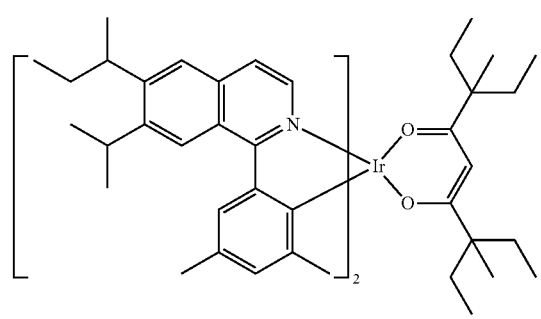
14
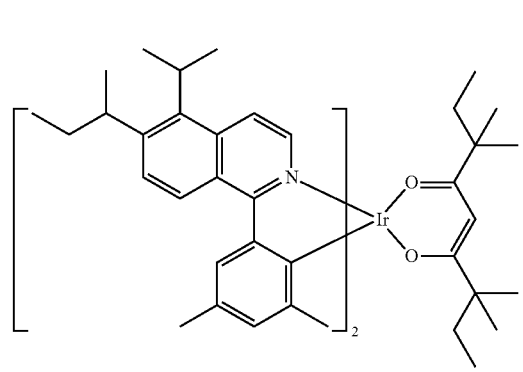
15
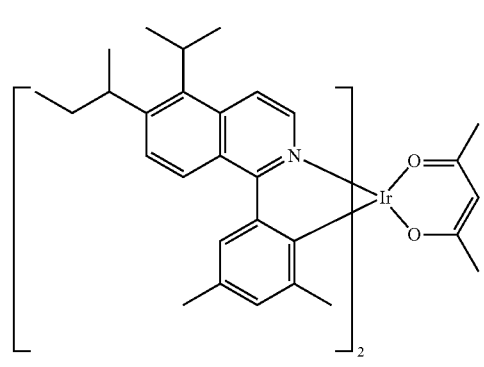

16
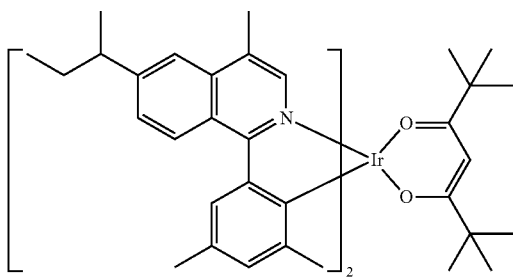

17
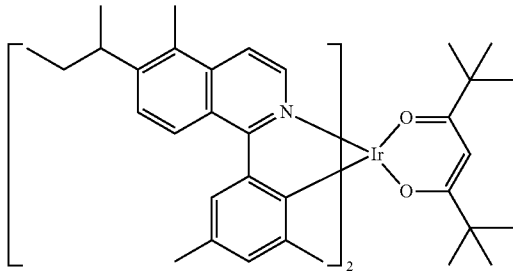

18
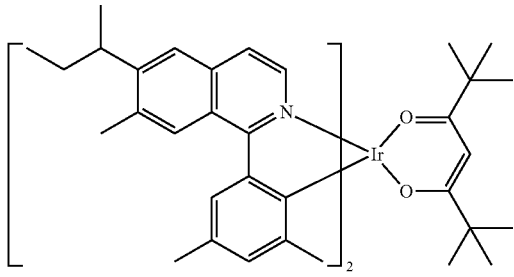

19
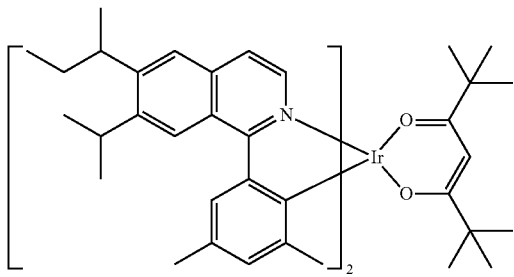

20
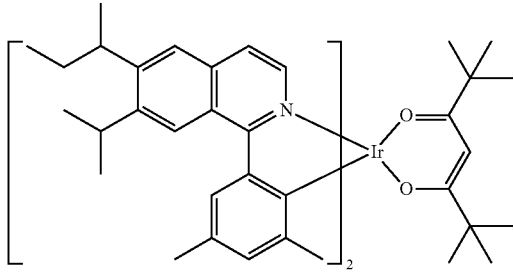

21
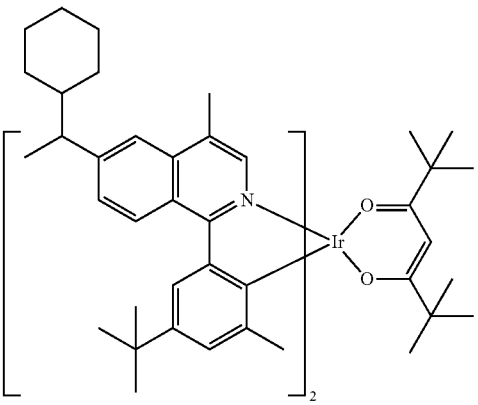

22
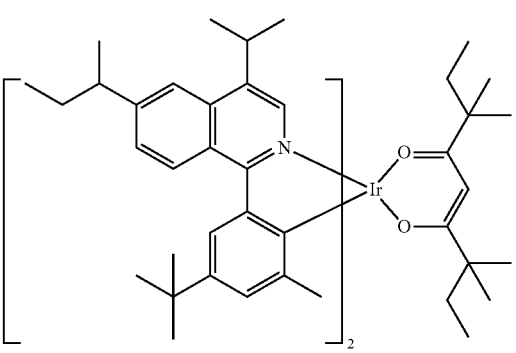

In Formula 1, $R_{21}$ may be a $C_2$-$C_{20}$ alkyl group, a deuterium-containing $C_2$-$C_{20}$ alkyl group, a $C_3$-$C_{10}$ cycloalkyl group, or a deuterium-containing $C_3$-$C_{10}$ cycloalkyl group. In this regard, the organometallic compound represented by Formula 1 may have increased anisotropy so that the horizontal orientation ratio may be increased. Therefore, an electronic device, for example, an organic light-emitting device, including the organometallic compound represented by Formula 1 may have improved luminescence efficiency.

In addition, $R_{22}$ in Formula 1 may be a $C_1$-$C_{20}$ alkyl group, a deuterium-containing $C_1$-$C_{20}$ alkyl group, a $C_3$-$C_{10}$ cycloalkyl group, or a deuterium-containing $C_3$-$C_{10}$ cycloalkyl group. In this regard, the organometallic compound represented by Formula 1 may have improved structural rigidity. Therefore, the organometallic compound represented by Formula 1 may have reduced non-radiative transition. In addition, molecules of the organometallic compound may be structurally elongated along the molecular axis direction of the organometallic compound so that the horizontal orientation ratio may be increased. Therefore, an electronic device, for example, an organic light-emitting device, including the organometallic compound represented by Formula 1 may have improved luminescence efficiency.

Furthermore, at least one of $R_1$ to $R_5$ in Formula 1 may not be hydrogen. For example, at least one of $R_1$ to $R_5$ in Formula 1 may each independently be deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ arylalkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$). Accordingly, an isoquinoline ring, i.e., a lowest unoccupied molecular orbital (LUMO) part, of the organometallic compound represented by Formula 1 may have secured stability, and therefore, an electronic device, for example, an organic light-emitting device, including the organometallic compound may have improved lifespan. In addition, although not limited to a particular theory, the horizontal orientation ratio of the organometallic compound may be increased while full width at half maximum (FWHM) of the organometallic compound may be reduced, when at least one of $R_1$ to $R_5$ in Formula 1 satisfies the definition as described above.

In the organometallic compound represented by Formula 1, the horizontal orientation ratio of a transition dipole moment may be about 90% to about 100%.

For example, the horizontal orientation ratio of the transition dipole moment in the organometallic compound may be, for example, about 90% to about 100%, about 91% to about 100%, about 92% to about 100%, about 93% to about 100%, about 94% to about 100%, about 95% to about 100%, about 96% to about 100%, about 97% to about 100%, about 98% to about 100%, about 99% to about 100%, or 100%, but embodiments of the present disclosure are not limited thereto.

Here, the horizontal orientation ratio of the transition dipole moment refers to a ratio of an organometallic compound having dipole moment that is perpendicular to a film relative to the total organometallic compound included in the films.

The horizontal orientation ratio of the transition dipole moment may be evaluated using an angle-dependent PL measuring device. Such an angle-dependent PL measuring device may be described by referring to, for example, the angle-dependent PL measuring device described in KR Application No. 2013-0150834. The specification of KR Application No. 2013-0150834 is incorporated herein by reference.

Since the organometallic compound represented by Formula 1 has a high horizontal orientation ratio of the transition dipole moment as described above, the organometallic compound represented by Formula 1 is also considered to have a large horizontal orientation transition dipole moment (i.e., a large horizontal orientation photo-orientation). Accordingly, substantial electrical fields traveling in a direction perpendicular to the film including the organometallic compound represented by Formula 1 may be emitted. The light emitted according to such a mechanism may result in high external purge efficiency (i.e., efficiency at which the light emitted from the organometallic compound represented by Formula 1 is purged to the outside from a device (for example, an organic light-emitting device) including a film (for example, an emission layer to be described later) including the organometallic compound represented by Formula 1. Therefore, an electronic device, for example, an organic light-emitting device, including the organometallic compound represented by Formula 1 may achieve high luminescence efficiency.

Synthesis methods of the organometallic compound represented by Formula 1 may be understood by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect of the present disclosure provides an organic light-emitting device including: a first electrode; a second electrode; and an organic layer disposed between the first electrode and the second electrode and including an emission layer, wherein the organic layer includes at least one organometallic compound represented by Formula 1.

The organic light-emitting device may have, due to the inclusion of an organic layer including the organometallic compound represented by Formula 1, a low driving voltage, relatively reduced FWHM, a long lifespan and/or high luminescent efficiency.

The organometallic compound represented by Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, in the emission layer, an amount of the organometallic compound represented by Formula 1 is smaller than an amount of the host).

In an embodiment, the emission layer may emit red light.

The expression "(an organic layer) includes at least one organometallic compounds" as used herein may include a case in which "(an organic layer) includes identical organometallic compounds represented by Formula 1" and a case in which "(an organic layer) includes two or more different organometallic compounds represented by Formula 1".

In an exemplary embodiment, the organic layer may include, as the organometallic compound, only Compound 1. In this regard, Compound 1 may exist only in the emission layer of the organic light-emitting device. In an embodiment, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region between the first electrode and the emission layer and an electron transport region between the emission layer and the second electrode, and the hole transport region includes a hole injection layer, a hole transport layer, an electron blocking layer, a buffer layer, or any combination thereof, and the electron transport region includes a hole blocking layer, an electron transport layer, an electron injection layer, or any combination thereof.

The term "organic layer" as used herein refers to a single layer and/or a plurality of layers disposed between the first electrode and the second electrode of an organic light-emitting device. The "organic layer" may include, in addition to an organic compound, an organometallic complex including metal.

FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may include a material with a high work function to facilitate hole injection. The first electrode 11 may be a reflective electrode, a semi-transmissive electrode, or a transmissive electrode. The material for forming the first electrode 11 may be, for example, indium tin oxide (ITO), indium zinc oxide (IZO), tin oxide ($SnO_2$), zinc oxide (ZnO), or any combination thereof. In an embodiment, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In an embodiment, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (PAN I/D BSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

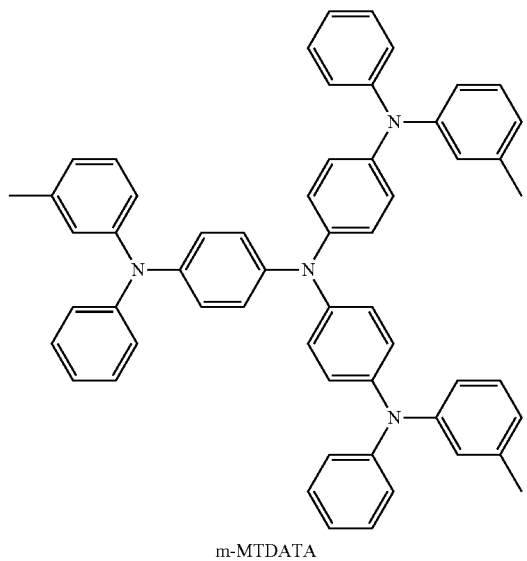

m-MTDATA

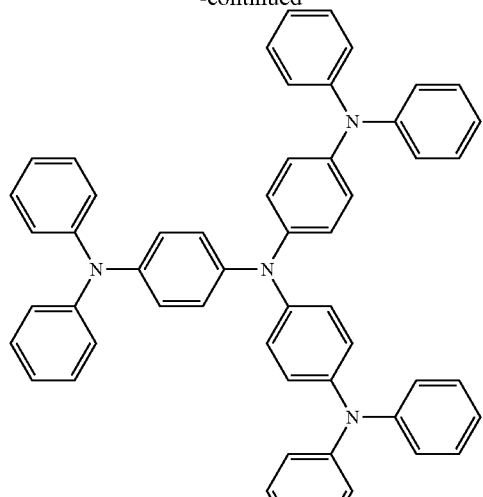
TDATA
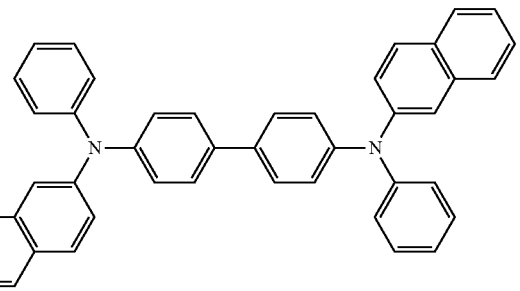
β-NPB
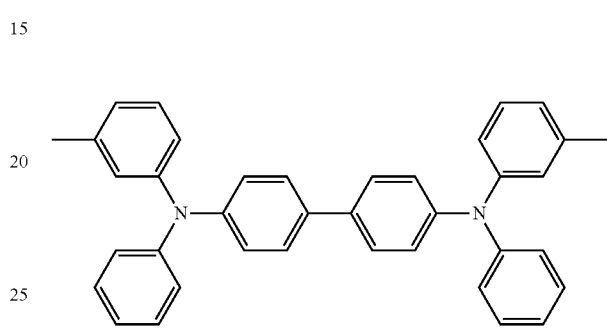
TPD
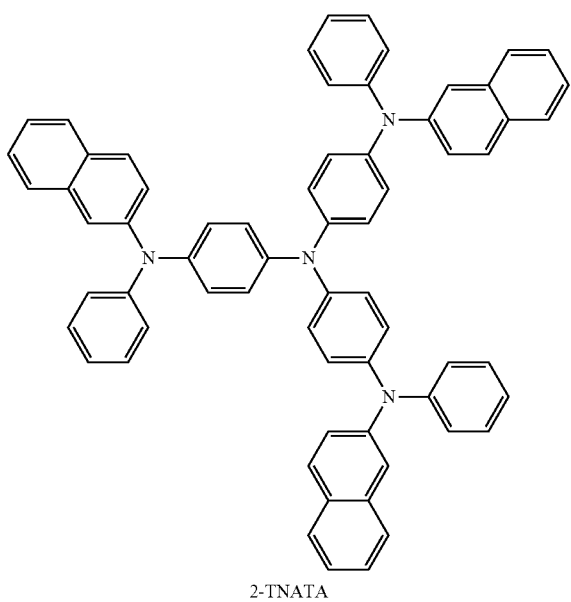
2-TNATA
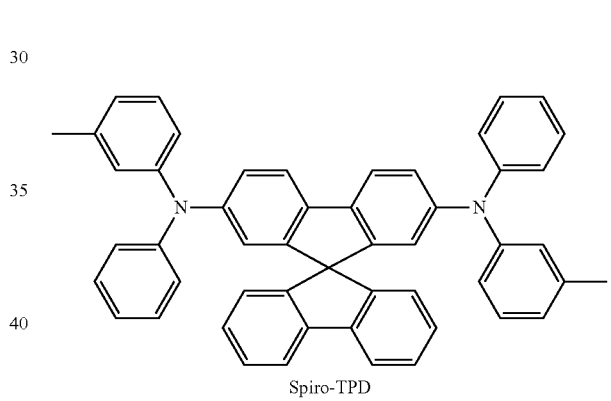
Spiro-TPD
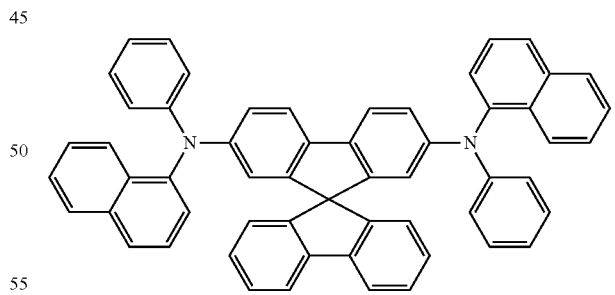
Spiro-NPD
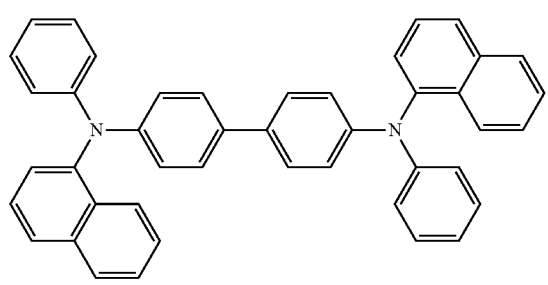
NPB
methylated NPB

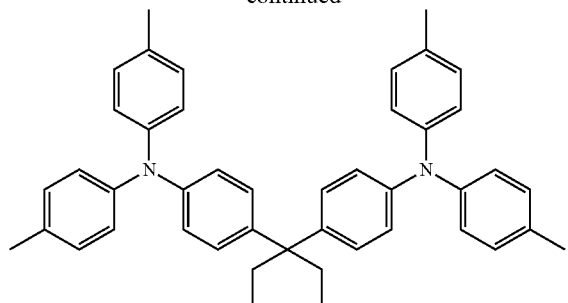

TAPC

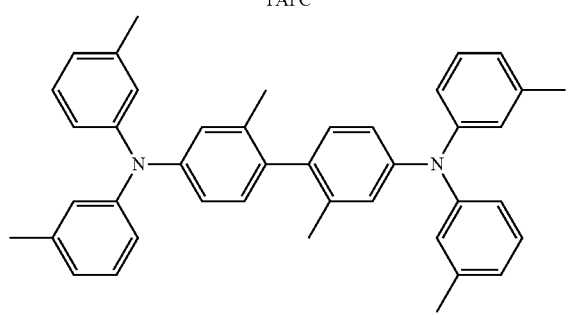

HMTPD

Formula 201

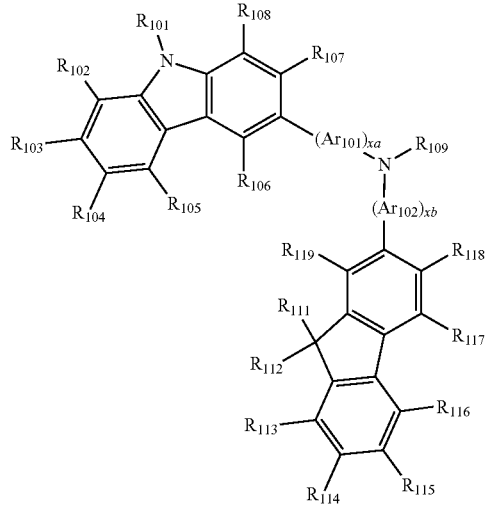

Formula 202

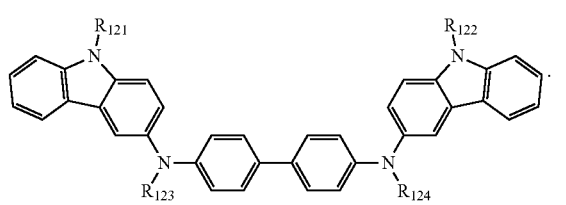

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_7$-$C_{60}$ arylalkyl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5, or may be 0, 1, or 2. For example, xa may be 1 and xb may be 0, but xa and xb are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof; but embodiments of the present disclosure are not limited thereto.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In an embodiment, the compound represented by Formula 201 may be represented by Formula 201A below, but embodiments of the present disclosure are not limited thereto:

Formula 201A
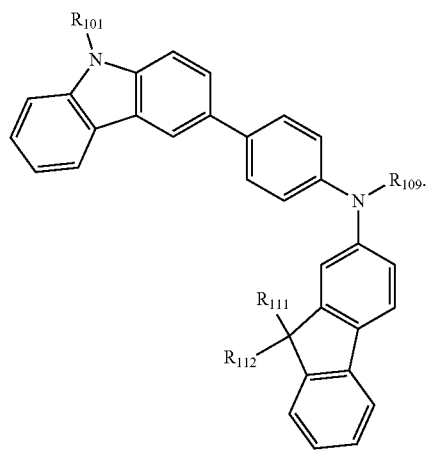
Detailed descriptions about $R_{101}$, $R_{111}$, $R_{112}$, and $R_{109}$ in Formula 201A are already described above.
In an exemplary embodiment, the compound represented by Formula 201 and the compound represented by Formula 202 may each include Compounds HT1 to HT20 illustrated below, but are not limited thereto:
HT1
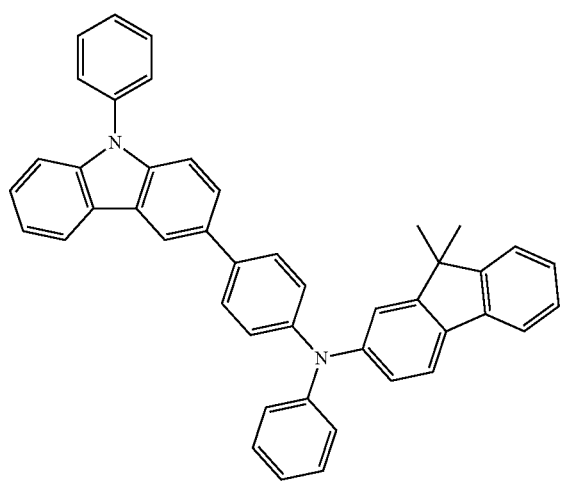
HT2
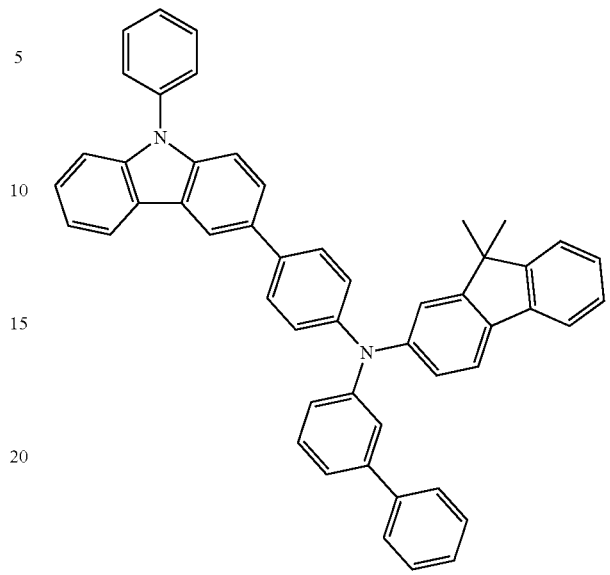
HT3
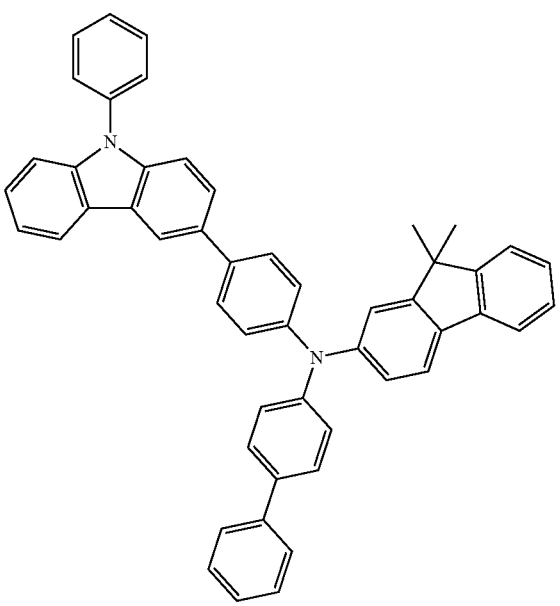

HT4
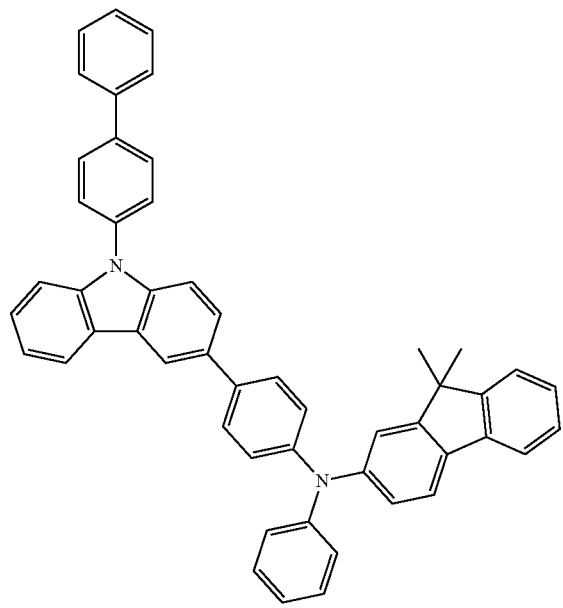
HT5
HT6
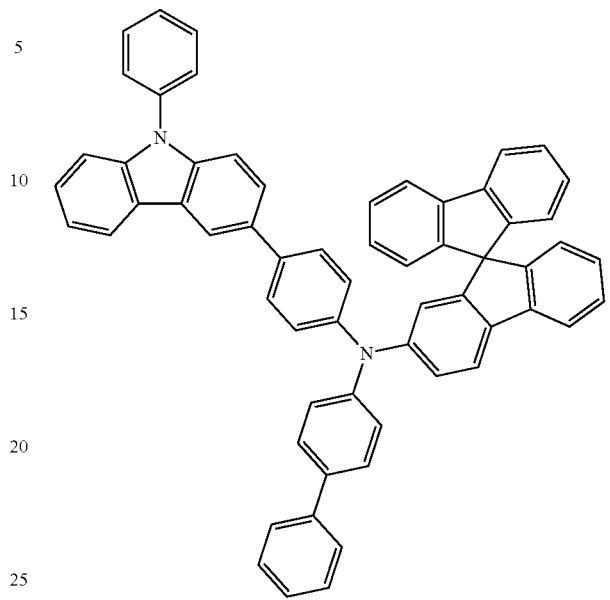
HT7
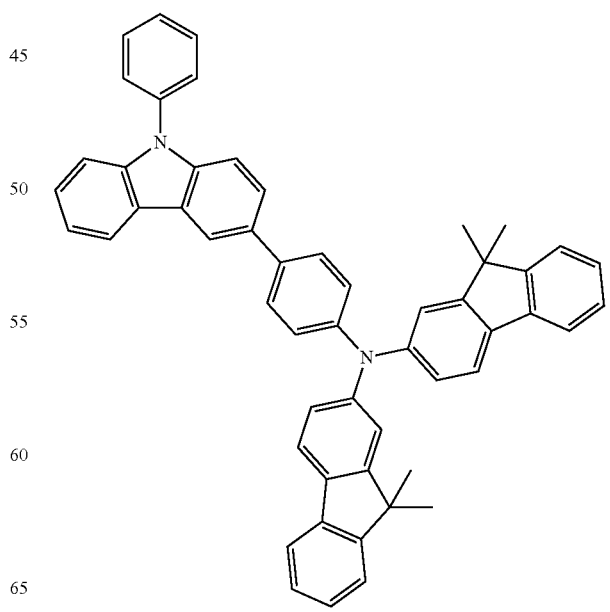

HT8
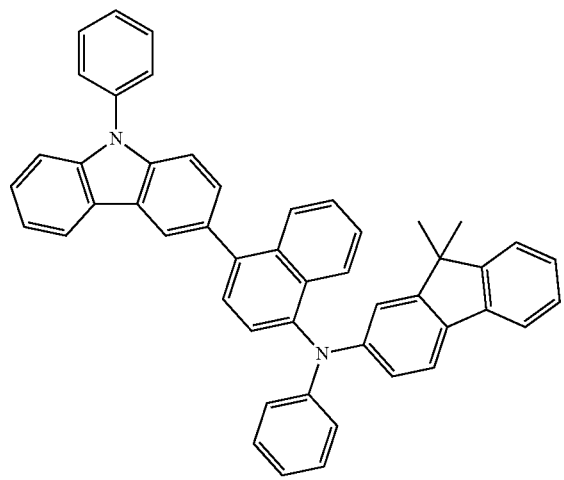
HT9
HT10
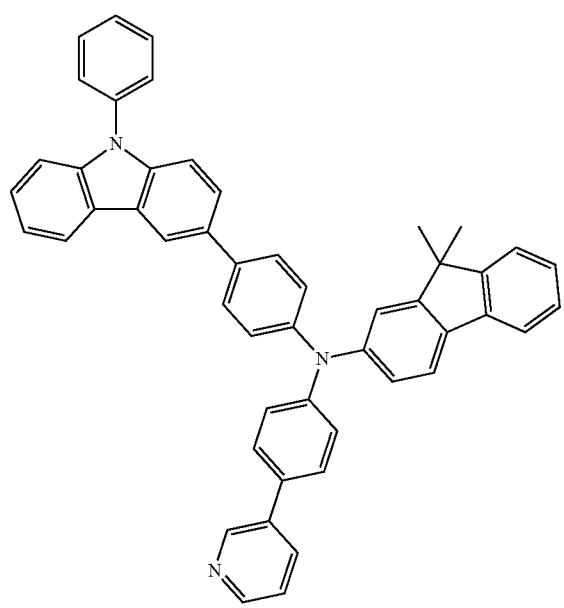
HT11
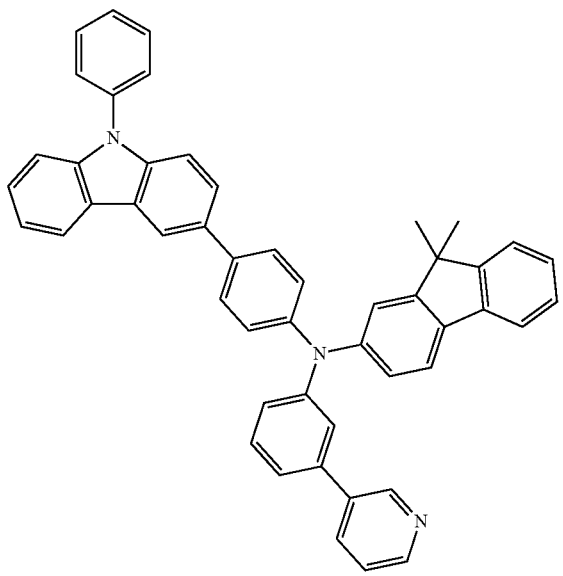
HT12
HT13
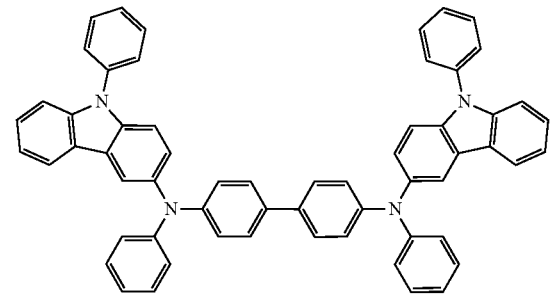

HT14
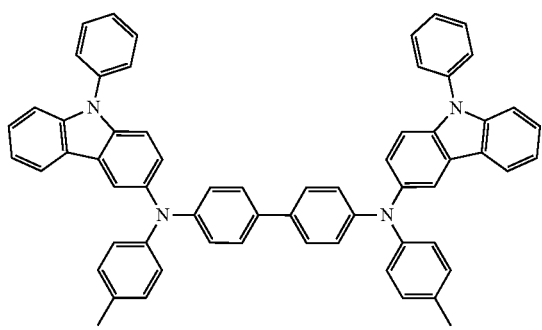

HT18
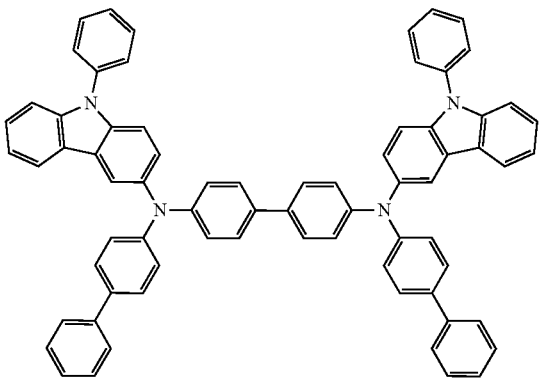

HT15
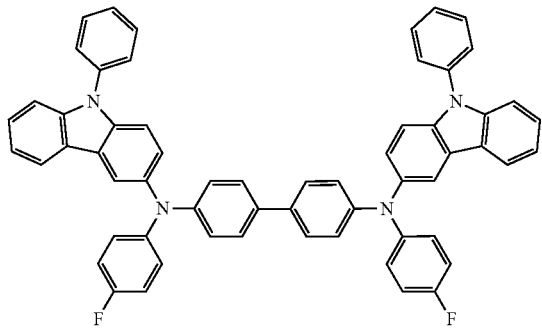

HT19
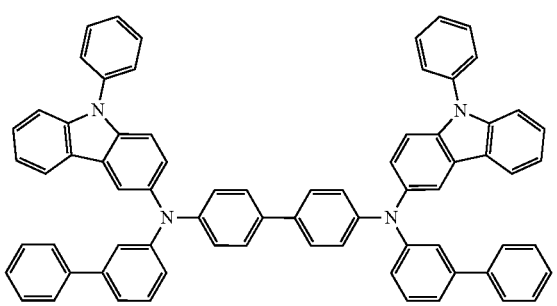

HT16
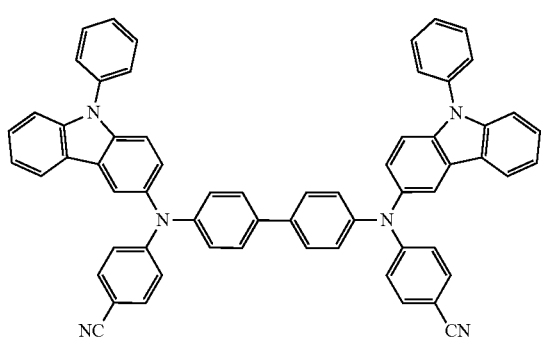

HT20
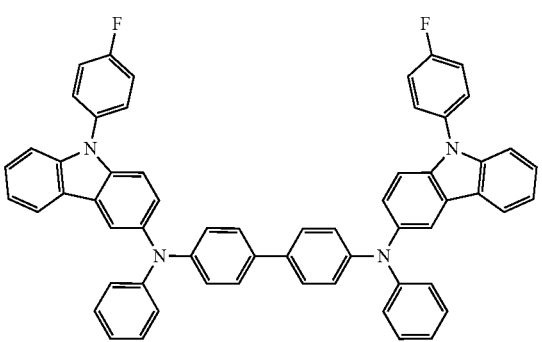

HT17
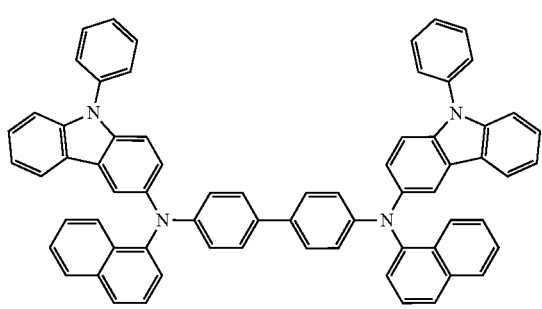

A thickness of the hole transport region may be from about 100 Å to about 10,000 Å, for example, about 100 Å to about 1,000 Å. When the hole transport region includes a hole injection layer, a hole transport layer, or any combination thereof, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof, but embodiments of the present disclosure are not limited thereto. Non-limiting examples of the p-dopant are a quinone derivative, such as tetracyanoquinodimethane (TCNQ) or 2,3,5,6-tetrafluoro-tetracyano-1,4-benzoquinodimethane (F4-TCNQ); a metal oxide, such as a tungsten oxide or a molybdenum oxide; and a cyano group-containing compound, such as Compound HT-D1 below, but are not limited thereto:

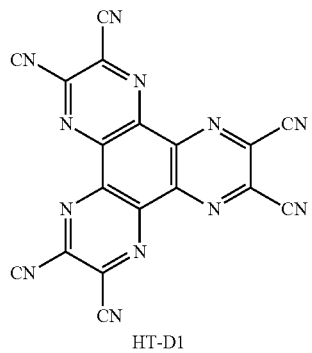

HT-D1

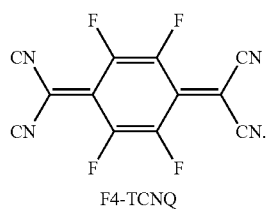

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for the electron blocking layer may be a material for the hole transport region described above, a material for a host to be explained later, or any combination thereof. However, the material for the electron blocking layer is not limited thereto. For example, when the hole transport region includes an electron blocking layer, a material for the electron blocking layer may be mCP, which will be explained later.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

The emission layer may include a host and a dopant, and the dopant may include the organometallic compound represented by Formula 1.

The host may include TPBi, TBADN, ADN (also referred to as "DNA"), CBP, CDBP, TCP, mCP, Compound H50, Compound H51, Compound 52, or any combination thereof:

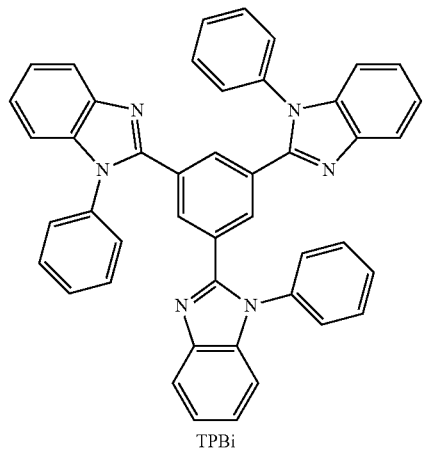

TPBi

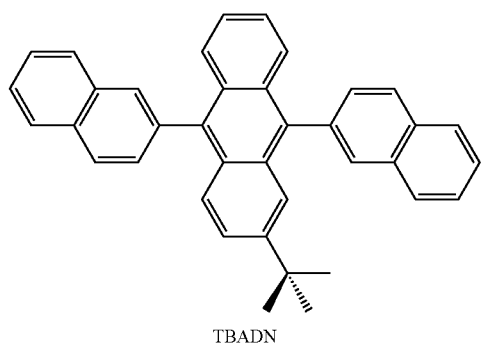

TBADN

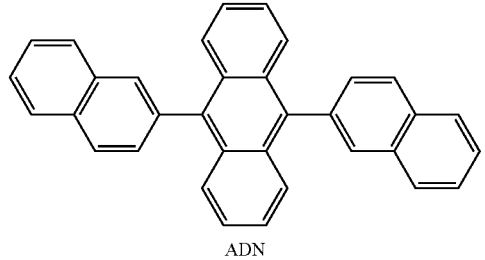

ADN

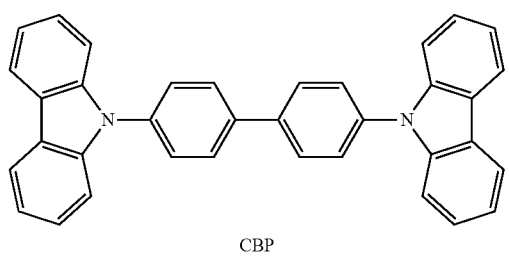

CBP

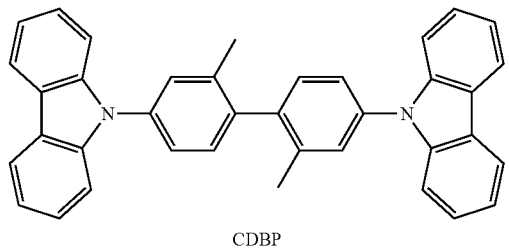

CDBP

-continued

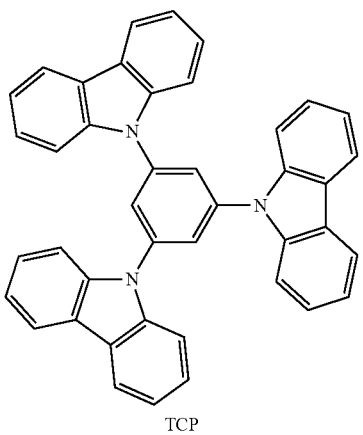
TCP

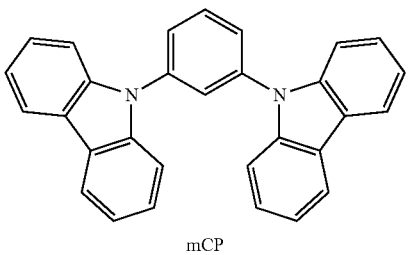
mCP

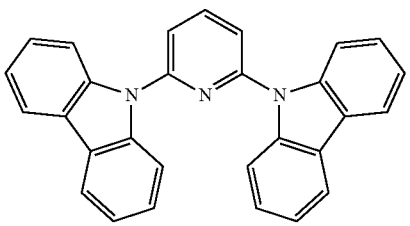
H50

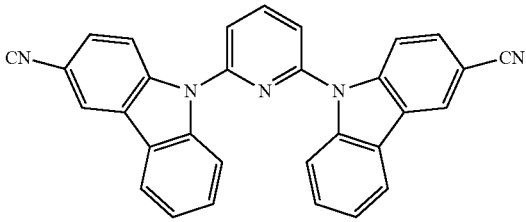
H51

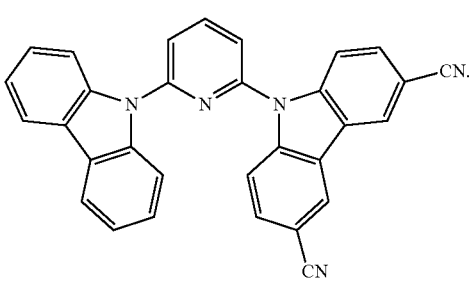
H52

When the organic light-emitting device is a full-color organic light-emitting device, the emission layer may be patterned into a red emission layer, a green emission layer, and/or a blue emission layer. In an embodiment, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof, but embodiments of the present disclosure are not limited thereto:

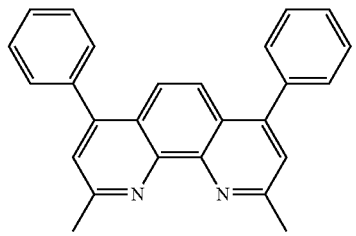
BCP

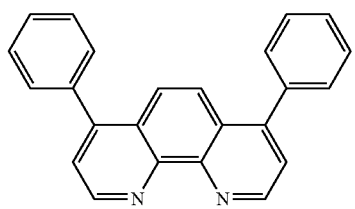
Bphen

A thickness of the hole blocking layer may be from about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may include BCP, Bphen, Alq3, BAlq, TAZ, NTAZ, or any combination thereof:
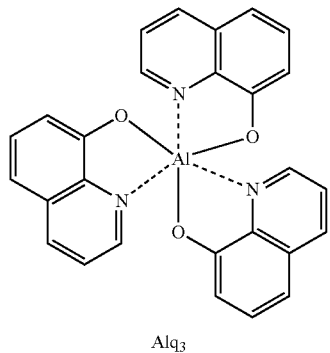
Alq₃
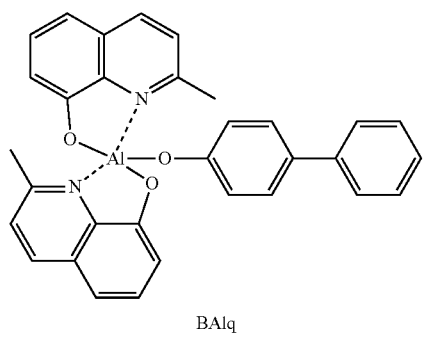
BAlq
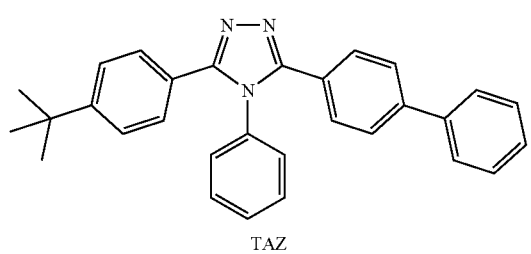
TAZ
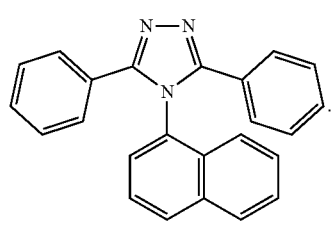
NTAZ
In an embodiment, the electron transport layer may include ET1 to ET25, but are not limited thereto:
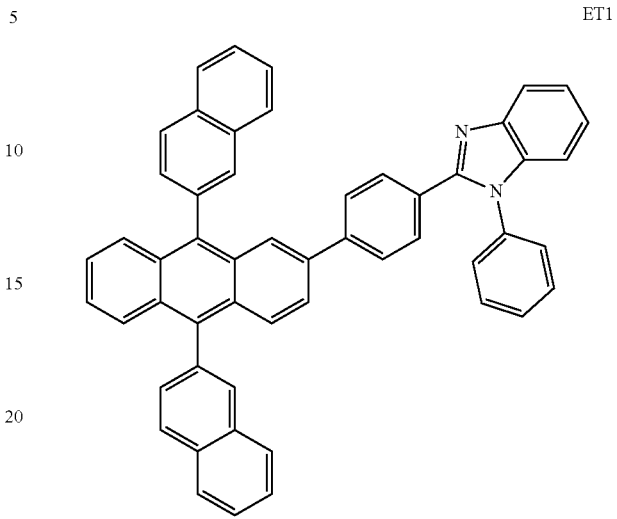
ET1
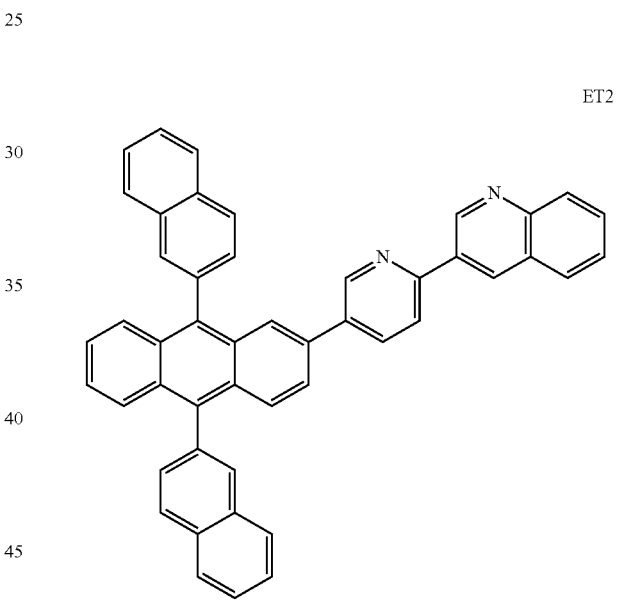
ET2
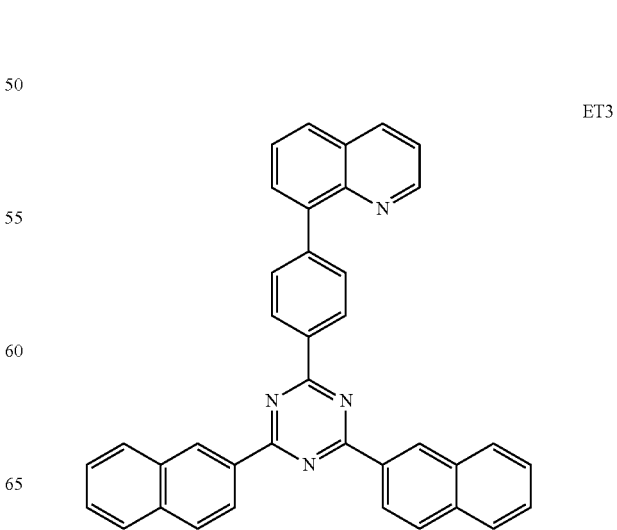
ET3

81
-continued
ET4
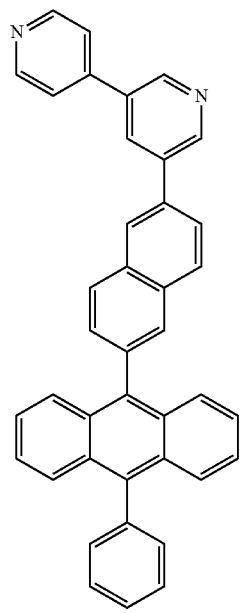
ET5
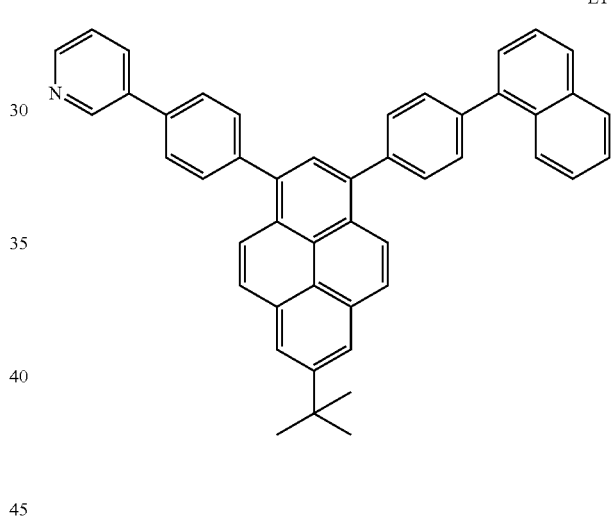
82
-continued
ET7
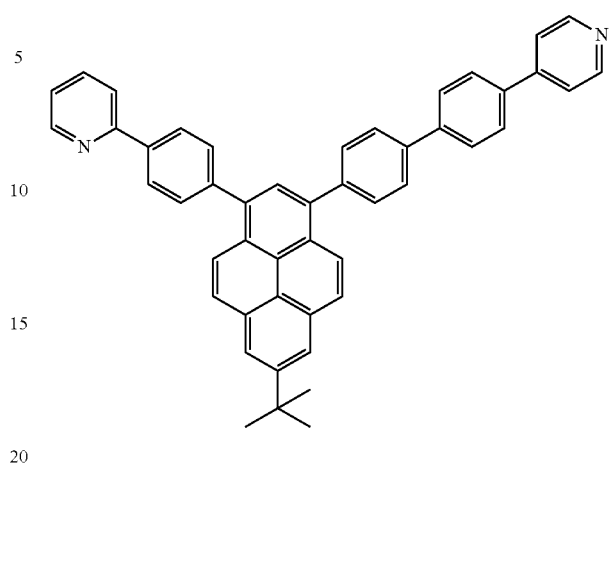
ET8
ET6
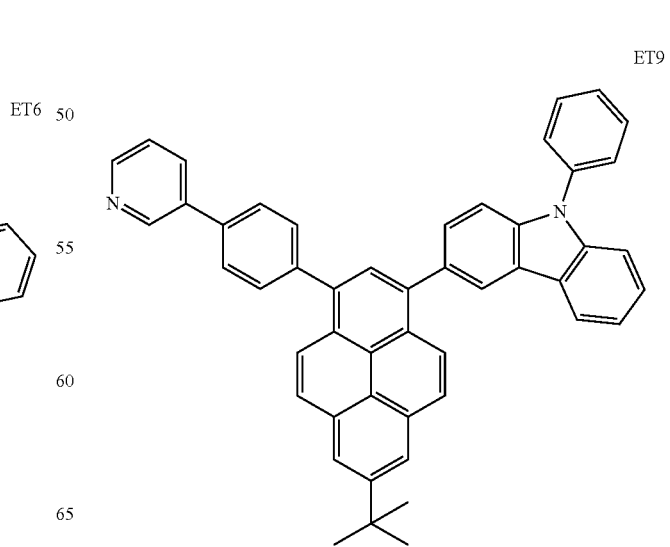
ET9

ET10
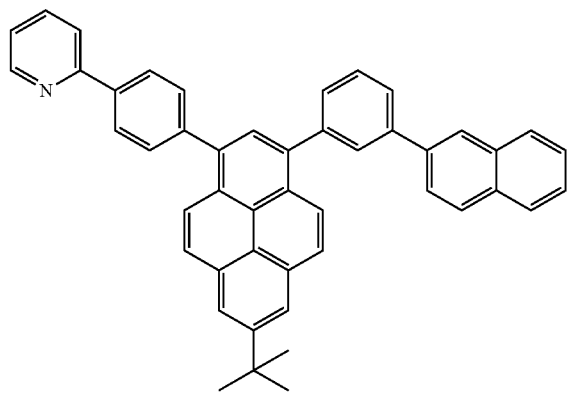
ET11
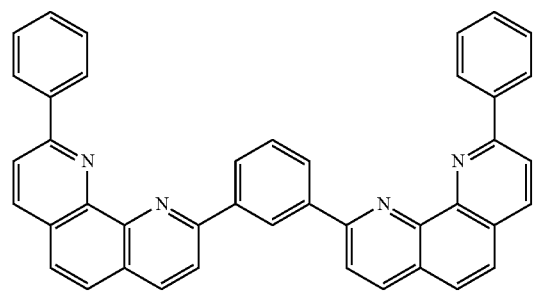
ET12
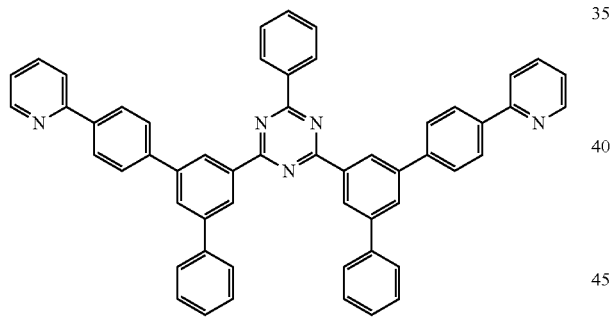
ET13
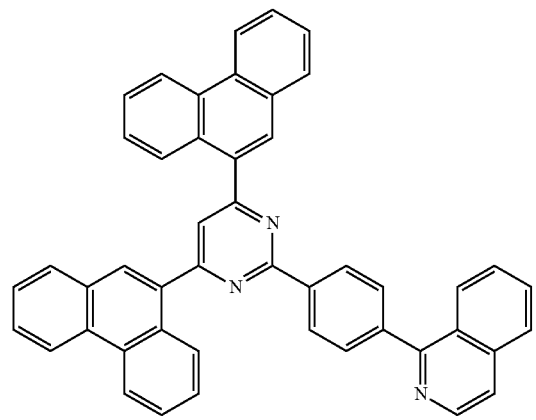
ET14
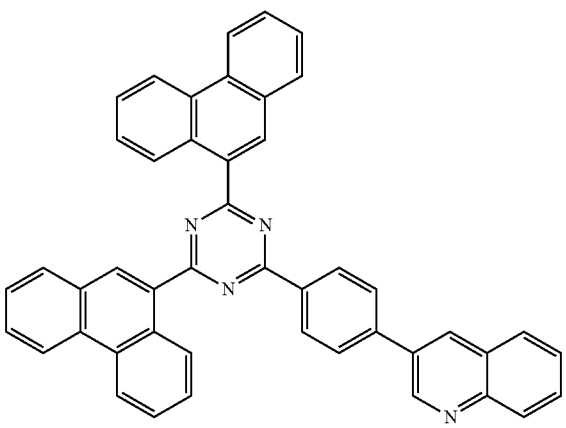
ET15
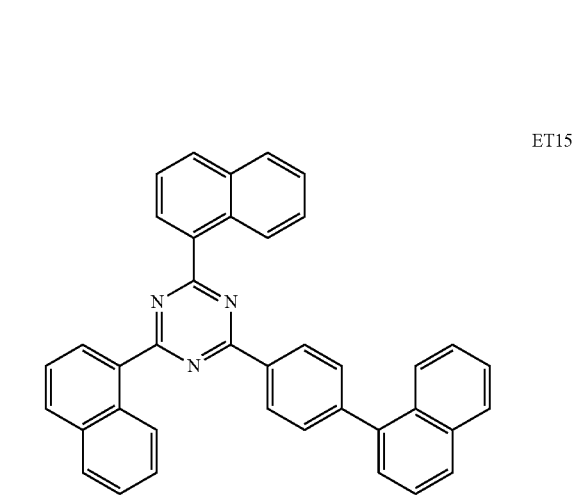
ET16
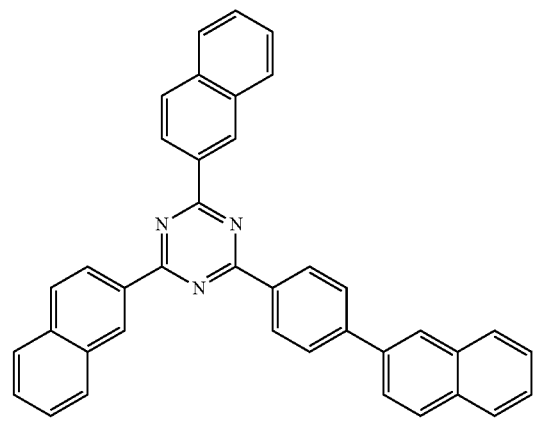

ET17
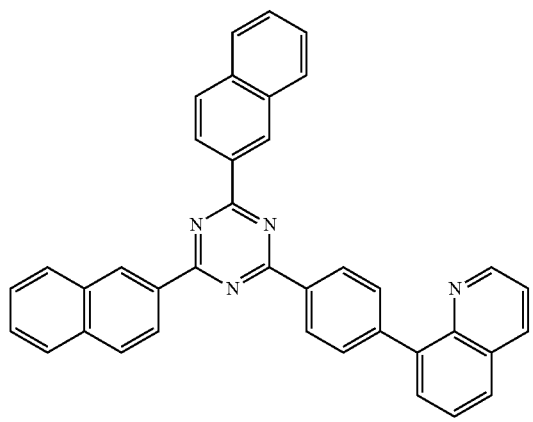
ET20
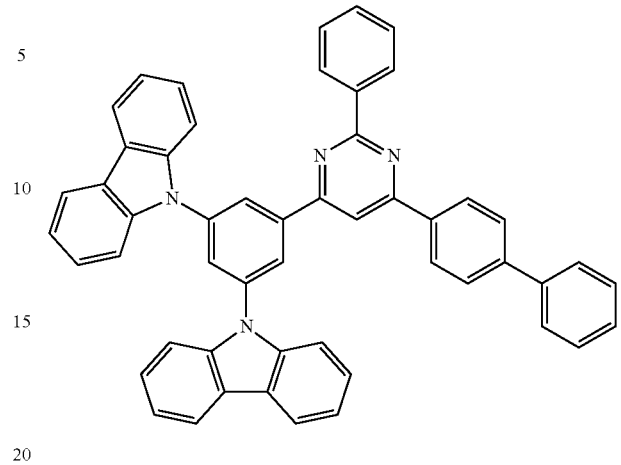
ET18
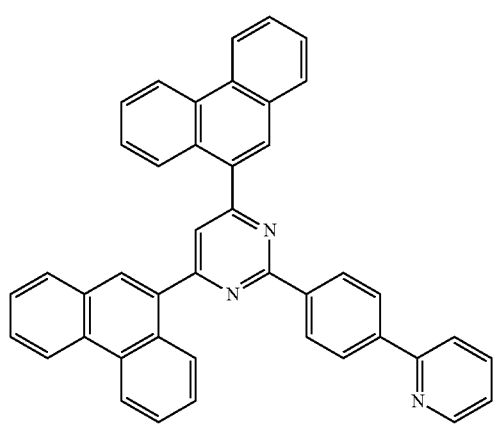
ET21
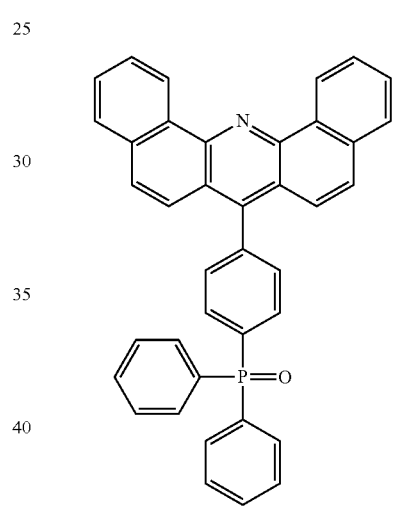
ET19
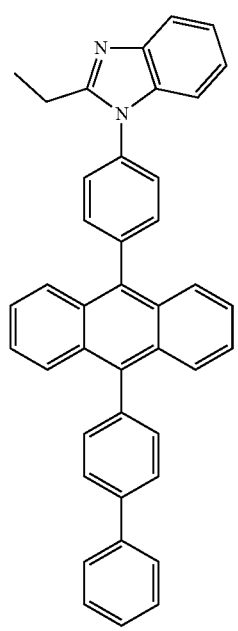
ET22
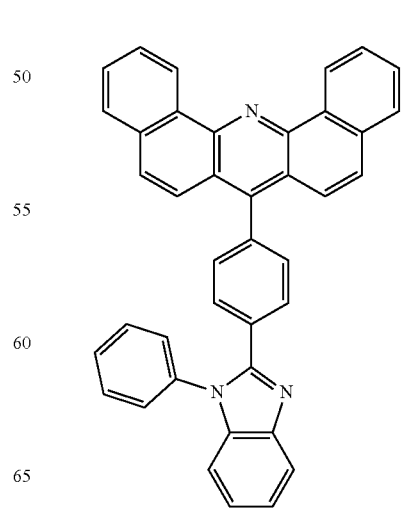

ET23

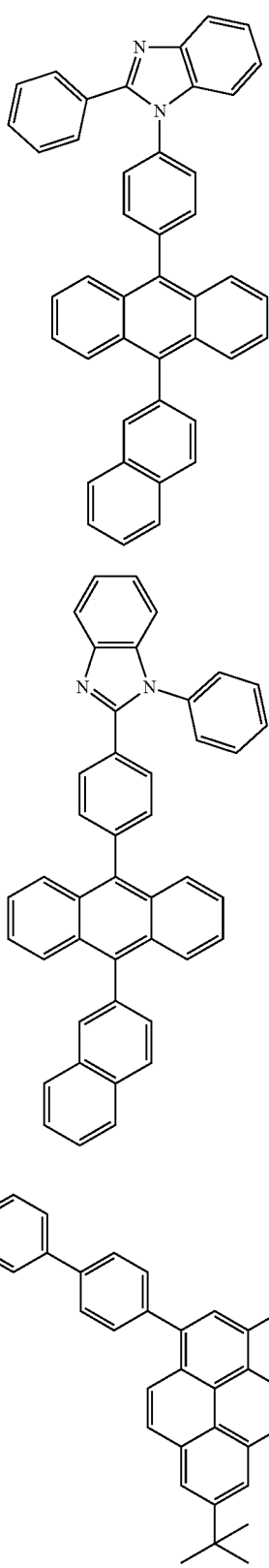

ET24

ET25

A thickness of the electron transport layer may be from about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (LiQ) or ET-D2:

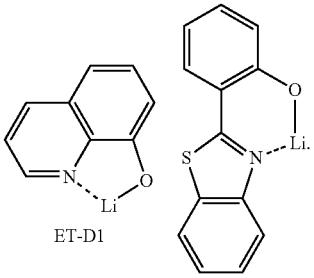

ET-D1

ET-D2

The electron transport region may include an electron injection layer that promotes flow of electrons from the second electrode 19 thereinto.

The electron injection layer may include LiF, NaCl, CsF, $Li_2O$, BaO, or any combination thereof.

A thickness of the electron transport layer may be from about 1 Å to about 100 Å, for example, about 3 Å to about 90 Å. When a thickness of the electron injection layer is within these ranges, satisfactory electron injection characteristics may be obtained without substantial increase in driving voltage.

The second electrode 19 is disposed on the organic layer 15. The second electrode 19 may be a cathode. A material for forming the second electrode 19 may be a metal, an alloy, an electrically conductive compound, or any combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device according to an embodiment has been described in connection with the FIGURE.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by—$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having a carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_2$-$C_{10}$ heterocycloalkyl group" as used herein refers to a monovalent saturated monocyclic group having N, O, P, Se, Si, S, or any combination thereof as a ring-forming atom and 1 to 10 carbon atoms, and non-limiting examples thereof include a tetrahydrofuranyl group, and a tetrahydrothiophenyl group. The term "$C_2$-$C_{10}$ heterocycloalkylene group" as used herein refers to a divalent group having the same structure as the $C_2$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has N, O, P, Si, Se, S, or any combination thereof as a ring-forming atom, 1 to 10 carbon atoms, and at least one double bond in its ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a cyclic aromatic system that has N, O, P, Si, Se, S, or any combination thereof as a ring-forming atom, in addition to 1 to 60 carbon atoms. The term "$C_1$-$C_{60}$ heteroarylene group" as used herein refers to a divalent group having a cyclic aromatic system that has N, O, P, Si, Se, S, or any combination thereof as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" used herein indicates-$OA_{102}$ (wherein $A_{102}$ is the $C_6$-$C_{60}$ aryl group), and a $C_6$-$C_{60}$ arylthio group used herein indicates-$SA_{103}$ (wherein $A_{103}$ is the $C_6$-$C_{60}$ aryl group).

The term "$C_7$-$C_{60}$ arylalkyl group" as used herein refers to an alkylene group substituted with an aryl group. A non-limiting example of a $C_7$-$C_{60}$ arylalkyl group includes a —$CH_2$-phenyl (i.e., benzyl) group and a —$CH_2$-naphthyl group.

The term "$C_2$-$C_{60}$ heteroarylalkyl group" as used herein refers to an alkylene group substituted with a heteroaryl group. A non-limiting example of a $C_2$-$C_{60}$ heteroarylalkyl group includes a —$CH_2$-pyridyl group.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group (or, $C_5$-$C_{30}$ carbocyclic group)" as used herein refers to a saturated or unsaturated cyclic group having, as a ring-forming atom, 5 to 60 carbon atoms (or, 5 to 30 carbon atoms) only. The $C_5$-$C_{60}$ carbocyclic group (or, $C_5$-$C_{30}$ carbocyclic group) may be a monocyclic group or a polycyclic group.

The term "$C_1$-$C_{60}$ heterocyclic group (or, $C_1$-$C_{30}$ heterocyclic group)" as used herein refers to a saturated or unsaturated cyclic group having, as a ring-forming atom, N, O, Si, P, Se, S, or any combination thereof other than 1 to 60 carbon atoms (or, 1 to 30 carbon atoms). The $C_1$-$C_{60}$ heterocyclic group (or, $C_1$-$C_{30}$ heterocyclic group) may be a monocyclic group or a polycyclic group.

A substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ arylalkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ heteroarylalkyl group, the substituted monovalent non-aromatic condensed polycyclic group and substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl group, a $C_6$-$C_{60}$ aryloxy group, a $C_6$-$C_{60}$ arylthio group, a $C_1$-$C_{60}$ heteroaryl group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl group, a $C_6$-$C_{60}$ aryloxy group, a $C_6$-$C_{60}$ arylthio group, a $C_1$-$C_{60}$ heteroaryl group, a $C_2$-$C_{60}$ heteroarylalkyl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ arylalkyl group, a $C_6$-$C_{60}$ aryloxy group, a $C_6$-$C_{60}$ arylthio group, a $C_1$-$C_{60}$ heteroaryl group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), P(=O)($Q_{38}$)($Q_{39}$) or —P($Q_{38}$)($Q_{39}$); or any combination thereof.

$Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —$C_1$; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of B used was identical to an amount of A used, in terms of a molar equivalent.

EXAMPLES

Synthesis of Compound 1

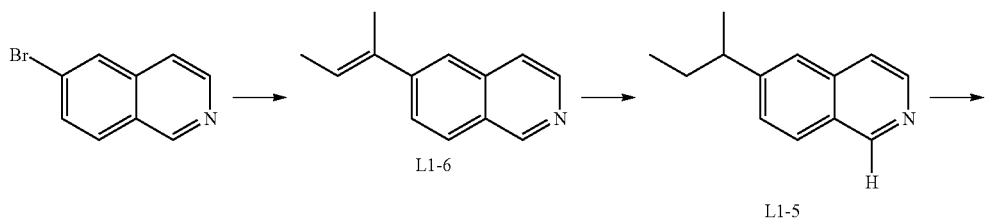

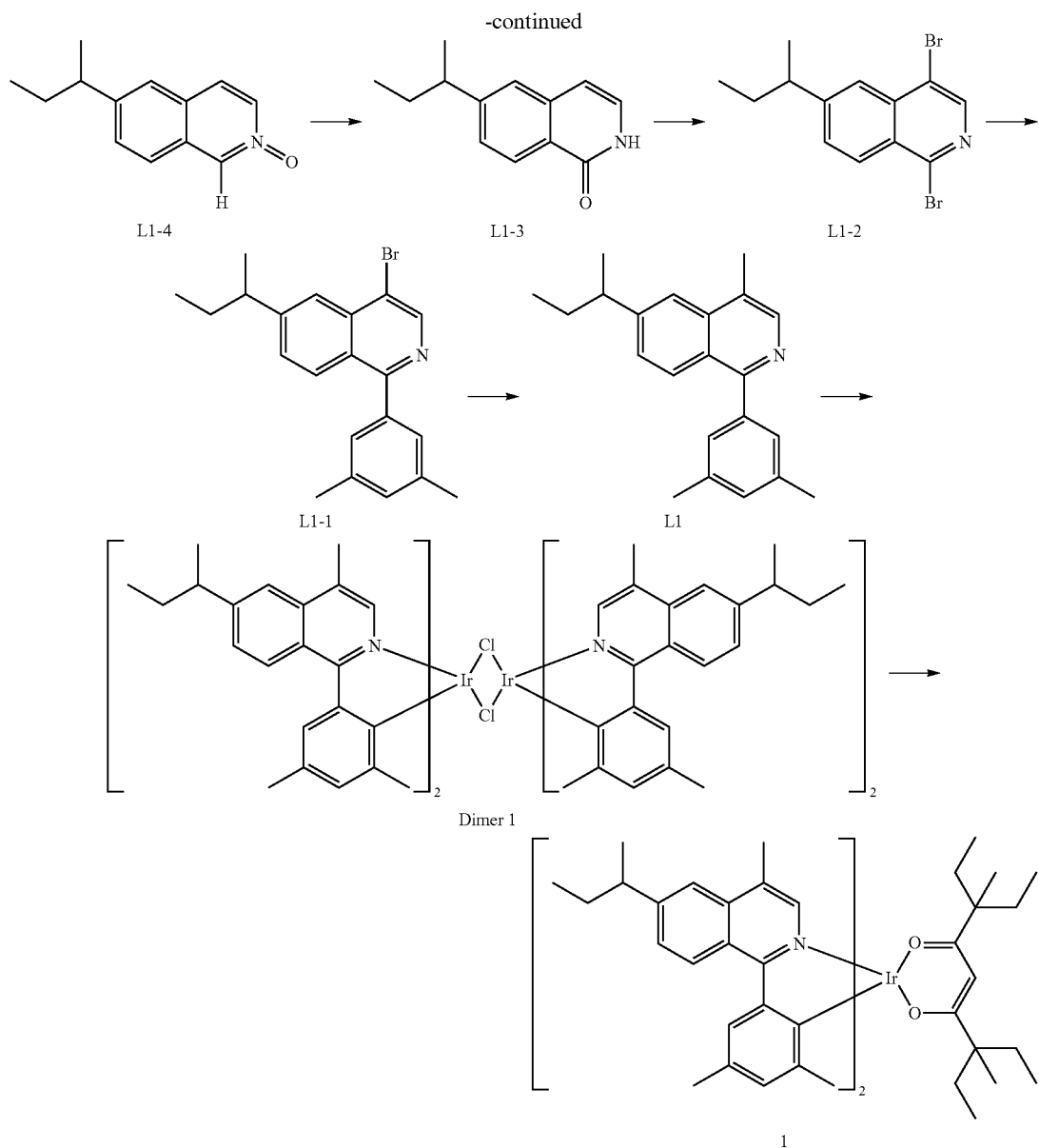

Synthesis of Intermediate L1-6

44 g (181.4 mmol) of 6-bromoisoquinoline was mixed with 400 ml of tetrahydrofuran (THF) and 100 ml of water, 33.0 g (181.4 mmol) of sec-butenylboronic acid, 14.7 g (12.7 mmol) of a Pd(PPh$_3$)$_4$, and 63.0 g (453.0 mmol) of K$_2$CO$_3$ were added thereto, and the mixture was heated under reflux at a temperature of 80° C. for 18 hours. After the completion of the reaction, the reaction mixture was concentrated under reduced pressure, and an extraction process was performed thereon using 200 ml of ethyl acetate. An organic layer obtained therefrom was then dried with magnesium sulfate, and then, subjected to distillation under reduced pressure. The resulting product was purified by liquid chromatography, thereby obtaining 18.0 g (yield: 46%) of Intermediate L1-6.

Synthesis of Intermediate L1-5

1.0 g (55.3 mmol) of Intermediate L1-6 was mixed with 200 ml of methanol, and 1.0 g (10 wt %) of a Pd(PPh$_3$)$_4$ was added thereto. By injecting hydrogen thereto, the mixed solution was stirred for 18 hours. After the completion of the reaction, the reaction mixture was passed through a celite pad, and then, concentrated under reduced pressure. The resulting product was purified by liquid chromatography, thereby obtaining 9.7 g (yield: 95%) of Intermediate L1-5.

Synthesis of Intermediate L1-4

9.2 g (50.0 mmol) of Intermediate L1-5 was mixed with 60 ml of CH$_2$Cl$_2$, and 100.0 mmol of 3-chlorobenzoic acid (mCPBA) was slowly added thereto dropwise at a temperature of 0° C. The resulting product was stirred for one day. After the completion of the reaction, an extraction process was performed on the reaction mixture by using 6N KOH, and an organic layer obtained therefrom was dried with magnesium sulfate. The resulting product was purified by liquid chromatography, thereby obtaining 9.9 g (yield: 99%) of Intermediate L1-4.

Synthesis of Intermediate L1-3

9.5 g (47.2 mmol) of Intermediate L1-4 was mixed with acetic anhydride, and the mixed solution was heated under reflux. After the completion of the reaction, an extraction process was performed on the reaction mixture by using saturated sodium bicarbonate. An organic layer obtained therefrom was dried with magnesium sulfate, and then, was subjected to distillation under reduced pressure. The resulting product was purified by liquid chromatography, thereby obtaining 7.1 g (yield: 75%) of Intermediate L1-3.

Synthesis of Intermediate L1-2

7.0 g (34.8 mmol) of Intermediate L1-3 was mixed with 350 ml of $CH_2Cl_2$, and 24 g (87.4 mmol) of $POBr_3$ was slowly added thereto dropwise at a temperature of 0° C. Then, 5.0 ml of DMF was added thereto, and the resulting solution was stirred for 24 h at room temperature. After the completion of the reaction, an extraction process was performed on the reaction mixture by using saturated sodium bicarbonate. An organic layer obtained therefrom was dried with magnesium sulfate, and then, was subjected to distillation under reduced pressure. The resulting product was purified by liquid chromatography, thereby obtaining 7.7 g (yield: 65%) of Intermediate L1-2.

Synthesis of Intermediate L1-1

1.7 g (4.9 mmol) of Intermediate L1-2 was mixed with 40 ml of toluene and 8 ml of ethanol. 0.8 g (5.23 mmol) of 3,5-dimethylphenylboronic acid, 0.4 g (0.4 mmol) of a $Pd(PPh_3)_4$, 2N $Na_2CO_3$ in $H_2O$ were added thereto, and the mixture was heated under reflux at a temperature of 80° C. for 18 hours. After the completion of the reaction, the reaction mixture was concentrated under reduced pressure, and an extraction process was performed thereon using 100 ml of ethyl acetate. An organic layer obtained therefrom was then dried with magnesium sulfate, and then, subjected to distillation under reduced pressure. The resulting product was purified by liquid chromatography, thereby obtaining 1.5 g (yield: 70%) of Intermediate L1-1.

Synthesis of Intermediate L1

1.5 g (4.1 mmol) of Intermediate L1-1 was mixed with 80 ml of THF. 2.1 g (8.2 mmol) of $DABAL-Me_3$ (triethylenediaminine bis(trimethylaluminum)), 0.4 g (0.4 mmol) of a $Pd(PPh_3)_4$, and 0.4 g (0.4 mmol) of Xphos (2-dicyclohexylphosphino-2',4',6'-triisopropylbiphenyl) were added thereto, the mixture was heated under reflux at a temperature of 80° C. for 18 hours. After the completion of the reaction, the reaction mixture was neutralized with HCl, and then, an extraction process was performed thereon using 100 ml of ethyl acetate. An organic layer obtained therefrom was then dried with magnesium sulfate, and then, subjected to distillation under reduced pressure. The resulting product was purified by liquid chromatography, thereby obtaining 0.9 g (yield: 70%) of Intermediate L1.

Synthesis of Dimer 1

0.9 g (2.96 mmol) of Intermediate L1 and 0.5 g (1.41 mmol) of iridium chloride were mixed with 45 mL of 2-ethoxyethanol and 15 mL of distilled water, and the resulting solution was stirred under reflux for 24 hours. When the reaction was complete, the temperature was lowered to room temperature. A solid produced therefrom was separated by filtration, and then, sufficiently washed using water/methanol/hexane in the stated order. The resulting solid was dried in a vacuum oven, thereby obtaining 0.95 g (yield: 77%) of Dimer 1.

Synthesis Example 1 (Compound 1)

0.95 g (0.57 mmol) of Dimer 1, 0.34 g (1.43 mmol) of 3,7-diethyl-3,7-dimethylnonane-4,6-dione, and 0.18 g (1.71 mmol) of $Na_2CO_3$ were mixed with 15 mL of 2-ethoxyethanol, and the mixed solution was stirred for 24 hours. When the reaction was complete, a solid obtained by filtering the reaction mixture was washed sufficiently with ethanol and hexane, and then, was subjected to column chromatography under conditions of dichloromethane: n-hexane=1:1(v/v), thereby obtaining 0.5 g (yield: 45%) of Compound 1.

LC-MS m/z=1037 (M+H)

Synthesis Example 2 (Compound 3)

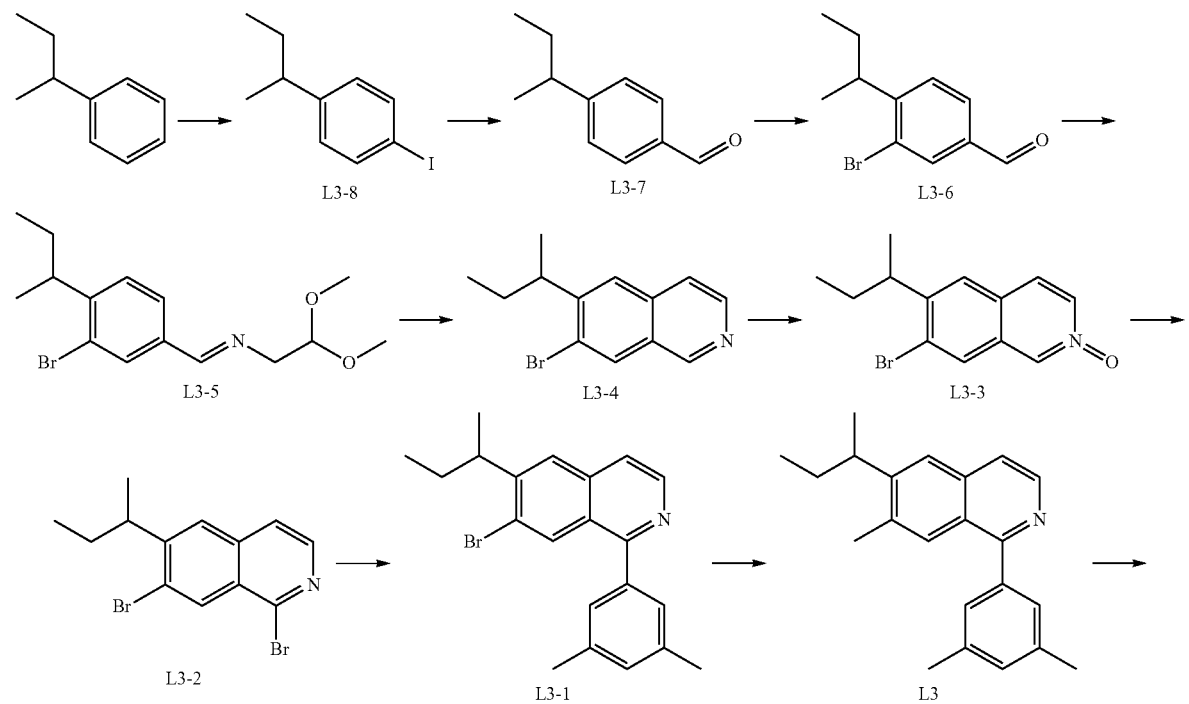

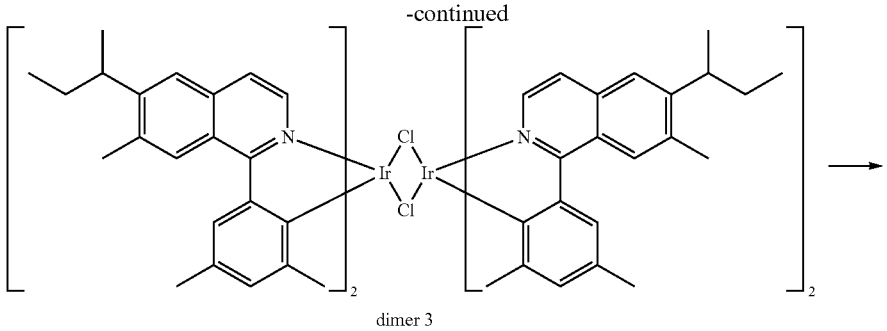

dimer 3

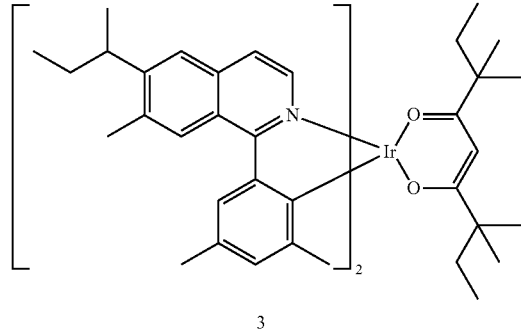

3

Synthesis of Intermediate L3-8

72 ml (461.3 mmol) of sec-butylbenzene was mixed with 450 ml of acetonitrile, and 88.0 g (346.0 mmol) of iodine and 122.6 g (346.0 mmol) of Selectfluor (1-chloromethyl-4-fluoro-1,4-diazoniabicyclo[2.2.2]octane bis(tetrafluoroborate)) were added thereto. The mixture was then stirred at a temperature of 60° C. for 4 hours. After the completion of the reaction, the reaction mixture was mixed with dichloromethane, and an extraction process was performed thereon using saturated sodium thiosulfate. An organic layer obtained therefrom was then dried with magnesium sulfate, and subjected to distillation under reduced pressure. The resulting product was purified by liquid chromatography, thereby obtaining 75.0 g (yield: 63%) of Intermediate L3-8.

LC-MS m/z=261 (M+H)

Synthesis of Intermediate L3-7

148 g (512.9 mmol) of Intermediate L3-8 was mixed with 500 ml of tetrahydrofuran, and 205 ml (205 mmol) of 1.0 M isopropylmagnesium chloride solution was slowly added thereto. The mixture was then stirred at a temperature of 0° C. After 10 minutes, 256 ml (410 mmol) of a 1.6 M n-butyl lithium (BuLi) solution was slowly added thereto, and then, the mixed solution was stirred for 1 hour. Afterwards, 51 ml (666.7 mmol) of DMF was slowly added thereto dropwise at a temperature of −10° C., and the resulting solution was stirred at room temperature for 1 hour. After the completion of the reaction, an extraction process was performed on the reaction mixture by using ethyl acetate and an aqueous hydrochloric acid solution. An organic layer obtained therefrom was dried with magnesium sulfate, and subjected to distillation under reduced pressure. The resulting product was purified by liquid chromatography, thereby obtaining 83.2 g (yield: 100%) of Intermediate L3-7.

LC-MS m/z=163 (M+H)$^+$

Synthesis of Intermediate L3-6

44 g (326.6 mmol) of AlCl$_3$ was added to 100 ml of dichloromethane, and the mixture was heated at a temperature of 40° C. 30 g (186.6 mmol) of Intermediate L3-7 mixed with 6 ml of dichloromethane was slowly added thereto, and the resulting mixture was then stirred for 30 minutes. 10 ml (205.3 mmol) of bromine was added thereto for 1 hour. After the completion of the reaction, the reaction mixture was slowly added to iced water, and an organic layer obtained therefrom was then dried with magnesium sulfate, and subjected to distillation under reduced pressure. The resulting product was purified by liquid chromatography, thereby obtaining 27 g (yield: 60%) of Intermediate L3-6.

LC-MS m/z=241 (M+H)

Synthesis of Intermediate L3-5

27 g (112.7 mmol) of Intermediate L3-6 was mixed with 100 ml of chloroform, and 18 ml (169 mmol) of aminoacetaldehyde dimethyl acetal was slowly added thereto at room temperature. After 1 hour, the mixture was heated at a temperature of 100° C. to remove a solvent therefrom. The resulting reaction mixture was then cooled to room temperature, and without a separate purification process, Intermediate L3-5 was obtained.

Synthesis of Intermediate L3-4

37 g (113.6 mmol) of Intermediate L3-5 was mixed with 100 ml of chloroform, and 11 ml (113.6 mmol) of ethyl chloroformate and 16 ml (136.3 mmol) of trimethyl phosphite were slowly added dropwise thereto at a temperature of 0° C. sequentially in the stated order. The reaction mixture obtained therefrom was then stirred at room temperature for 48 hours, and 454 ml (454 mmol) of 1.0 M TiCl$_4$ was slowly added dropwise thereto at a temperature of 0° C. The resulting mixture was then heated under reflux for about 48 hours. After the completion of the reaction, the reaction mixture was cooled to room temperature, and then, added to iced water. A water layer obtained therefrom was washed using dichloromethane, and added to 256 g (908.5 mmol) of tartrate solution. The mixed solution was neutralized with saturated NaHCO$_3$ solution, and an extraction process was performed thereon using dichloromethane. An organic layer obtained therefrom was purified by liquid chromatography, thereby obtaining 11 g (yield: 38%) of Intermediate L3-4.

LC-MS m/z=264 (M+H)$^+$

Synthesis of Intermediate L3-3

11 g (43.2 mmol) of Intermediate L3-4 was mixed with 90 ml of dichloromethane, and 15 g (86.4 mmol) of mCPBA was slowly added dropwise thereto at a temperature of 0° C. The reaction mixture was stirred for about 18 hours at room temperature, and then, an extraction process was performed thereon using 6 N KOH solution. An organic layer obtained therefrom was dried with magnesium sulfate, and without a separate purification process, 12 g (yield: 100%) of Intermediate L3-3 was obtained.

Synthesis of Intermediate L3-2

12 g (43.2 mmol) of Intermediate L3-3 was mixed with 90 ml of dichloromethane, and 15 g (52 mmol) of $POBr_3$ was slowly added dropwise thereto at a temperature of 0° C. Then, 1.7 ml (22 mmol) of DMF was slowly added thereto, and the mixture was stirred for about 18 hours at room temperature. After the completion of the reaction, the reaction solution was neutralized with a saturated $NaHCO_3$ solution, and an extraction process was performed thereon using dichloromethane. An organic layer obtained therefrom was dried with magnesium sulfate, and purified by liquid chromatography, thereby obtaining 3.8 g (yield: 26%) of Intermediate L3-2.

LC-MS m/z=342 (M+H)$^+$

Synthesis of Intermediate L3-1

3.8 g (10.9 mmol) of Intermediate L3-2 was mixed with 40 ml of toluene and 8 ml of EtOH, and 1.5 g (9.8 mmol) of 3,5-dimethylphenyl boronic acid, 0.6 g (0.5 mmol) of a $Pd(PPh_3)_4$, and 8 ml of 2.0 N $Na_2CO_3$ solution were added thereto. The mixture was then heated under reflux at a temperature of 85° C. for 18 hours. After the completion of the reaction, an extraction process was performed thereon using 50 ml of ethyl acetate. An organic layer obtained therefrom was dried with magnesium sulfate, and purified by liquid chromatography, thereby obtaining 3.6 g (yield: 90%) of Intermediate L3-1.

LC-MS m/z=368 (M+H)

Synthesis of Intermediate L3

0.9 g (yield: 90%) of Intermediate L3 was synthesized in the same manner as in the synthesis of Intermediate L1 according to Synthesis Example 1, except that Intermediate L3-1 was used instead of Intermediate L1-1. The synthesized compound was identified by LCMS.

LC-MS m/z=304 (M+H)$^+$

Synthesis of Dimer 3

Dimer 3 (yield: 70%) was synthesized in the same manner as in the synthesis of Dimer 1 according to Synthesis Example 1, except that Intermediate L3 was used instead of Intermediate L1.

Synthesis of Compound 3

Compound 3 (yield: 45%) was synthesized in the same manner as in the synthesis of Compound 1 according to Synthesis Example 1, except that Dimer 3 was used instead of Dimer 1 and 3,3,7,7-tetramethylnonane-4,6-dione was used instead of 3,7-diethyl-3,7-dimethylnonane-4,6-dione. The synthesized compound was identified by LCMS.

LC-MS m/z=1009 (M+H)$^+$

Synthesis Example 3 (Compound 7)

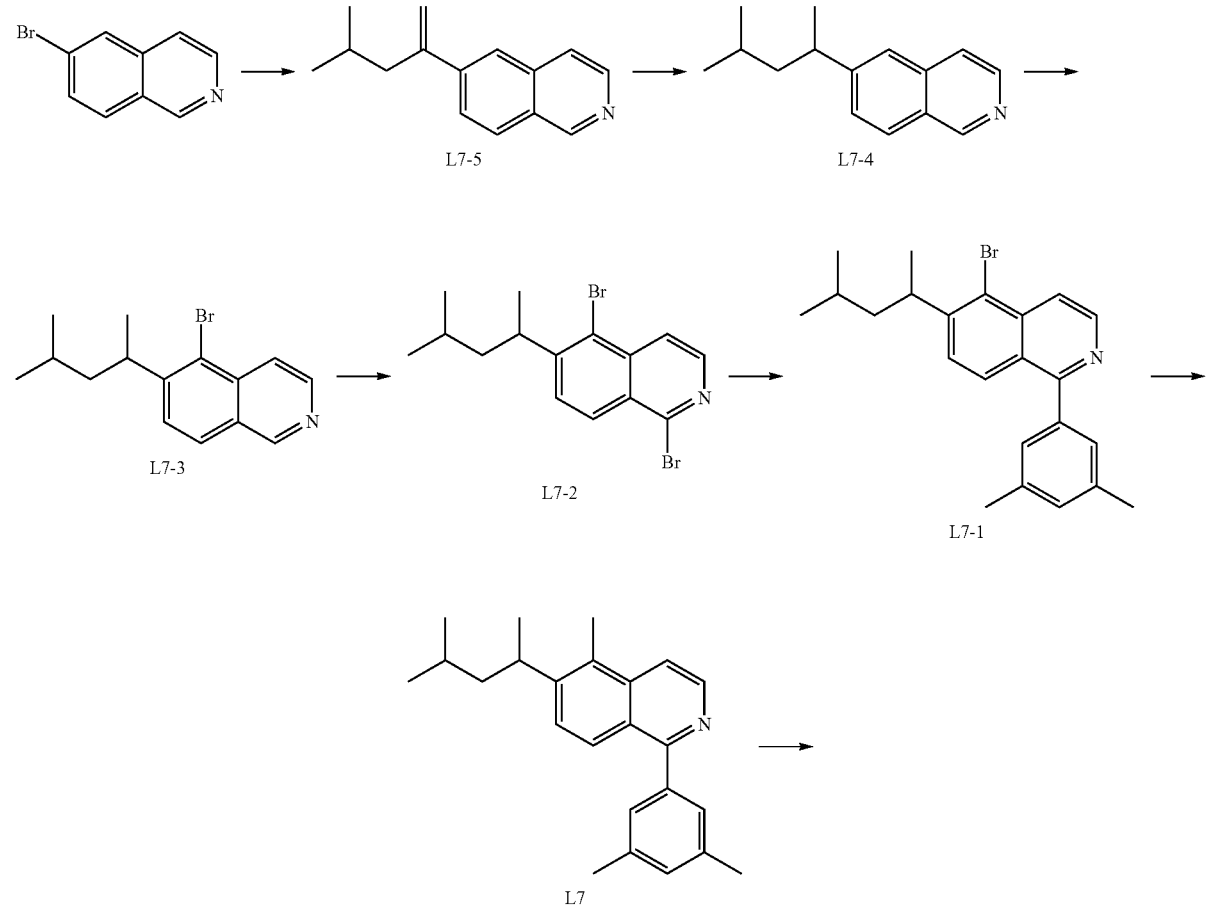

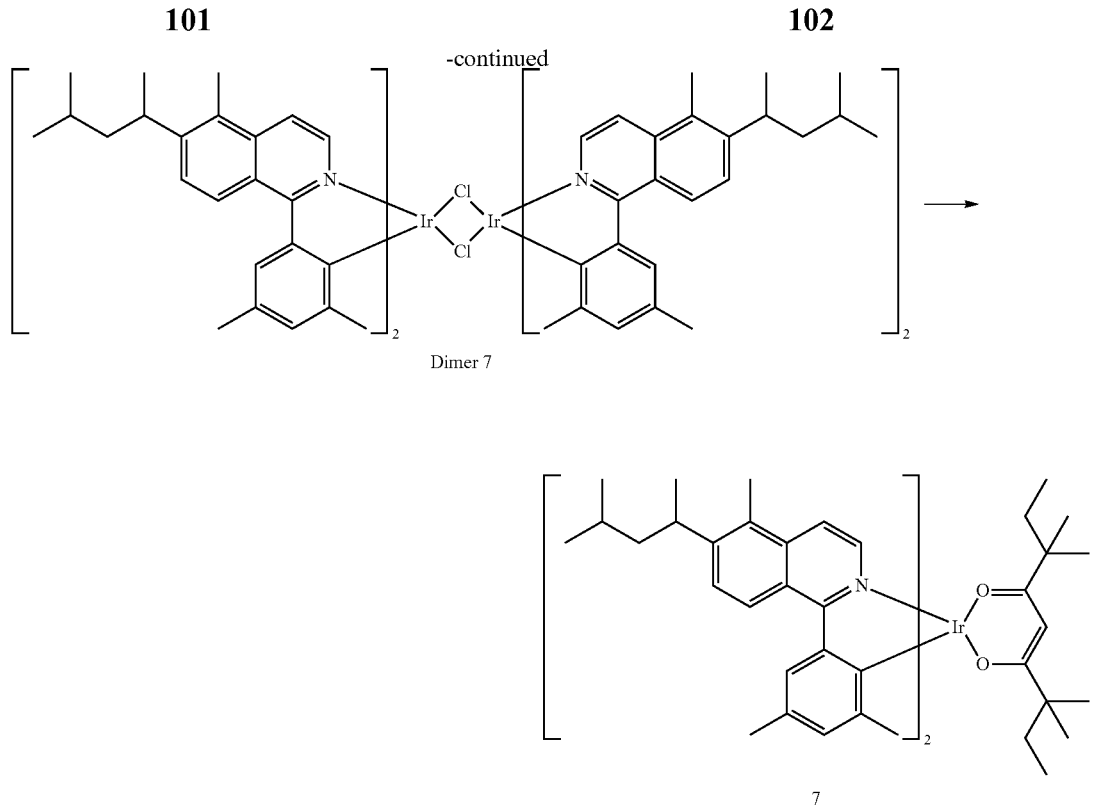

Dimer 7

7

Synthesis of Intermediate L7-5

20 g (96.1 mmol) of 6-bromoisoquinoline was mixed with 120 ml of tetrahydrofuran, and 11 g (9.6 mmol) of Pd(PPh$_3$)$_4$, 18 g (144.2 mmol) of (4-methylpent-1-en-2-yl)boronic acid, 33.2 g (240.5 mmol) of K$_2$CO$_3$, and 30 ml of water were added thereto. The mixture was then heated under reflux at a temperature of 80° C. for about 18 hours. After the completion of the reaction, an extraction process was performed thereon using ethyl acetate. An organic layer obtained therefrom was dried with magnesium sulfate, and purified by liquid chromatography, thereby obtaining 16 g (yield: 80%) of Intermediate L7-5.

LC-MS m/z=212 (M+H)$^+$

Synthesis of Intermediate L7-4

Intermediate L7-4 (yield: 95%) was synthesized in the same manner as in the synthesis of Intermediate L1-5 according to Synthesis Example 1, except that Intermediate L7-5 was used instead of Intermediate L1-6.

LC-MS m/z=214 (M+H)$^+$

Synthesis of Intermediate L7-3

5.8 g (43.2 mmol) of AlCl$_3$ was mixed with 120 ml of chloroform, and the mixture was stirred at a temperature of 55° C. for 30 minutes. Then, 4.6 g (21.6 mmol) of Intermediate L7-4 mixed with a small amount of chloroform was slowing added dropwise thereto, and the resulting mixture was stirred at a temperature of 55° C. for 1 hour. Subsequently, 1.2 ml (32.4 mmol) of bromine mixed with 30 ml of chloroform was slowly added dropwise thereto, and the resulting mixture was stirred for 3 hours. After the completion of the reaction, an extraction process was performed thereon using iced water and saturated sodium thiosulfate. An organic layer obtained therefrom was dried with magnesium sulfate, and purified by liquid chromatography, thereby obtaining 2.3 g (yield: 40%) of Intermediate L7-3.

LC-MS m/z=292 (M+H)$^+$

Synthesis of Intermediate L7-2

1.7 g (yield: 70%) of Intermediate L7-2 was synthesized in the same manner as in the synthesis of Intermediate L3-2 according to Synthesis Example 2, except that Intermediate L7-3 was used instead of Intermediate L3-3.

LC-MS m/z=370 (M+H)$^+$

Synthesis of Intermediate L7-1

Intermediate L7-1 was synthesized in the same manner as in the synthesis of Intermediate L3-1 according to Synthesis Example 2, except that Intermediate L7-2 was used instead of Intermediate L3-2.

LC-MS m/z=396 (M+H)$^+$

Synthesis of Intermediate L7

0.8 g (yield: 85%) of Intermediate L7 was synthesized in the same manner as in the synthesis of Intermediate L1 according to Synthesis Example 1, except that Intermediate L7-1 was used instead of Intermediate L1-1. The synthesized compound was identified by LCMS.

LC-MS m/z=332 (M+H)

Synthesis of Dimer 7

Dimer 7 was synthesized in the same manner as in the synthesis of Dimer 1 according to Synthesis Example 1, except that Intermediate L7 was used instead of Intermediate L1 Synthesis of Compound 7

0.5 g (yield: 46%) of Compound 7 was synthesized in the same manner as in the synthesis of Compound 1 according to Synthesis Example 1, except that Dimer 7 and 3,3,7,7-tetramethylnonane-4,6-dione were used instead of Dimer 1 and 3,7-diethyl-3,7-dimethylnonane-4,6-dione, respectively. The synthesized compound was identified by LCMS.

LC-MS m/z=1065 (M+H)

Synthesis Example 4 (Compound 8)
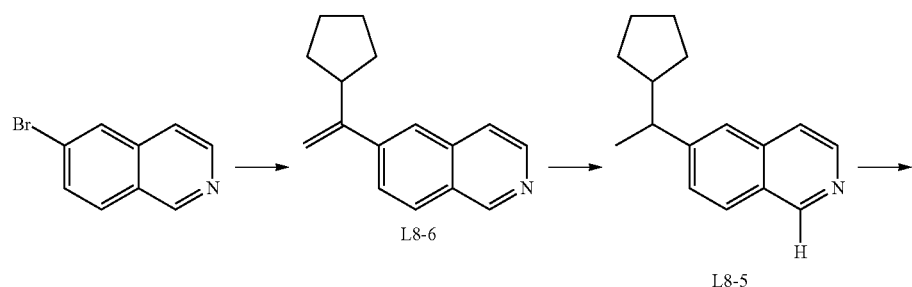
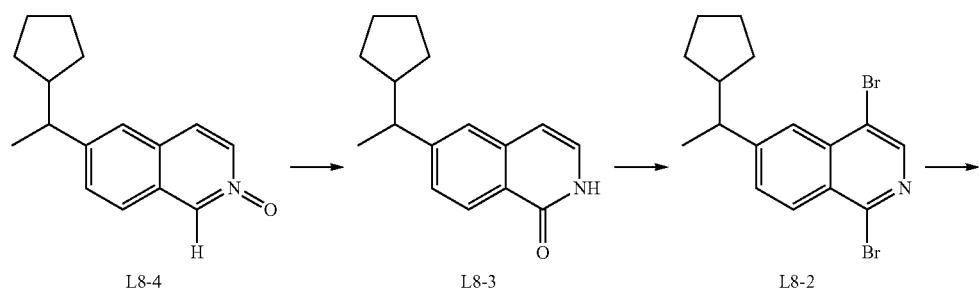
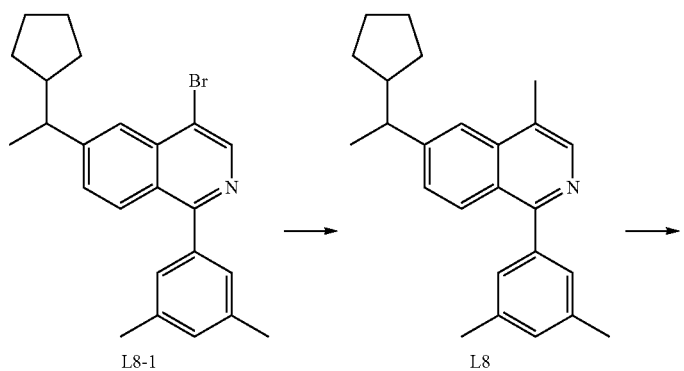
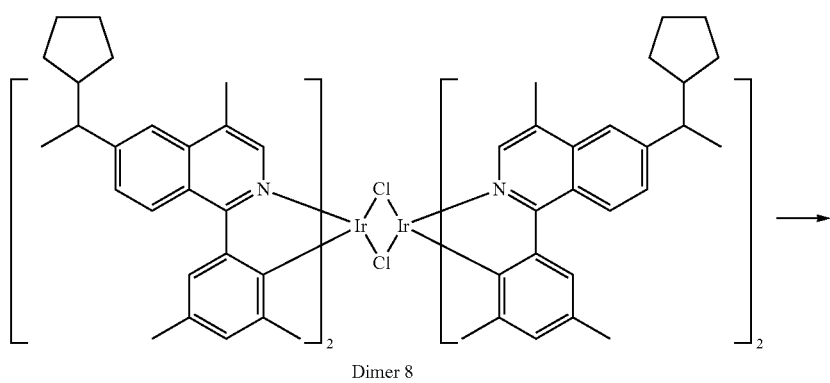
Dimer 8

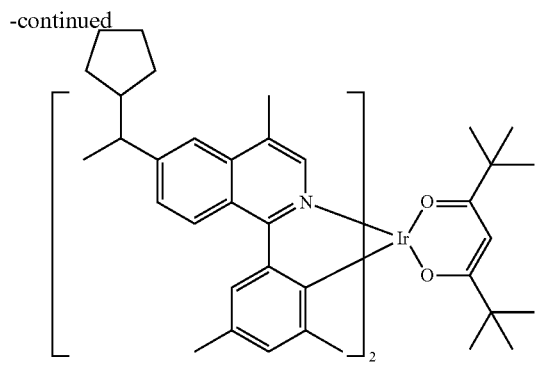

8

Synthesis of Intermediate L8-6

Intermediate L8-6 was synthesized in the same manner as in the synthesis of Intermediate L1-6 according to Synthesis Example 1, except that 2-(1-cyclopentylvinyl)-4,4,5,5-tetramethyl-1,3,2-dioxaborolane was used instead of sec-butenylboronic acid.

Synthesis of Intermediate L8-5

Intermediate L8-5 was synthesized in the same manner as in the synthesis of Intermediate L1-5 according to Synthesis Example 1, except that Intermediate L8-6 was used instead of Intermediate L1-6.

Synthesis of Intermediate L8-4

Intermediate L8-4 was synthesized in the same manner as in the synthesis of Intermediate L1-4 according to Synthesis Example 1, except that Intermediate L8-5 was used instead of Intermediate L1-5.

Synthesis of Intermediate L8-3

Intermediate L8-3 was synthesized in the same manner as in the synthesis of Intermediate L1-3 according to Synthesis Example 1, except that Intermediate L8-4 was used instead of Intermediate L1-4.

Synthesis of Intermediate L8-2

Intermediate L8-2 was synthesized in the same manner as in the synthesis of Intermediate L1-2 according to Synthesis Example 1, except that Intermediate L8-3 was used instead of Intermediate L1-3.

Synthesis of Intermediate L8-1

Intermediate L8-1 was synthesized in the same manner as in the synthesis of Intermediate L1-1 according to Synthesis Example 1, except that Intermediate L8-2 was used instead of Intermediate L1-2.

Synthesis of Intermediate L8

Intermediate L8 was synthesized in the same manner as in the synthesis of Intermediate L1 according to Synthesis Example 1, except that Intermediate L8-1 was used instead of Intermediate L1-1.

LC-MS m/z=344 (M+H)⁺

Synthesis of Dimer 8

Dimer 8 was synthesized in the same manner as in the synthesis of Dimer 1 according to Synthesis Example 1, except that Intermediate L8 was used instead of Intermediate L1.

Synthesis of Compound 8

1.5 g (0.82 mmol) of Dimer 8, 0.38 g (2.05 mmol) of 2,2,6,6-tetramethylheptane-3,5-dione, and 0.34 g (2.46 mmol) of $K_2CO_3$ were mixed with 30 ml of 2-ethoxyethanol, and the mixture was stirred for 48 hours. When the reaction proceeded, a solid obtained by filtering the reaction mixture was sufficiently washed with methanol and hexane, and then, was subjected to column chromatography under conditions of dichloromethane: n-hexane=1:2(v/v), thereby obtaining 0.8 g (yield: 46%) of Compound 8. The synthesized compound was identified by LCMS.

LC-MS m/z=1061 (M+H)

Synthesis Example 5 (Compound 13)

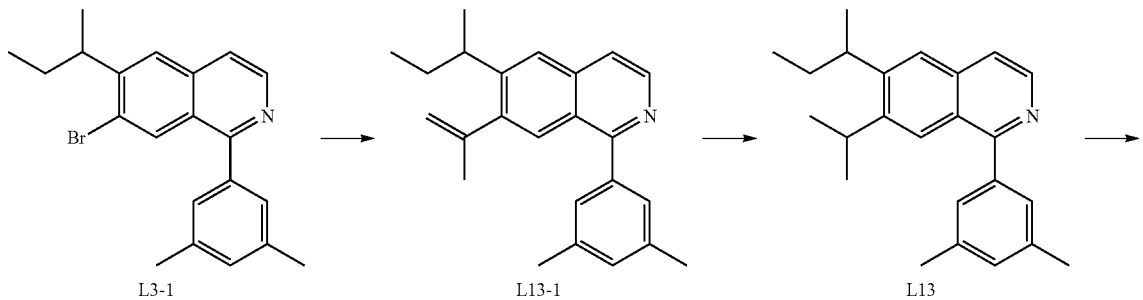

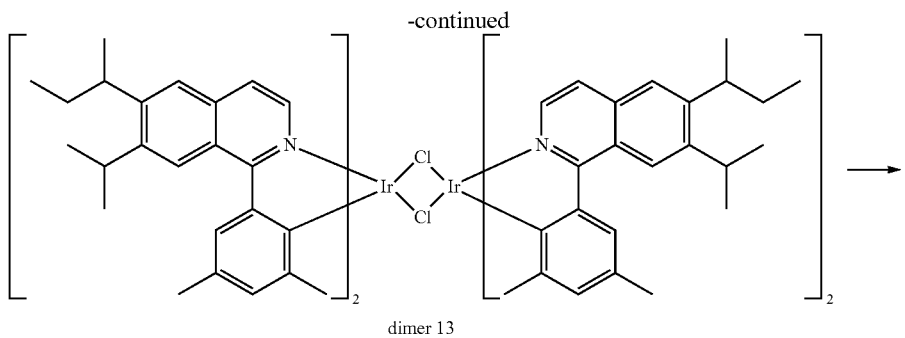

dimer 13

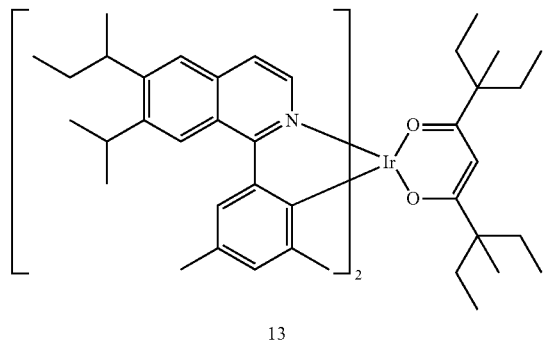

13

Synthesis of Intermediate L13-1

1.52 g (4.12 mmol) of Intermediate L3-1 was mixed with 400 ml of THF and 60 ml of water, and 1.0 g (6.2 mmol) of 4,4,5,5-tetramethyl-2-(prop-1-en-2-yl)-1,3,2-dioxaborolane, 0.3 g (0.3 mmol) of Pd(PPh$_3$)$_4$, and 1.4 g (10.3 mmol) of K$_2$CO$_3$ were added thereto. The mixture was then heated under reflux at a temperature of 80° C. for 18 hours. After the completion of the reaction, the reaction mixture was concentrated under reduced pressure, and an extraction process was performed thereon using 30 ml of ethyl acetate. An organic layer obtained therefrom was then dried with magnesium sulfate, and then, subjected to distillation under reduced pressure. The resulting product was purified by liquid chromatography, thereby obtaining 1.1 g (yield: 81%) of Intermediate L13-1.

LC-MS m/z=330 (M+H)$^+$

Synthesis of Intermediate L13

1.0 g (3.0 mmol) of Intermediate L3-1 was mixed with 50 ml of MeOH, and 19.0 g (30.0 mmol) of ammonium formate and 0.15 g of Pd/C were added thereto. The mixture was then heated under reflux at a temperature of 70° C. for 6 hours. After the completion of the reaction, the reaction mixture was filtered through a celite pad, and then, concentrated under reduced pressure. The resulting product was purified by liquid chromatography, thereby obtaining 0.9 g (yield: 95%) of Intermediate L13.

LC-MS m/z=332 (M+H)

Synthesis of Dimer 13

Dimer 13 was synthesized in the same manner as in the synthesis of Dimer 1 according to Synthesis Example 1, except that Intermediate L13 was used instead of Intermediate L1.

Synthesis of Compound 13

0.6 g (yield: 47%) of Compound 13 was synthesized in the same manner as in the synthesis of Compound 1 according to Synthesis Example 1, except that Dimer 13 was used instead of Dimer 1.

LC-MS m/z=1093 (M+H)$^+$

Synthesis Example 6(Compound 14)

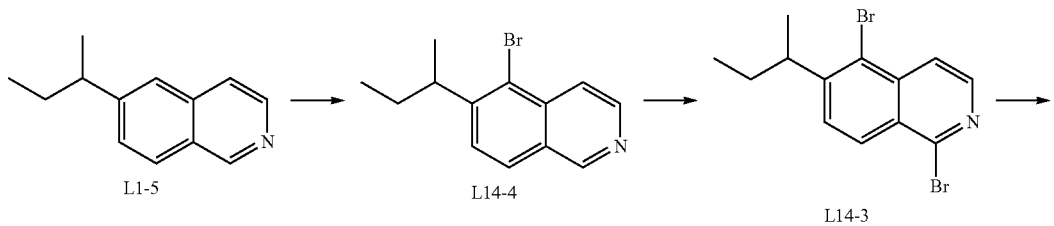

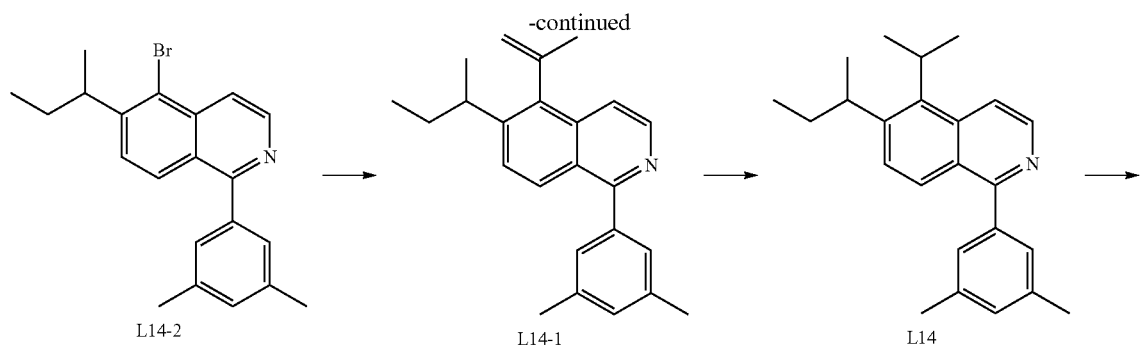

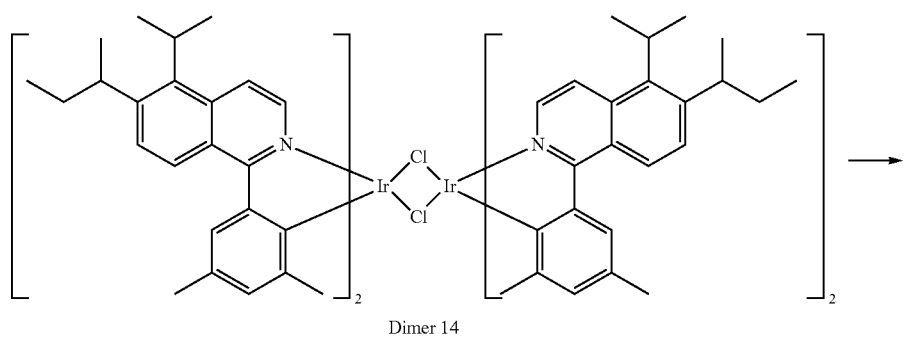

Dimer 14

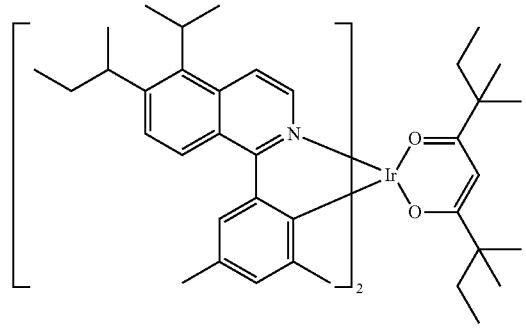

14

Synthesis of Intermediate L14-4

Intermediate L14-4 was synthesized in the same manner as in the synthesis of Intermediate L7-3 according to Synthesis Example 3, except that Intermediate L1-5 was used instead of Intermediate L7-4.

Synthesis of Intermediate L14-3 Intermediate L14-3 was synthesized in the same manner as in the synthesis of Intermediate L7-2 according to Synthesis Example 3, except that Intermediate L14-4 was used instead of Intermediate L7-3.

Synthesis of Intermediate L14-2

Intermediate L14-2 was synthesized in the same manner as in the synthesis of Intermediate L7-1 according to Synthesis Example 3, except that Intermediate L14-3 was used instead of Intermediate L7-2.

LC-MS m/z=369 (M+H)

Synthesis of Intermediate L14-1

Intermediate L14-1 was synthesized in the same manner as in the synthesis of Intermediate L13-1 according to Synthesis Example 5, except that Intermediate L14-2 was used instead of Intermediate L3-1.

LC-MS m/z=330 (M+H)

Synthesis of Intermediate L14

Intermediate L14 was synthesized in the same manner as in the synthesis of Intermediate L13 according to Synthesis Example 5, except that Intermediate L14-1 was used instead of Intermediate L13-1.

LC-MS m/z=332 (M+H) Synthesis of Dimer 14

Dimer 14 was synthesized in the same manner as in the synthesis of Dimer 3 according to Synthesis Example 2, except that Intermediate L14 was used instead of Intermediate L3.

Synthesis of Compound 14

0.9 g (yield: 46%) of Compound 14 was synthesized in the same manner as in the synthesis of Compound 3 according to Synthesis Example 2, except that Dimer 14 was used instead of Dimer 3.

LC-MS m/z=1065 (M+H)

Synthesis Example 7 (Compound 15)

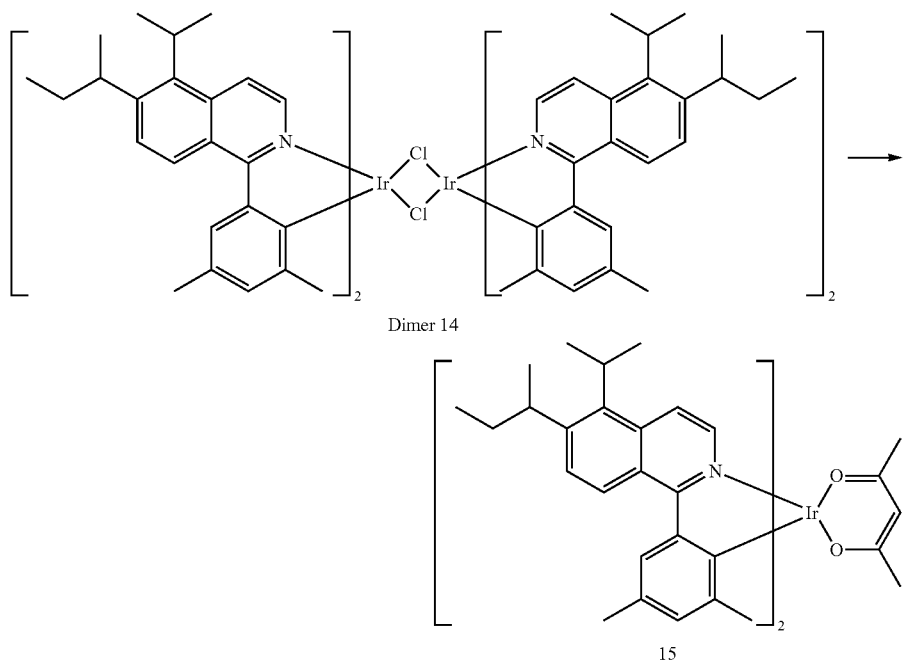

Dimer 14

15

0.7 g (yield: 45%) of Compound 15 was synthesized in the same manner as in the synthesis of Compound 14 according to Synthesis Example 6, except that pentane-2,4-dione was used instead of 3,3,7,7-tetramethylnonane-4,6-dione.

LC-MS m/z=953 (M+H)$^+$

Compounds 17, 18 and 21 can be synthesized by those skilled in the art by referring to the Synthesis Examples 1 to 7 mentioned above and MS spectrum of Compounds 17, 18 and 21 are as follow:

Compound 17: LC-MS m/z=981.49 (M+H)$^+$
Compound 18: LC-MS m/z=981.49 (M+H)$^+$
Compound 21: LC-MS m/z=1173.67 (M+H)$^+$ Evaluation Example 1: Evaluation of Thermal Characteristics Regarding Compounds 1, 3, 7, 8, 13, 14 and A to C, the thermogravimetric analysis (TGA) and the differential scanning calorimetry (DSC) were performed for thermal analysis (N$_2$ atmosphere, temperature section: room temperature to 800° C. (10° C./min)-TGA, room temperature to 400° C.-DSC, Pan Type: Pt Pan in disposable Al Pan (TGA), disposable Al pan (DSC)), and results thereof are summarized in Table 1.

TABLE 1

| Compound No. | Ts_10% (° C.) |
| --- | --- |
| 1 | 192 |
| 3 | 203 |
| 7 | 200 |
| 8 | 213 |
| 13 | 205 |
| 14 | 202 |

TABLE 1-continued

| Compound No. | Ts_10% (° C.) |
| --- | --- |
| A | 238 |
| B | 235 |
| C | 253 |

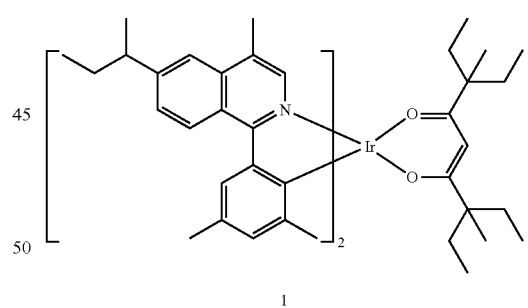

1

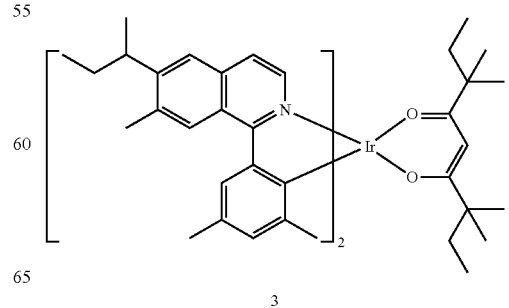

3

TABLE 1-continued

| Compound No. | Ts_10% (° C.) |
|---|---|
| 7 | 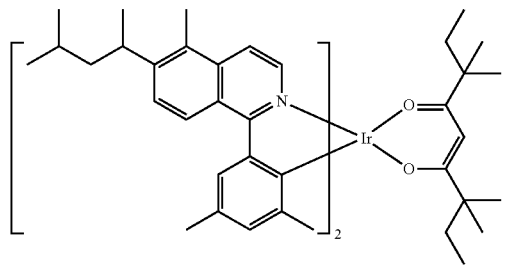 |
| 8 | 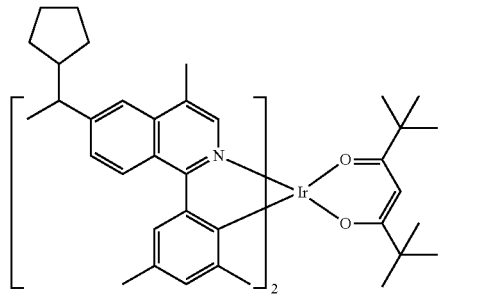 |
| 13 | 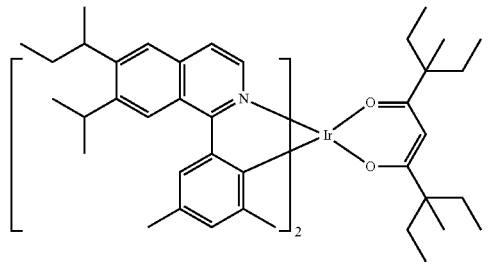 |
| 14 | 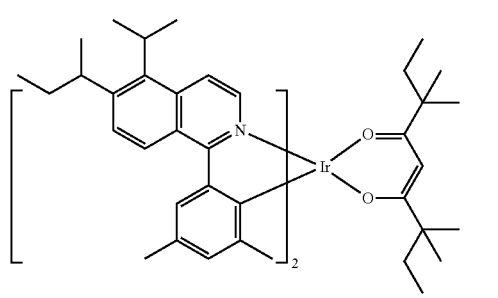 |
| A | 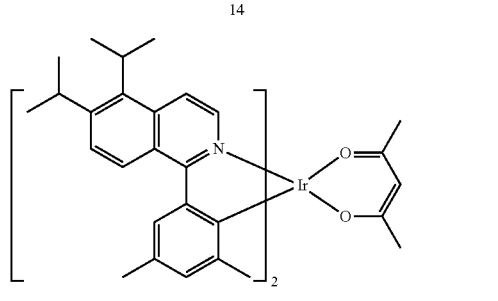 |
| B | 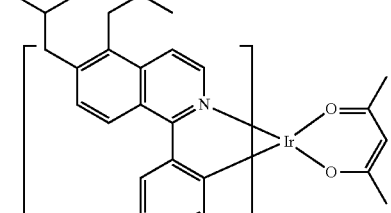 |
| C | 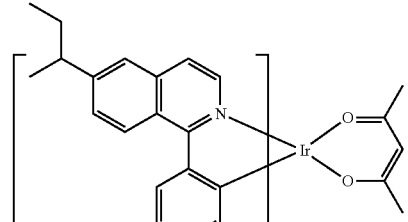 |

Referring to Table 1, Compounds 1, 3, 7, 8, 13 and 14 were found to have relatively low sublimation temperatures compared to Compounds A to C, and in this regard, a thin film having excellent performance may be prepared by using Compound 1, 3, 7, 8, 13 and 14.

Evaluation Example 2: Evaluation of Horizontal Orientation Ratio

In a vacuum deposition apparatus having a vacuum pressure of $1 \times 10^{-7}$ torr, mCP and Compound 1 were co-deposited at a weight ratio of 97:3 on a fused silica substrate layer (having a thickness of 1 mm) to form Sample 1 having a thickness of 30 nm (3 wt %). Then, Sample 1 was sealed using glass and glue in a nitrogen atmosphere. The same process was repeated for each of the compounds shown in Table 2 to prepare the remaining samples.

Meanwhile, an angle-dependent PL measuring device having the structure shown in FIG. 3 in KR Application No. 2013-0150834 was prepared. Specifications are as follows:
Wavelength of excited light: 325 nm
Source of excited light: He—Cd laser, Melles Griot Company
Measuring means of excited light: Light fiber, diameter of 1 mm, Thorlabs Company
Semi-cylindrical prism: Fused silica, diameter of 100 mm, length of 30 mm,
Detection means of emitted light: Photomultiplier tube, Acton Company
Polarizer mounted on detection means of emitted light: Linear polarizer, Thorlabs Company
Recording device: SpectraSense, Acton Company
Incident angle of excited light: OP=45°, eH=0°
Distance between sample to detection means of emitted light (or, radius of movement path of detection means of emitted light): 900 mm
Next, each sample was fixed on a semi-cylindrical lens, and then, irradiated with a laser having a wavelength of 325 nm to emit light. The light emitted therefrom passes through a polarizing film, and an intensity of p-polarized light emission was measured for the light having a wavelength of 530 nm by rotating the semi-cylindrical lens fixed with the samples using a charge-coupled device (CCD) at an angle of 1 degree with respect to the axis of the lens.

The intensity of p-polarized light when each compound had a vertical orientation (No. 1: Intensity of p-polarized light emission) and the intensity of p-polarized light when each compound had a horizontal orientation (No. 2: Intensity of p-polarized light emission) were each calculated at an angle from 0 degree to 90 degree. Then, weightings that match the p-polarized light, which is obtained by multiplying the intensities of p-polarized light of No. 1 and No. 2 by each weighting thereof were obtained. Then, the horizontal orientation ratios of the compounds of Table 2 were also measured, and results of the measurements are shown in Table 2. Here, the angle-dependent photoluminescence spectra were analyzed using a classical dipole model which regards the emission from the excitons as the dissipated power from the oscillating dipoles.

TABLE 2

| Sample No. | Materials for co-deposition | Horizontal orientation ratio (%) |
|---|---|---|
| 1 | mCP: Compound 1 (3 wt %) | 90% |
| 3 | mCP: Compound 3 (3 wt %) | 92% |
| 7 | mCP: Compound 7 (3 wt %) | 93% |
| 8 | mCP: Compound 8 (3 wt %) | 94% |
| 13 | mCP: Compound 13 (3 wt %) | 93% |
| 14 | mCP: Compound 14 (3 wt %) | 92% |
| 15 | mCP: Compound 15 (3 wt %) | 92% |
| A | mCP: Compound A (3 wt %) | 89% |
| B | mCP: Compound B (3 wt %) | 88% |
| C | mCP: Compound C (3 wt %) | 89% |

TABLE 2-continued

| Sample No. | Materials for co-deposition | Horizontal orientation ratio (%) |
|---|---|---|
| A | | |
| B | | |
| C | | |

Referring to Table 2, it was confirmed that Compound 1, 3, 7, 8, 13, 14 and 15 had superior horizontal orientation ratios, i.e., excellent directional photoalignment in a horizontal direction, compared to Compounds A to C.

Example 1

As an anode, a glass substrate, on which ITO/Ag/ITO were deposited to thicknesses of 70 Å/1,000 Å/70 Å, was cut to a size of 50 mm×50 mm×0.5 mm, sonicated with isopropyl alcohol and pure water each for 5 minutes, and then cleaned by exposure to ultraviolet rays and ozone for 30 minutes. Then, the glass substrate was provided to a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (NPB) was vacuum-deposited on the hole injection layer to form a hole transport layer having a thickness of 1,350 Å.

Then, CBP(host) and Compound 1(dopant) were co-deposited in a weight ratio of 97:3 on the hole transport layer to form an emission layer having a thickness of 400 Å.

Then, BCP was vacuum deposited on the emission layer to form a hole blocking layer having a thickness of 50 Å, and $Alq_3$ was vacuum deposited on the hole blocking layer to form an electron transport layer having a thickness of 350 Å. LiF was then vacuum deposited on the electron transport layer to form an electron injection layer having a thickness of 10 Å, and Mg and Ag were co-deposited on a weight ratio of 90:10 on the electron injection layer to form a cathode having a thickness of 120 Å, thereby completing the manufacture of an organic light-emitting device (front red light-emitting device).

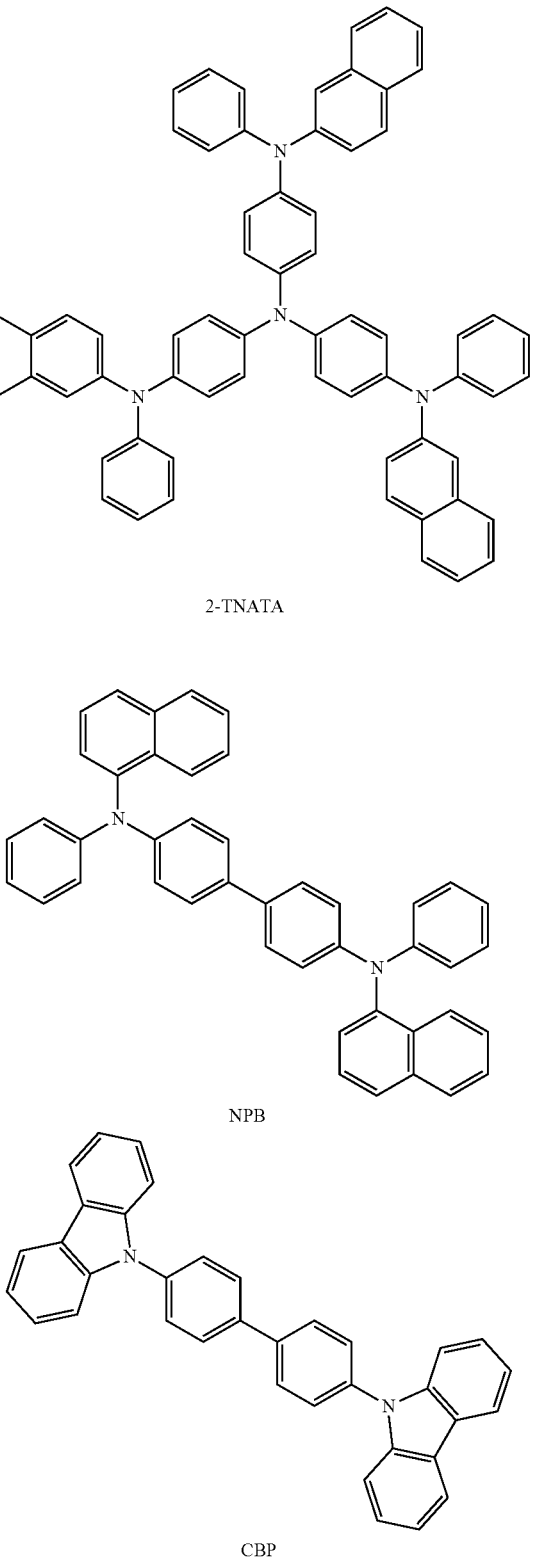

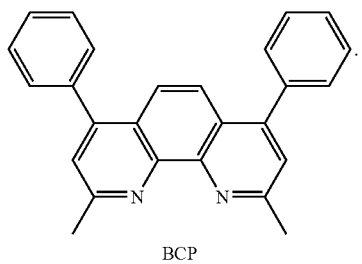
BCP

Examples 2 to 10 and Comparative Examples A to C

Organic light-emitting devices were manufactured in the same manner as in Example 1, except that Compounds shown in Table 3 were each used instead of Compound 1 as a dopant in forming an emission layer.

Evaluation Example 3: Evaluation of Characteristics of Organic Light-Emitting Device The driving voltage, FWHM of an EL spectrum, lifespan ($T_{97}$) and conversion luminescence efficiency, of the organic light-emitting devices manufactured according to Examples 1 to 10 and Comparative Examples A to C were evaluated, and results thereof are shown in Table 3. A current-voltage meter (Keithley 2400) and a luminance meter (Minolta Cs-1000A) were used as evaluation devices, and the lifespan ($LT_{97}$) (at 3,500 nit) indicates an amount of time that lapsed when luminance was 97% of initial luminance (100%). Each of lifespan ($LT_{97}$) and conversion luminescence efficiency were shown in a relative value (%) compared to lifespan ($LT_{97}$) and conversion luminescence efficiency of Comparative Example A.

TABLE 3

| Dopant in emission layer | Driving voltage (V) | FWHM (nm) | $LT_{97}$ (relative value compared to Comparative Example A) (%) | Conversion efficiency at CIEx 0.680 (relative value compared to Comparative Example A) (%) |
|---|---|---|---|---|
| Example 1 | 1 | 4.1 | 50 | 197 | 130 |
| Example 2 | 3 | 4.2 | 52 | 220 | 140 |
| Example 3 | 7 | 4.2 | 45 | 231 | 148 |
| Example 4 | 8 | 4.3 | 58 | 200 | 135 |
| Example 5 | 13 | 4.2 | 57 | 220 | 130 |
| Example 6 | 14 | 4.2 | 50 | 200 | 130 |
| Example 7 | 15 | 4.1 | 60 | 150 | 125 |
| Example 8 | 17 | 4.4 | 60 | 180 | 130 |
| Example 9 | 18 | 4.2 | 58 | 190 | 150 |
| Example 10 | 21 | 4.3 | 58 | 170 | 125 |
| Comparative Example A | A | 4.3 | 70 | 100 | 100 |
| Comparative Example B | B | 4.4 | 68 | 105 | 103 |
| Comparative Example C | C | 4.4 | 70 | 115 | 106 |

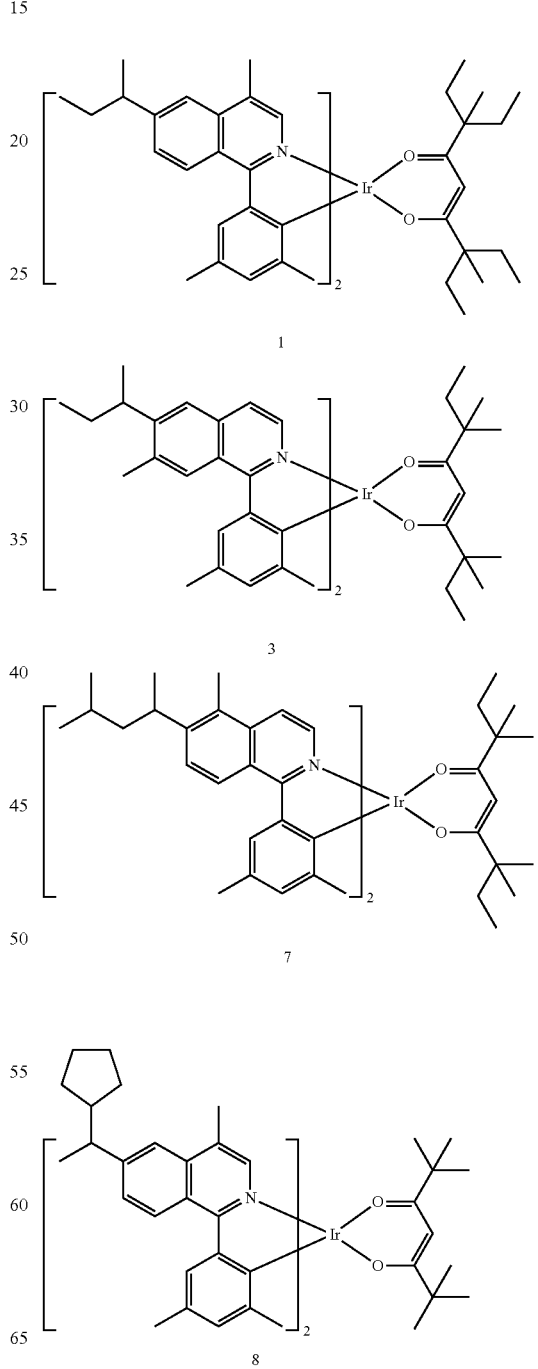

TABLE 3-continued

| Dopant in emission layer | Driving voltage (V) | FWHM (nm) | LT97 (relative value compared to Comparative Example A) (%) | Conversion efficiency at CIEx 0.680 (relative value compared to Comparative Example A) (%) |
|---|---|---|---|---|

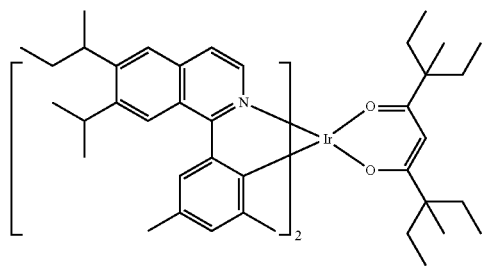
13

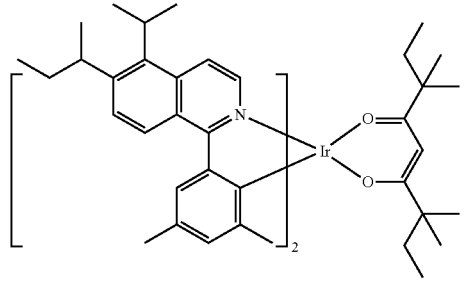
14

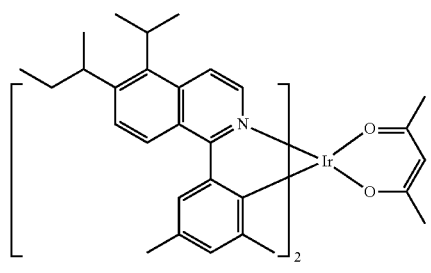
15

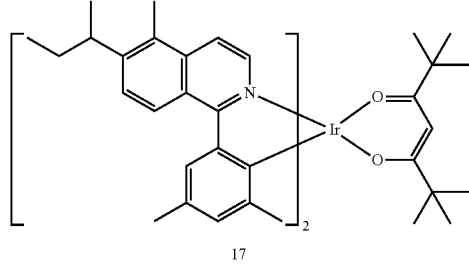
17

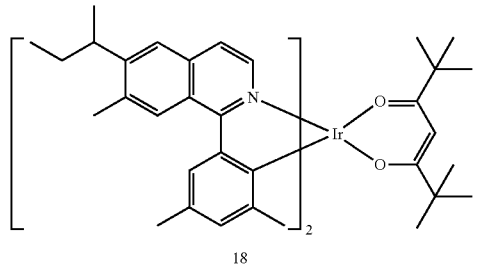
18

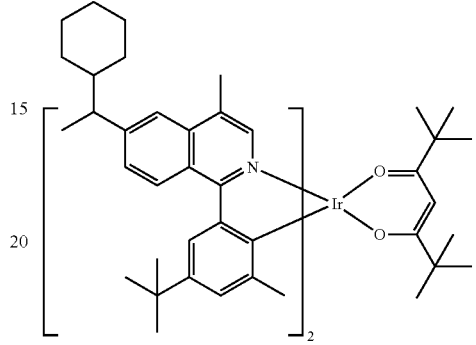
21

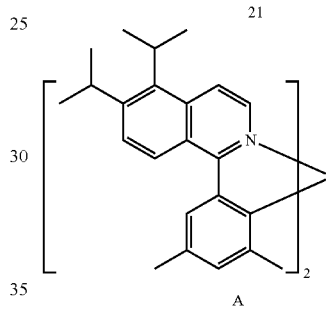
A

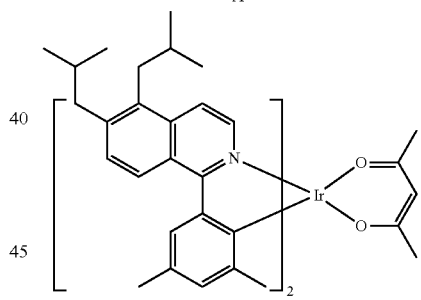
B

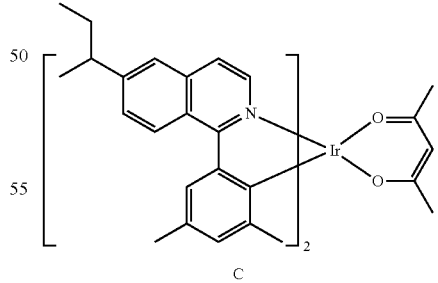
C

Referring to Table 3, it was confirmed that the FWHM of the light emitted from the organic light-emitting devices of Examples 1 to 10 was smaller than that of the light emitted from the organic light-emitting devices of Comparative Examples A to C, and that the organic light-emitting devices of Examples 1 to 10 had improved driving voltage, improved lifespan, and improved luminescence efficiency, as compared with the organic light-emitting devices of Comparative Examples A to C.

According to an embodiment, an organometallic compound represented by Formula I has excellent electric characteristics and thermal stability, and in this regard, an organic light-emitting device including the organometallic compound may have excellent driving voltage, relatively reduced FWHM, excellent lifespan and excellent luminescent efficiency characteristics.

It should be understood that embodiments described herein should be considered in a descriptive sense only and not for purposes of limitation. Descriptions of features or aspects within each embodiment should typically be considered as available for other similar features or aspects in other embodiments.

While an embodiment have been described with reference to the figures, it will be understood by those of ordinary skill in the art that various changes in form and details may be made therein without departing from the spirit and scope as defined by the following claims.

What is claimed is:

1. An organometallic compound represented by Formula 1:

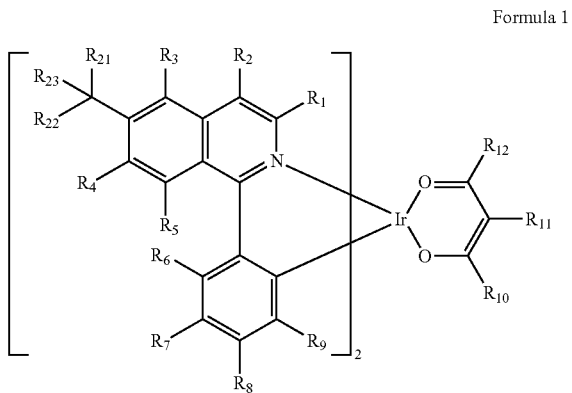

Formula 1 wherein, in Formula 1, $R_1$ to $R_9$, $R_{11}$ and $R_{23}$ are each independently:

hydrogen, deuterium, —F, a cyano group, or a C1-C20 alkyl group;

a $C_1$-$C_{20}$ alkyl group substituted with deuterium, —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1] pentyl group, a bicyclo[2.1.1] hexyl group, a bicyclo[2.2.1] heptyl group, a bicyclo[2.2.2] octyl group, a phenyl group, a ($C_1$-$C_{20}$ alkyl) phenyl group, a biphenyl group, a terphenyl group, or any combination thereof;

a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1] pentyl group, a bicyclo[2.1.1] hexyl group, a bicyclo [2.2.1] heptyl group, a bicyclo[2.2.2] octyl group, a phenyl group, a ($C_1$-$C_{20}$ alkyl) phenyl group, a biphenyl group, or a terphenyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantyl group, a norbornenyl group, a cyclopentenyl group, a cycloheptenyl group, a bicyclo[1.1.1] pentyl group, a bicyclo[2.1.1] hexyl group, a bicyclo[2.2.1] heptyl group, a bicyclo[2.2.2] octyl group, a phenyl group, a ($C_1$-$C_{20}$ alkyl) phenyl group, a biphenyl group, a terphenyl group, or any combination thereof; or —Si ($Q_3$) ($Q_4$) ($Q_5$), or —Ge ($Q_3$) ($Q_4$) ($Q_5$); and at least one of $R_1$ to $R_5$ is each independently:

deuterium, —F, a cyano group, or a $C_1$-$C_{20}$ alkyl group;

a $C_1$-$C_{20}$ alkyl group substituted with deuterium, —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1] pentyl group, a bicyclo[2.1.1] hexyl group, a bicyclo[2.2.1] heptyl group, a bicyclo[2.2.2] octyl group, a phenyl group, a ($C_1$-$C_{20}$ alkyl) phenyl group, a biphenyl group, a terphenyl group, or any combination thereof;

a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1] pentyl group, a bicyclo[2.1.1] hexyl group, a bicyclo [2.2.1] heptyl group, a bicyclo[2.2.2] octyl group, a ($C_1$-$C_{20}$ alkyl) phenyl group, a biphenyl group, or a terphenyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1] pentyl group, a bicyclo[2.1.1] hexyl group, a bicyclo [2.2.1] heptyl group, a bicyclo[2.2.2] octyl group, a phenyl group, a ($C_1$-$C_{20}$ alkyl) phenyl group, a biphenyl group, a terphenyl group, or any combination thereof;

a phenyl group, unsubstituted or substituted with deuterium, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1] pentyl group, a bicyclo[2.1.1] hexyl group, a bicyclo[2.2.1] heptyl group, a bicyclo[2.2.2] octyl group, a phenyl group, a ($C_1$-$C_{20}$ alkyl) phenyl group, a biphenyl group, a terphenyl group, or any combination thereof; or —Si ($Q_3$) ($Q_4$) ($Q_5$), or —Ge ($Q_3$) ($Q_4$) ($Q_5$);

wherein, $Q_3$ to $Q_5$ are each independently:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof, $R_{10}$ in Formula 1 is represented by Formula 3, and $R_{12}$ in Formula 1 is represented by Formula 4,

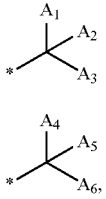

Formula 3

Formula 4 wherein, in Formulae 3 and 4,
$A_1$ to $A_6$ are each independently:
deuterium; or
a $C_1$-$C_{20}$ alkyl group, a $C_3$-$C_{10}$ cycloalkyl group, a $C_6$-$C_{60}$ aryl group, or a $C_1$-$C_{60}$ heteroaryl group, each unsubstituted or substituted with deuterium, a $C_1$-$C_{20}$ alkyl group, a $C_3$-$C_{10}$ cycloalkyl group, or any combination thereof; and
* indicates a binding site to a neighboring atom,
wherein any two of $A_1$ to $A_3$ and any two of $A_4$ to $A_6$ are not optionally cyclized to form a $C_5$-$C_{30}$ carbocyclic group unsubstituted or substituted with at least one $R_{1a}$ group or a $C_2$-$C_{30}$ heterocyclic group unsubstituted or substituted with at least one $R_{1a}$ group, and
wherein at least one of $A_1$ to $A_6$ is:
a $C_3$-$C_{10}$ cycloalkyl group, unsubstituted or substituted with deuterium, a $C_1$-$C_{20}$ alkyl group, a $C_3$-$C_{10}$ cycloalkyl group, or any combination thereof, or
a $C_2$-$C_{20}$ alkyl group, unsubstituted or substituted with deuterium, a $C_1$-$C_{20}$ alkyl group, a $C_3$-$C_{10}$ cycloalkyl group, or any combination thereof,
$R_{21}$ is a $C_2$-$C_{20}$ alkyl group, a deuterium-containing $C_2$-$C_{20}$ alkyl group, a $C_3$-$C_{10}$ cycloalkyl group, or a deuterium-containing $C_3$-$C_{10}$ cycloalkyl group,
$R_{22}$ is a $C_1$-$C_{20}$ alkyl group, a deuterium-containing $C_1$-$C_{20}$ alkyl group, a $C_3$-$C_{10}$ cycloalkyl group, or a deuterium-containing $C_3$-$C_{10}$ cycloalkyl group,
two or more of $R_1$ to $R_9$ are not optionally linked to each other to form a $C_5$-$C_{30}$ carbocyclic group unsubstituted or substituted with at least one $R_{1a}$ group or a $C_2$-$C_{30}$ heterocyclic group unsubstituted or substituted with at least one $R_{1a}$ group,
$R_4$ is not optionally linked with $R_{21}$, $R_{22}$, or $R_{23}$ to form a $C_5$-$C_{30}$ carbocyclic group unsubstituted or substituted with at least one $R_{1a}$ group or a $C_2$-$C_{30}$ heterocyclic group unsubstituted or substituted with at least one $R_{1a}$ group, and
$R_{1a}$ is the same as defined in connection with $R_1$.

2. The organometallic compound of claim 1, wherein $R_{21}$ is an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a cyclopentyl group, a cyclohexyl group, a cycloheptyl group, a cyclooctyl group, a bicyclo [1.1.1] pentyl group, a bicyclo[2.1.1] hexyl group, a bicyclo[2.2.1] heptyl group, or a bicyclo[2.2.2] octyl group, each unsubstituted or substituted with at least one deuterium, and
$R_{22}$ is a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a cyclopentyl group, a cyclohexyl group, a cycloheptyl group, a cyclooctyl group, a bicyclo[1.1.1] pentyl group, a bicyclo[2.1.1] hexyl group, a bicyclo[2.2.1] heptyl group, or a bicyclo[2.2.2] octyl group, each unsubstituted or substituted with at least one deuterium.

3. The organometallic compound of claim 1, wherein $R_6$ and $R_5$ are each independently hydrogen or deuterium, and
$R_7$ and $R_9$ are each independently:
a $C_1$-$C_{20}$ alkyl group;
a $C_1$-$C_{20}$ alkyl group substituted with deuterium, —F, —CD$_3$, —CD$_2$H, —CDH$_2$, —CF$_3$, —CF$_2$H, —CFH$_2$, or any combination thereof; or
—Si (Q$_3$) (Q$_4$) (Q$_5$), or-Ge (Q$_3$) (Q$_4$) (Q$_5$).

4. The organometallic compound of claim 1, wherein $R_7$ and $R_9$ are each independently:
a $C_1$-$C_{20}$ alkyl group; or
a $C_1$-$C_{20}$ alkyl group substituted with deuterium, —F, —CD$_3$, —CD$_2$H, —CDH$_2$, —CF$_3$, —CF$_2$H, —CFH$_2$, or any combination thereof; and
$R_7$ and $R_9$ are different from each other.

5. The organometallic compound of claim 4, wherein the number of carbon atoms in $R_7$ is greater than the number of carbon atoms in $R_9$.

6. The organometallic compound of claim 1, wherein $R_{21}$ is a $C_3$-$C_{10}$ cycloalkyl group, or a deuterium-containing $C_3$-$C_{10}$ cycloalkyl group.

7. The organometallic compound of claim 1, wherein $R_{22}$ is a methyl group.

8. The organometallic compound of claim 1, wherein $R_{22}$ is a $C_2$-$C_{20}$ alkyl group, a deuterium-containing $C_2$-$C_{20}$ alkyl group, a $C_3$-$C_{10}$ cycloalkyl group, or a deuterium-containing $C_3$-$C_{10}$ cycloalkyl group.

9. The organometallic compound of claim 1, wherein $R_{23}$ is hydrogen or deuterium.

10. The organometallic compound of claim 1, wherein Formula 3 satisfies one of Condition 3-3 to Condition 3-5 and
Formula 4 satisfies one of Condition 4-3 to Condition 4-5:
Condition 3-3
$A_1$ and $A_2$ are each independently a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and
$A_3$ is a $C_2$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof;

Condition 3-4
$A_1$ is a $C_1$-$C_{20}$ alkyl group or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and
$A_2$ and $A_3$ are each independently a $C_2$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or
any combination thereof ;
Condition 3-5
$A_1$ is deuterium,
$A_2$ is a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and
$A_3$ is a $C_2$-$C_{20}$ alkyl group, or a $C_3$-$C_{10}$ cycloalkyl group, each unsubstituted or substituted
with deuterium, a $C_1$-$C_{20}$ alkyl group, a $C_3$-$C_{10}$ cycloalkyl group, or any combination thereof;
Condition 4-3
$A_4$ and As are each independently a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and
$A_6$ is a $C_2$-$C_{20}$ alkyl group or a $C_3$-$C_{10}$ cycloalkyl group, each unsubstituted or substituted
with deuterium, a $C_1$-$C_{20}$ alkyl group, a $C_3$-$C_{10}$ cycloalkyl group, or any combination thereof ;
Condition 4-4
$A_4$ is a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and
$A_5$ and $A_6$ are each independently a $C_2$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or
any combination thereof;
Condition 4-5
$A_4$ is deuterium,
$A_5$ is a $C_1$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof, and
$A_6$ is a $C_2$-$C_{20}$ alkyl group, or a $C_3$-$C_{10}$ cycloalkyl group, each unsubstituted or substituted with deuterium, a $C_1$-$C_{20}$ alkyl group, a $C_3$-$C_{10}$ cycloalkyl group, or any combination thereof.

11. The organometallic compound of claim 1, wherein the organometallic compound is one of Compounds 1, 2, 3, 6, 7, 9 to 14 or 22:

9
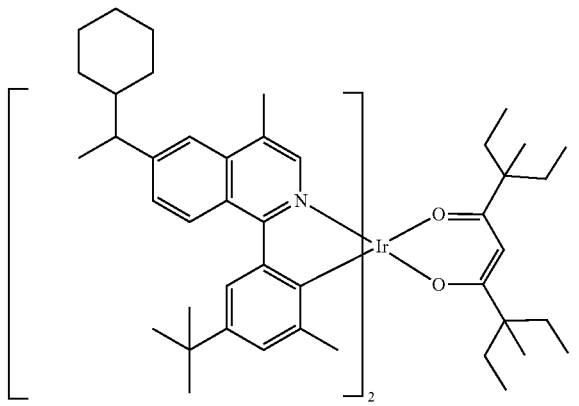

10
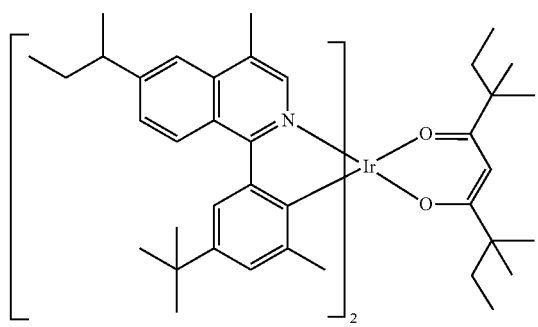

11
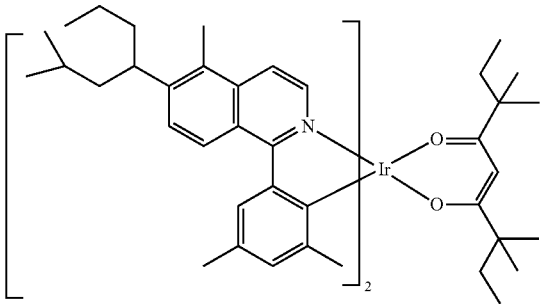

13
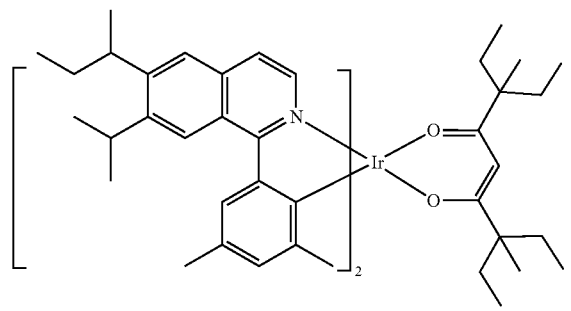

14
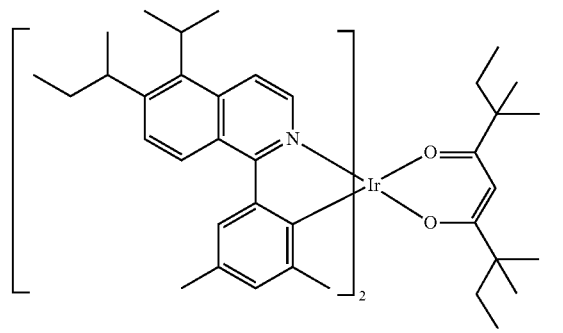

22
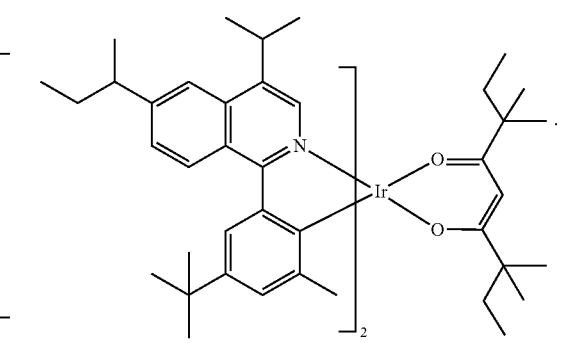

12. An organic light-emitting device comprising:
a first electrode;
a second electrode; and
an organic layer disposed between the first electrode and the second electrode and comprising an emission layer,
wherein the organic layer comprises at least one organometallic compound of claim 1.

13. The organic light-emitting device of claim 12, wherein
the first electrode is an anode,
the second electrode is a cathode,
the organic layer further comprises a hole transport region disposed between the first electrode and the emission layer and an electron transport region disposed between the emission layer and the second electrode,
the hole transport region comprises a hole injection layer, a hole transport layer, an electron blocking layer, a buffer layer, or any combination thereof, and
the electron transport region comprises a hole blocking layer, an electron transport layer, an electron injection layer, or any combination thereof.

14. The organic light-emitting device of claim 12, wherein the emission layer comprises the organometallic compound.

15. The organic light-emitting device of claim 14, wherein the emission layer emits red light.

16. The organic light-emitting device of claim 14, wherein the emission layer further comprises a host, and an amount of the host in the emission layer is larger than an amount of the organometallic compound in the emission layer.

17. A diagnostic composition comprising at least one organometallic compound of claim 1.

* * * * *